(12) United States Patent
Jeong et al.

(10) Patent No.: US 10,848,181 B2
(45) Date of Patent: Nov. 24, 2020

(54) TRANSMITTING APPARATUS AND SIGNAL PROCESSING METHOD THEREOF

(71) Applicant: SAMSUNG ELECTRONICS CO., LTD., Suwon-si (KR)

(72) Inventors: Hong-sil Jeong, Suwon-si (KR); Se-ho Myung, Yongin-si (KR); Kyung-joong Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/363,675

(22) Filed: Mar. 25, 2019

(65) Prior Publication Data
US 2019/0222226 A1 Jul. 18, 2019

Related U.S. Application Data

(63) Continuation of application No. 15/417,911, filed on Jan. 27, 2017, now Pat. No. 10,243,585, which is a
(Continued)

(30) Foreign Application Priority Data

Oct. 6, 2014 (KR) .................. 10-2014-0134505

(51) Int. Cl.
*H03M 13/00* (2006.01)
*H03M 13/11* (2006.01)
(Continued)

(52) U.S. Cl.
CPC ..... *H03M 13/1102* (2013.01); *H03M 13/036* (2013.01); *H03M 13/1165* (2013.01);
(Continued)

(58) Field of Classification Search
None
See application file for complete search history.

(56) References Cited

U.S. PATENT DOCUMENTS

| 7,584,401 | B2 | 9/2009 | Hong et al. | |
| 9,246,634 | B2 * | 1/2016 | Eroz | ................. H04L 1/0057 |

(Continued)

FOREIGN PATENT DOCUMENTS

| JP | 2012-15688 A | 1/2012 |
| KR | 10-0946884 B1 | 3/2010 |

OTHER PUBLICATIONS

M. Li, C. A. Nour, C. Jégo, J. Yang and C. Douillard, "A shuffled iterative bit-interleaved coded modulation receiver for the DVB-T2 standard: Design, implementation and FPGA prototyping," 2011 IEEE Workshop on Signal Processing Systems (SiPS), Beirut, 2011, pp. 55-60. (Year: 2011).*
(Continued)

*Primary Examiner* — Daniel F. McMahon
(74) *Attorney, Agent, or Firm* — Sughrue Mion, PLLC

(57) ABSTRACT

A transmitting apparatus and a receiving apparatus are provided. The transmitting apparatus includes an encoder configured to generate a low density parity check (LDPC) codeword by performing LDPC encoding, an interleaver configured to interleave the LDPC codeword, and a modulator configured to modulate the interleaved LDPC codeword according to a modulation method to generate a modulation symbol. The interleaver performs interleaving by dividing the LDPC codeword into a plurality of groups, rearranging an order of the plurality of groups in group units, and dividing the plurality of rearranged groups based on a modulation order according to the modulation method.

2 Claims, 28 Drawing Sheets

Related U.S. Application Data continuation of application No. 14/506,771, filed on Oct. 6, 2014, now Pat. No. 9,577,679.

(60) Provisional application No. 61/886,827, filed on Oct. 4, 2013.

(51) Int. Cl.
*H03M 13/27* (2006.01)
*H03M 13/03* (2006.01)
*H03M 13/25* (2006.01)
*H03M 13/35* (2006.01)
*H04L 1/00* (2006.01)

(52) U.S. Cl.
CPC ....... *H03M 13/255* (2013.01); *H03M 13/271* (2013.01); *H03M 13/2707* (2013.01); *H03M 13/2778* (2013.01); *H03M 13/356* (2013.01); *H04L 1/0041* (2013.01); *H04L 1/0058* (2013.01); *H04L 1/0071* (2013.01)

(56) References Cited

U.S. PATENT DOCUMENTS

| | | |
|---|---|---|
| 2007/0033486 A1 | 2/2007 | Hong et al. |
| 2009/0063929 A1* | 3/2009 | Jeong ................. H03M 13/1165 714/752 |
| 2009/0125781 A1* | 5/2009 | Jeong .................... H03M 13/11 714/752 |
| 2010/0235706 A1* | 9/2010 | Eberlein ........... H03M 13/2707 714/752 |
| 2015/0082131 A1* | 3/2015 | Jeong .................... H04L 1/0057 714/776 |
| 2015/0089321 A1* | 3/2015 | Myung ............... H03M 13/271 714/758 |
| 2015/0095744 A1* | 4/2015 | Jeong ............... H03M 13/2703 714/776 |
| 2015/0100845 A1* | 4/2015 | Myung ............ H03M 13/2778 714/752 |
| 2015/0121176 A1* | 4/2015 | Myung ................. H04L 1/0041 714/776 |
| 2015/0381207 A1* | 12/2015 | Petrov ............... H03M 13/1165 714/757 |

OTHER PUBLICATIONS

Communication dated Aug. 20, 2020 by the Korean Intellectual Property Office in counterpart Korean Patent Application No. 10-2014-0134505.

* cited by examiner

TRANSMITTING APPARATUS AND SIGNAL PROCESSING METHOD THEREOF

CROSS-REFERENCE TO RELATED APPLICATION(S)

This is a continuation of U.S. application Ser. No. 15/417,911 filed Jan. 27, 2017, which is a continuation of U.S. application Ser. No. 14/506,771 filed Oct. 6, 2014, issued as U.S. Pat. No. 9,577,679 on Feb. 21, 2017, which claims the benefit under 35 U.S.C. § 119 from U.S. Provisional Application No. 61/886,827 field on Oct. 4, 2013, in the United States Patent and Trademark Office and Korean Patent Application No. 10-2014-0134505 filed on Oct. 6, 2014 in the Korean Intellectual Property Office, the disclosures of which are incorporated herein by reference in their entirety.

BACKGROUND

1. Technical Field

Apparatuses and methods consistent with exemplary embodiments relate to a transmitting apparatus and a signal processing method thereof, and more particularly, to a transmitting apparatus which processes data and transmits the data, and a signal processing method thereof.

2. Description of the Related Art

In a communication/broadcasting system, link performance may greatly deteriorate due to various noises of channels, a fading phenomenon, and an inter-symbol interference (ISI). Therefore, in order to implement high digital communication/broadcasting systems requiring high data throughput and reliability, such as next-generation mobile communication, digital broadcasting, and portable Internet, there is a demand for a method for overcoming the noise, fading, and inter-symbol interference. To overcome the noise, etc., research on an error-correction code has been actively conducted in recent years as a method for effectively restoring distorted information and enhancing reliability of communication.

The Low Density Parity Check (LDPC) code which was first introduced by Gallager in the 1960s has been forgotten for a long time due to its difficulty and complexity in realizing by the level of technology at that time. However, as the turbo code which was suggested by Berrou, Glavieux, Thitimajshima in 1993 showed performance equivalent to the channel capacity of Shannon, the performance and characteristics of the turbo code were actively interpreted and many researches on channel encoding based on iterative decoding and graph were conducted. This leaded the re-research on the LDPC code in the late 1990's and it turned out that decoding by applying iterative decoding based on a sum-product algorithm on a Tanner graph corresponding to the LDPC code resulted in the performance equivalent to the channel capacity of Shannon.

When the LDPC code is transmitted by using a high order modulation scheme, performance depends on how codeword bits are mapped onto high order modulation bits. Therefore, there is a need for a method for mapping LDPC codeword bits onto high order modulation bits to obtain an LDPC code of good performance.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a transmitting apparatus which can map a bit included in a predetermined group from among a plurality of groups of a Low Density Parity Check (LDPC) codeword onto a predetermined bit of a modulation symbol, and transmit the bit, and a signal processing method thereof.

According to an exemplary embodiment, there is provided a transmitting apparatus including: an encoder configured to generate a low density parity check (LDPC) codeword by performing LDPC encoding; an interleaver configured to interleave by dividing the LDPC codeword into a plurality of bit groups; and a modulator configured to modulate the interleaved LDPC codeword according to a modulation method to generate a modulation symbol, and the interleaver includes a block interleaver formed of a plurality of columns including a plurality of rows, respectively, and the block interleaver interleaves the LDPC codeword by dividing each of the plurality of columns into a first part and a second part according to the number of the plurality of columns and the number of the bit groups.

The number of the plurality of columns may have a same value as a modulation order according to the modulation method, and each of the plurality of columns may be formed of the number of bits constituting an LDPC codeword divided by the number of the plurality of columns.

The first part may be formed of rows as many as the number of bits included in at least some bit groups which are writable in bit group units in each of the plurality of columns from among a plurality of bit groups constituting the LDPC codeword according to the number of the plurality of columns, the number of bit groups, and the number of bits constituting each bit group, in each of the plurality of columns, and the second part may be formed of rows excluding the number of rows as many as the number of bits included in at least some bit groups which are writable in bit group units in each of the plurality of columns in rows constituting each of the plurality of columns, in each of the plurality of columns.

The number of rows in the second part may have the same value as a quotient of the number of bits included in all bit groups excluding bit groups corresponding to the first part divided by the number of columns constituting the block interleaver.

The block interleaver may write the bits included in at least some bit groups which are writable in bit group units in each of a plurality of columns constituting the first part serially, divide bits included in the remaining bit groups excluding at least some bit groups from among a plurality of bit groups based on the number of the plurality of columns, and write the bits in a plurality of columns constituting the second part serially The block interleaver may interleave by dividing the bits included in the remaining bit groups by the number of the plurality of columns, write each of the divided bits in each of a plurality of columns constituting the second part in a column direction, and read a plurality of columns constituting the first part and the second part in a row direction.

The modulation order may be 2, 4, 6, 8, 10, and 12 when the modulation method is QPSK, 16-QAM, 64-QAM, 256-QAM, 1024-QAM, 4096-QAM, respectively.

According to an exemplary embodiment, there is provided a method of processing a signal in a transmitting apparatus including: generating a low density parity check (LDPC) codeword by performing LDPC encoding; interleaving by dividing the LDPC codeword into a plurality of bit groups; and modulating the interleaved LDPC codeword according to a modulation method to generate a modulation symbol, and the interleaving comprises interleaving the LDPC codeword by dividing each of the plurality of columns into a first part and a second part according to the number of the plurality of columns and the number of the bit groups.

The number of the plurality of columns may have a same value as a modulation order according to the modulation method, and each of the plurality of columns is formed of the number of bits constituting an LDPC codeword divided by the number of the plurality of columns.

The first part may be formed of rows as many as the number of bits included in at least some bit groups which are writable in bit group units in each of the plurality of columns from among a plurality of bit groups constituting the LDPC codeword according to the number of the plurality of columns, the number of bit groups, and the number of bits constituting each bit group, in each of the plurality of columns, and the second part may be formed of rows excluding the number of rows as many as the number of bits included in at least some bit groups which are writable in bit group units in each of the plurality of columns in rows constituting each of the plurality of columns, in each of the plurality of columns.

The number of rows in the second part may have the same value as a quotient of the number of bits included in all bit groups excluding bit groups corresponding to the first part divided by the number of columns constituting the block interleaver.

The interleaving may include writing the bits included in at least some bit groups which are writable in bit group units in each of a plurality of columns constituting the first part serially, dividing bits included in the remaining bit groups excluding at least some bit groups from among a plurality of bit groups based on the number of the plurality of columns, and writing the bits in a plurality of columns constituting the second part serially.

The interleaving may include interleaving by dividing the bits included in the remaining bit groups by the number of the plurality of columns, writing each of the divided bits in each of a plurality of columns constituting the second part in a column direction, and reading a plurality of columns constituting the first part and the second part in a row direction.

The modulation order may be 2, 4, 6, 8, 10, and 12 when the modulation method is QPSK, 16-QAM, 64-QAM, 256-QAM, 1024-QAM, 4096-QAM, respectively.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE EXEMPLARY EMBODIMENTS

Figure 1:
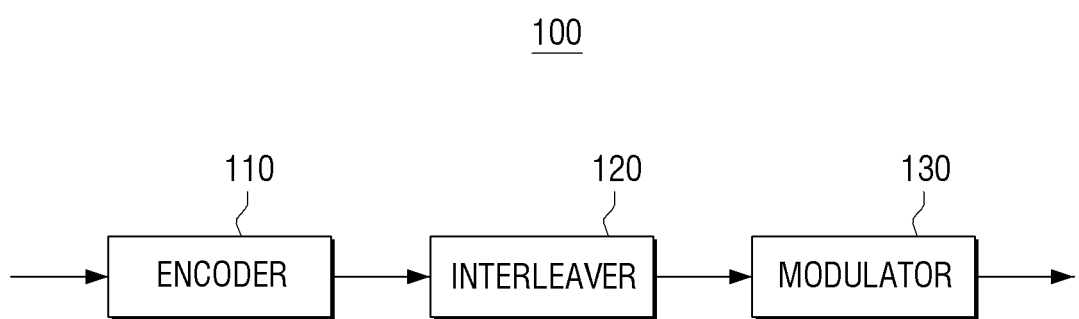
FIG. 1 is a block diagram to illustrate a configuration of a transmitting apparatus according to an exemplary embodiment.

Hereinafter, various exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

FIG. 1 is a block diagram to illustrate a configuration of a transmitting apparatus according to a first exemplary embodiment. Referring to FIG. 1, the transmitting apparatus 100 includes an encoder 110, an interleaver 120, and a modulator 130 (or a constellation mapper).

The encoder 110 generates a Low Density Parity Check (LDPC) codeword by performing LDPC encoding. The encoder 110 may include an LDPC encoder (not shown) to perform the LDPC encoding.

Specifically, the encoder 110 LDPC-encodes input bits to information word bits to generate the LDPC codeword which is formed of the information word bits and parity bits (that is, LDPC parity bits). Here, since an LDPC code for the LDPC encoding is a systematic code, the information word bits may be included in the LDPC codeword as they are.

The LDPC codeword is formed of the information word bits and the parity bits. For example, the LDPC codeword is formed of $N_{ldpc}$ number of bits, and includes $K_{ldpc}$ number of information word bits and $N_{parity}=N_{ldpc}-K_{ldpc}$ number of parity bits.

In this case, the encoder 110 may generate the LDPC codeword by performing the LDPC encoding based on a parity check matrix. That is, since the LDPC encoding is a process for generating an LDPC codeword to satisfy H·C$^T$=0, the encoder 110 may use the parity check matrix when performing the LDPC encoding. Herein, H is a parity check matrix and C is an LDPC codeword.

For the LDPC encoding, the transmitting apparatus 100 may include a separate memory and may pre-store parity check matrices of various formats.

For example, the transmitting apparatus 100 may pre-store parity check matrices which are defined in Digital Video Broadcasting-Cable version 2 (DVB-C2), Digital Video Broadcasting-Satellite-Second Generation (DVB-S2), Digital Video Broadcasting-Second Generation Terrestrial (DVB-T2), etc., or may pre-store parity check matrices which are defined in the North America digital broadcasting standard system Advanced Television System Committee (ATSC) 3.0 standards, which are currently being established. However, this is merely an example and the transmitting apparatus 100 may pre-store parity check matrices of other formats in addition to these parity check matrices.

Hereinafter, a configuration of a parity check matrix will be explained in detail with reference to FIGS. 2 and 3.

Figure 2:
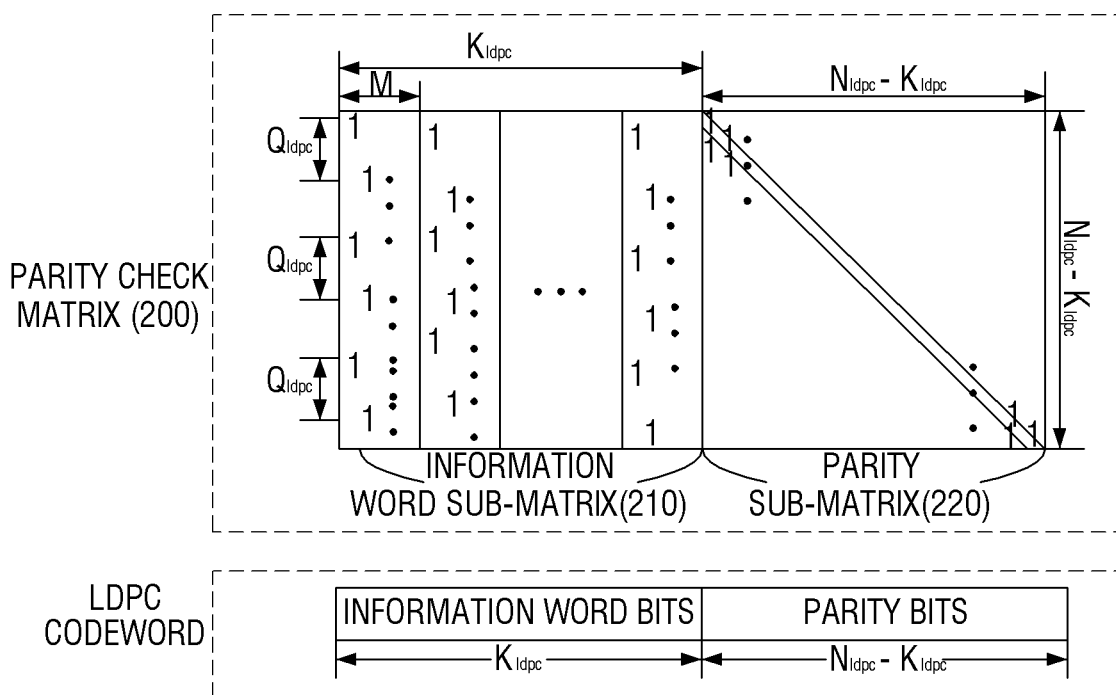
FIGS. 2 and 3 are views to illustrate a configuration of a parity check matrix according to exemplary embodiments.

First, referring to FIG. 2, a parity check matrix 200 is formed of an information word submatrix 210 corresponding to information word bits, and a parity submatrix 220 corresponding to parity bits. In the parity check matrix 200, elements other than elements with 1 have 0.

The information word submatrix 210 includes $K_{ldpc}$ number of columns and the parity submatrix 220 includes $N_{parity}=N_{ldpc}-K_{ldpc}$ number of columns. The number of rows of the parity check matrix 200 is identical to the number of columns of the parity submatrix 220, $N_{parity}=N_{ldpc}-K_{ldpc}$.

In addition, in the parity check matrix 200, $N_{ldpc}$ is a length of an LDPC codeword, $K_{ldpc}$ is a length of information word bits, and $N_{parity}=N_{ldpc}-K_{ldpc}$ is a length of parity bits. The length of the LDPC codeword, the information word bits, and the parity bits mean the number of bits included in each of the LDPC codeword, the information bits, and the parity bits.

Hereinafter, the configuration of the information word submatrix 210 and the parity submatrix 220 will be explained in detail.

The information word submatrix 210 includes $K_{ldpc}$ number of columns (that is, 0$^{th}$ column to $(K_{ldpc}-1)^{th}$ column), and follows the following rules:

First, M number of columns from among $K_{ldpc}$ number of columns of the information word submatrix 210 belong to the same group, and $K_{ldpc}$ number of columns is divided into $K_{ldpc}/M$ number of column groups. In each column group, a column is cyclic-shifted from an immediately previous column by $Q_{ldpc}$ or $Q_{ldpc}$ number of bits.

Herein, M is an interval at which a pattern of a column group, which includes a plurality of columns, is repeated in the information word submatrix 210 (e.g., M=360), and $Q_{ldpc}$ is a size by which one column is cyclic-shifted from an immediately previous column in a same column group in the information word submatrix 210. M and $Q_{ldpc}$ are integers and are determined to satisfy $Q_{ldpc}=(N_{ldpc}-K_{ldpc})/M$. In this case, $K_{ldpc}/M$ is also an integer. M and $Q_{ldpc}$ may have various values according to a length of the LDPC codeword and a code rate.

For example, when M=360 and the length of the LDPC codeword, $N_{ldpc}$, is 64800, $Q_{ldpc}$ may be defined as in table 1 presented below, and, when M=360 and the length $N_{ldpc}$ of the LDPC codeword is 16200, $Q_{ldpc}$ may be defined as in table 2 presented below.

TABLE 1

| Code Rate | $N_{ldpc}$ | M | $Q_{ldpc}$ |
| --- | --- | --- | --- |
| 5/15 | 64800 | 360 | 120 |
| 6/15 | 64800 | 360 | 108 |
| 7/15 | 64800 | 360 | 96 |
| 8/15 | 64800 | 360 | 84 |
| 9/15 | 64800 | 360 | 72 |
| 10/15 | 64800 | 360 | 60 |
| 11/15 | 64800 | 360 | 48 |
| 12/15 | 64800 | 360 | 36 |
| 13/15 | 64800 | 360 | 24 |

TABLE 2

| Code Rate | $N_{ldpc}$ | M | $Q_{ldpc}$ |
| --- | --- | --- | --- |
| 5/15 | 16200 | 360 | 30 |
| 6/15 | 16200 | 360 | 27 |
| 7/15 | 16200 | 360 | 24 |
| 8/15 | 16200 | 360 | 21 |
| 9/15 | 16200 | 360 | 18 |
| 10/15 | 16200 | 360 | 15 |
| 11/15 | 16200 | 360 | 12 |
| 12/15 | 16200 | 360 | 9 |
| 13/15 | 16200 | 360 | 6 |

Second, when the degree of the 0$^{th}$ column of the i$^{th}$ column group (i=0, 1, . . . , $K_{ldpc}/M-1$) is $D_i$ (herein, the degree is the number of value 1 existing in each column and all columns belonging to the same column group have the same degree), and a position (or an index) of each row where 1 exists in the 0$^{th}$ column of the i$^{th}$ column group is $R_{i,0}^{(0)}$, $R_{i,0}^{(1)}$, . . . , $R_{i,0}^{(D_i-1)}$, an index $R_{i,j}^{(k)}$ of a row where k$^{th}$ weight-1 is located in the j$^{th}$ column in the i$^{th}$ column group (that is, an index of a row where k$^{th}$ 1 is located in the j$^{th}$ column in the i$^{th}$ column group) is determined by following Equation 1:

$$R_{i,j}^{(k)}=R_{i,(j-1)}^{(k)}+Q_{ldpc} \bmod(N_{ldpc}-K_{ldpc}) \quad (1)$$

where k=0, 1, 2, . . . $D_i-1$; i=0, 1, . . . , $K_{ldpc}/M-1$; and j=1, 2, . . . , M-1.

Equation 1 can be expressed as following Equation 2:

$$R_{i,j}^{(k)}=\{R_{i,0}^{(k)}+(j \bmod M)\times Q_{ldpc}\}\bmod(N_{ldpc}-K_{ldpc}) \quad (2)$$

where k=0, 1, 2, . . . $D_i-1$; i=0, 1, . . . , $K_{ldpc}/M-1$; and j=1, 2, . . . , M-1.

In the above equations, R) is an index of a row where k$^{th}$ weight-1 is located in the j$^{th}$ column in the i$^{th}$ column group, $N_{ldpc}$ is a length of an LDPC codeword, $K_{ldpc}$ is a length of information word bits, $D_i$ is a degree of columns belonging to the i$^{th}$ column group, M is the number of columns belonging to a single column group, and $Q_{ldpc}$ is a size by which each column in the column group is cyclic-shifted.

As a result, referring to these equations, when only $R_{i,0}^{(k)}$ is known, the index $R_{i,j}^{(k)}$ of the row where the k$^{th}$ weight-1 is located in the j$^{th}$ column in the i$^{th}$ column group can be known. Therefore, when the index value of the row where the k$^{th}$ weight-1 is located in the first column of each column group is stored, a position of column and row where weight-1 is located in the parity check matrix 200 having the configuration of FIG. 2 (that is, in the information word submatrix 210 of the parity check matrix 200) can be known.

According to the above-described rules, all of the columns belonging to the i$^{th}$ column group have the same degree $D_i$. Accordingly, the LDPC codeword which stores information on the parity check matrix according to the above-described rules may be briefly expressed as follows.

For example, when $N_{ldpc}$ is 30, $K_{ldpc}$ is 15, and $Q_{ldpc}$ is 3, position information of the row where weight-1 is located in the $0^{th}$ column of the three column groups may be expressed by a sequence of Equations 3 and may be referred to as "weight-1 position sequence".

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \quad (3),$$

where $R_{i,j}^{(k)}$ is an index of a row where $k^{th}$ weight-1 is located in the $j^{th}$ column in the $i^{th}$ column group.

The weight-1 position sequence like Equation 3 which expresses an index of a row where 1 is located in the $0^{th}$ column of each column group may be briefly expressed as in Table 3 presented below:

TABLE 3

1 2 8 10
0 9 13
0 14

Table 3 shows positions of elements having weight-1, that is, the value 1, in the parity check matrix, and the $i^{th}$ weight-1 position sequence is expressed by indexes of rows where weight-1 is located in the $0^{th}$ column belonging to the $i^{th}$ column group.

The information word submatrix 210 of the parity check matrix according to an exemplary embodiment may be defined as in Tables 4 to 22 presented below, based on the above descriptions.

Specifically, Tables 4 to 22 show indexes of rows where 1 is located in the $0^{th}$ column of the $i^{th}$ column group of the information word submatrix 210. That is, the information word submatrix 210 is formed of a plurality of column groups each including M number of columns, and positions of 1 in the $0^{th}$ column of each of the plurality of column groups may be defined by Tables 4 to 22.

Herein, the indexes of the rows where 1 is located in the $0^{th}$ column of the $i^{th}$ column group mean "addresses of parity bit accumulators". The "addresses of parity bit accumulators" have the same meaning as defined in the DVB-C2/S2/T2 standards or the ATSC 3.0 standards which are currently being established, and thus, a detailed explanation thereof is omitted.

For example, when the length $N_{ldpc}$ of the LDPC codeword is 16200, the code rate R is 5/15, and M is 360, the indexes of the rows where 1 is located in the $0^{th}$ column of the $i^{th}$ column group of the information word submatrix 210 are as shown in Table 4 presented below:

TABLE 4

| i | Index of row where 1 is located in the 0th column of the ith column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |

TABLE 4-continued

| i | Index of row where 1 is located in the 0th column of the ith column group |
|---|---|
| 6 | 848 3313 3380 3990 |
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072 |

In another example, when the length $N_{ldpc}$ of the LDPC codeword is 16200, the code rate R is 6/15, and M is 360, the indexes of the rows where 1 is located in the $0^{th}$ column of the $i^{th}$ column group of the information word submatrix 210 are as shown in Table 5 presented below:

TABLE 5

| i | Index of row where 1 is located in the 0th column of the ith column group |
|---|---|
| 0 | 13 88 136 188 398 794 855 918 954 1950 2762 2837 2847 4209 4342 5092 5334 5498 5731 5837 6150 6942 7127 7402 7936 8235 8307 8600 9001 9419 9442 9710 |
| 1 | 619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401 |
| 2 | 499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671 |
| 3 | 658 4058 7824 8512 |
| 4 | 3245 4743 8117 9369 |
| 5 | 465 6559 8112 9461 |
| 6 | 975 2368 4444 6095 |
| 7 | 4128 5993 9182 9473 |
| 8 | 9 3822 5306 5320 |
| 9 | 4 8311 9571 9669 |
| 10 | 13 8122 8949 9656 |
| 11 | 3353 4449 5829 8053 |
| 12 | 7885 9118 9674 |
| 13 | 7575 9591 9670 |
| 14 | 431 8123 9271 |
| 15 | 4228 7587 9270 |
| 16 | 8847 9146 9556 |
| 17 | 11 5213 7763 |

In another example, when the length $N_{ldpc}$ of the LDPC codeword is 16200, the code rate R is 7/15, and M is 360, the indexes of the rows where 1 is located in the 0th column of the $i^{th}$ column group of the information word submatrix 210 are as shown in Table 6 presented below:

TABLE 6

| i | Index of row where 1 is located in the 0th column of the ith column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |

TABLE 6-continued

| i | Index of row where 1 is located in the 0th column of the ith column group |
|---|---|
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103 |

In another example, when the length $N_{ldpc}$ of the LDPC codeword is 16200, the code rate R is 8/15, and M is 360, the indexes of the rows where 1 is located in the $0^{th}$ column of the $i^{th}$ column group of the information word submatrix 210 are as shown in Table 7, 8 or 9 presented below:

TABLE 7

| i | Index of row where 1 is located in the 0th column of the ith column group |
|---|---|
| 0 | 32 384 430 591 1296 1976 1999 2137 2175 3638 4214 4304 4486 4662 4999 5174 5700 6969 7115 7138 7189 |
| 1 | 1788 1881 1910 2724 4504 4928 4973 5616 5686 5718 5846 6523 6893 6994 7074 7100 7277 7399 7476 7480 7537 |
| 2 | 2791 2824 2927 4196 4298 4800 4948 5361 5401 5688 5818 5862 5969 6029 6244 6645 6962 7203 7302 7454 7534 |
| 3 | 574 1461 1826 2056 2069 2387 2794 3349 3366 4951 5826 5834 5903 6640 6762 6786 6859 7043 7418 7431 7554 |
| 4 | 14 178 675 823 890 930 1209 1311 2898 4339 4600 5203 6485 6549 6970 7208 7218 7298 7454 7457 7462 |
| 5 | 4075 4188 7313 7553 |
| 6 | 5145 6018 7148 7507 |
| 7 | 3198 4858 6983 7033 |
| 8 | 3170 5126 5625 6901 |
| 9 | 2839 6093 7071 7450 |
| 10 | 11 3735 5413 |
| 11 | 2497 5400 7238 |
| 12 | 2067 5172 5714 |
| 13 | 1889 7173 7329 |
| 14 | 1795 2773 3499 |
| 15 | 2695 2944 6735 |
| 16 | 3221 4625 5897 |
| 17 | 1690 6122 6816 |
| 18 | 5013 6839 7358 |
| 19 | 1601 6849 7415 |
| 20 | 2180 7389 7543 |
| 21 | 2121 6838 7054 |
| 22 | 1948 3109 5046 |
| 23 | 272 1015 7464 |

TABLE 8

| i | Index of row where 1 is located in the 0th column of the ith column group |
|---|---|
| 0 | 5 519 825 1871 2098 2478 2659 2820 3200 3294 3650 3804 3949 4426 4460 4503 4568 4590 4949 5219 5662 5738 5905 5911 6160 6404 6637 6706 6737 6814 7263 7412 |
| 1 | 81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554 |
| 2 | 105 975 3421 3480 4120 4444 5957 5971 6119 6617 6761 6810 7067 7353 |
| 3 | 6 138 485 1444 1512 2615 2990 3109 5604 6435 6513 6632 6704 7507 |
| 4 | 20 858 1051 2539 3049 5162 5308 6158 6391 6604 6744 7071 7195 7238 |

TABLE 8-continued

| i | Index of row where 1 is located in the 0th column of the ith column group |
|---|---|
| 5 | 1140 5838 6203 6748 |
| 6 | 6282 6466 6481 6638 |
| 7 | 2346 2592 5436 7487 |
| 8 | 2219 3897 5896 7528 |
| 9 | 2897 6028 7018 |
| 10 | 1285 1863 5324 |
| 11 | 3075 6005 6466 |
| 12 | 5 6020 7551 |
| 13 | 2121 3751 7507 |
| 14 | 4027 5488 7542 |
| 15 | 2 6012 7011 |
| 16 | 3823 5531 5687 |
| 17 | 1379 2262 5297 |
| 18 | 1882 7498 7551 |
| 19 | 3749 4806 7227 |
| 20 | 2 2074 6898 |
| 21 | 17 616 7482 |
| 22 | 9 6823 7480 |
| 23 | 5195 5880 7559 |

TABLE 9

| i | Index of row where 1 is located in the 0th column of the ith column group |
|---|---|
| 0 | 6 243 617 697 1380 1504 1864 1874 1883 2075 2122 2439 2489 3076 3715 3719 3824 4028 4807 5006 5196 5532 5688 5881 6216 6899 7000 7118 7284 7412 7417 7523 |
| 1 | 0 6 17 20 105 1279 2443 2523 2800 3458 3684 4257 4799 4819 5499 5665 5810 5927 6169 6536 6617 6669 7069 7127 7132 7158 7164 7230 7320 7393 7396 7465 |
| 2 | 2 6 12 15 2033 2125 3352 3382 5931 7024 7143 7358 7391 7504 |
| 3 | 5 17 1725 1932 3277 4781 4888 6025 6374 7001 7139 7510 7524 7548 |
| 4 | 4 19 101 1493 4111 4163 4599 6517 6604 6948 6963 7008 7280 7319 |
| 5 | 8 28 2289 5025 |
| 6 | 5505 5693 6844 7552 |
| 7 | 9 3441 7424 7533 |
| 8 | 917 1816 3540 4552 |
| 9 | 256 6362 6868 |
| 10 | 2125 3144 5576 |
| 11 | 3443 5553 7201 |
| 12 | 2219 3897 4541 |
| 13 | 6331 6481 7224 |
| 14 | 7 1444 5568 |
| 15 | 81 1325 3345 |
| 16 | 778 2726 7316 |
| 17 | 3512 6462 7259 |
| 18 | 768 3751 6028 |
| 19 | 4665 7130 7452 |
| 20 | 2375 6814 7450 |
| 21 | 7073 7209 7483 |
| 22 | 2592 6466 7018 |
| 23 | 3716 5838 7547 |

In another example, when the length $N_{ldpc}$ of the LDPC codeword is 16200, the code rate R is 9/15, and M is 360, the indexes of the rows where 1 is located in the $0^{th}$ column of the $i^{th}$ column group of the information word submatrix 210 are as shown in Table 10 presented below:

TABLE 10

| i | Index of row where 1 is located in the 0th column of the ith column group |
|---|---|
| 0 | 350 462 1291 1383 1821 2235 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4430 4456 4522 4783 5273 6037 6395 |

TABLE 10-continued

Index of row where 1 is located in the 0th column of the ith column group

| i | |
|---|---|
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336 |

In another example, when the length $N_{ldpc}$ of the LDPC codeword is 16200, the code rate R is 10/15, and M is 360, the indexes of the rows where 1 is located in the 0th column of the $i^{th}$ column group of the information word submatrix 210 are as shown in Table 11, 12, or 13 presented below:

TABLE 11

Index of row where 1 is located in the 0th column of the ith column group

| i | |
|---|---|
| 0 | 76 545 1005 1029 1390 1970 2525 2971 3448 3845 4088 4114 4163 4373 4640 4705 4970 5094 |
| 1 | 14 463 600 1676 2239 2319 2326 2815 2887 4278 4457 4493 4597 4918 4989 5038 5261 5384 |
| 2 | 451 632 829 1006 1530 1723 2205 2587 2801 3041 3849 4382 4595 4727 5006 5156 5224 5286 |
| 3 | 211 265 1293 1777 1926 2214 2909 2957 3178 3278 3771 4547 4563 4737 4879 5068 5232 5344 |
| 4 | 6 2901 3925 5384 |
| 5 | 2858 4152 5006 5202 |
| 6 | 9 1232 2063 2768 |
| 7 | 7 11 2781 3871 |
| 8 | 12 2161 2820 4078 |
| 9 | 3 3510 4668 5323 |
| 10 | 253 411 3215 5241 |
| 11 | 3919 4789 5040 5302 |
| 12 | 12 5113 5256 5352 |
| 13 | 9 1461 4004 5241 |
| 14 | 1688 3585 4480 5394 |
| 15 | 8 2127 3469 4360 |
| 16 | 2827 4049 5084 5379 |
| 17 | 1770 3331 5315 5386 |
| 18 | 1885 2817 4900 5088 |
| 19 | 2568 3854 4660 |
| 20 | 1604 3565 5373 |
| 21 | 2317 4636 5156 |
| 22 | 2480 2816 4094 |
| 23 | 14 4518 4826 |
| 24 | 127 1192 3872 |
| 25 | 93 2282 3663 |
| 26 | 2962 5085 5314 |
| 27 | 2078 4277 5089 |
| 28 | 9 5280 5292 |
| 29 | 50 2847 4742 |

TABLE 12

Index of row where 1 is located in the 0th column of the ith column group

| i | |
|---|---|
| 0 | 446 449 544 788 992 1389 1800 1933 2461 2975 3186 3442 3733 3773 4076 4308 4323 4605 4882 5034 5080 5135 5146 5269 5307 |
| 1 | 25 113 139 147 307 1066 1078 1572 1773 1957 2143 2609 2642 2901 3371 3414 3935 4141 4165 4271 4520 4754 4971 5160 5179 |
| 2 | 341 424 1373 1559 1953 2577 2721 3257 3706 4025 4273 4689 4995 5005 |
| 3 | 442 465 1892 2274 2292 2999 3156 3308 3883 4084 4316 4636 4743 5200 |
| 4 | 22 1809 2406 3332 3359 3430 3466 4610 4638 5224 5280 5288 5337 5381 |
| 5 | 29 1203 1444 1720 1836 2138 2902 3601 3647 4138 4269 4457 4965 5315 |
| 6 | 1138 2493 3852 4802 |
| 7 | 3050 5361 5396 |
| 8 | 278 399 4810 |
| 9 | 1200 3571 4904 |
| 10 | 1705 2811 3448 |
| 11 | 2180 4242 5336 |
| 12 | 4539 5069 5363 |
| 13 | 3318 3645 4427 |
| 14 | 2902 5134 5176 |
| 15 | 5123 5130 5229 |
| 16 | 47 4474 5356 |
| 17 | 2399 3981 5067 |
| 18 | 2377 2465 5080 |
| 19 | 1413 2471 5328 |
| 20 | 2502 4911 5329 |
| 21 | 4770 5139 5356 |
| 22 | 3263 4000 4022 |
| 23 | 648 2015 4867 |
| 24 | 311 2309 4063 |
| 25 | 1284 3246 3740 |
| 26 | 7 1080 3820 |
| 27 | 1261 2408 4608 |
| 28 | 3838 4076 4842 |
| 29 | 2294 4592 3254 |

TABLE 13

Index of row where 1 is located in the 0th column of the ith column group

| i | |
|---|---|
| 0 | 352 747 894 1437 1688 1807 1883 2119 2159 3321 3400 3543 3588 3770 3821 4384 4470 4884 5012 5036 5084 5101 5271 5281 5353 |
| 1 | 505 915 1156 1269 1518 1650 2153 2256 2344 2465 2509 2867 2875 3007 3254 3519 3687 4331 4439 4532 4940 5011 5076 5113 5367 |
| 2 | 268 346 650 919 1260 4389 4653 4721 4838 5054 5157 5162 5275 5362 |
| 3 | 220 236 828 1590 1792 3259 3647 4276 4281 4325 4963 4974 5003 5037 |
| 4 | 381 737 1099 1409 2364 2955 3228 3341 3473 3985 4257 4730 5173 5242 |
| 5 | 88 771 1640 1737 1803 2408 2575 2974 3167 3464 3780 4501 4901 5047 |
| 6 | 749 1502 2201 3189 |
| 7 | 2873 3245 3427 |
| 8 | 2158 2605 3165 |
| 9 | 1 3438 3606 |
| 10 | 10 3019 5221 |
| 11 | 371 2901 2923 |
| 12 | 9 3935 4683 |
| 13 | 1937 3502 3735 |
| 14 | 507 3128 4994 |
| 15 | 25 3854 4550 |
| 16 | 1178 4737 5366 |
| 17 | 2 223 5304 |
| 18 | 1146 5175 5197 |
| 19 | 1816 2313 3649 |
| 20 | 740 1951 3844 |
| 21 | 1320 3703 4791 |
| 22 | 1754 2905 4058 |
| 23 | 7 917 5277 |
| 24 | 3048 3954 5396 |
| 25 | 4804 4824 5105 |

TABLE 13-continued

| i | Index of row where 1 is located in the 0th column of the ith column group |
|---|---|
| 26 | 2812 3895 5226 |
| 27 | 0 5318 5358 |
| 28 | 1483 2324 4826 |
| 29 | 2266 4752 5387 |

In another example, when the length $N_{ldpc}$ of the LDPC codeword is 16200, the code rate R is 11/15, and M is 360, the indexes of the rows where 1 is located in the $0^{th}$ column of the $i^{th}$ column group of the information word submatrix 210 are as shown in Table 14 presented below:

TABLE 14

| i | Index of row where 1 is located in the 0th column of the ith column group |
|---|---|
| 0 | 108 297 703 742 1345 1443 1495 1628 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318 |

In another example, when the length $N_{ldpc}$ of the LDPC codeword is 16200, the code rate R is 12/15, and M is 360, the indexes of the rows where 1 is located in the 0th column of the $i^{th}$ column group of the information word submatrix 210 are as shown in Table 15 or 16 presented below:

TABLE 15

| i | Index of row where 1 is located in the 0th column of the ith column group |
|---|---|
| 0 | 3 394 1014 1214 1361 1477 1534 1660 1856 2745 2987 2991 3124 3155 |
| 1 | 59 136 528 781 803 928 1293 1489 1944 2041 2200 2613 2690 2847 |
| 2 | 155 245 311 621 1114 1269 1281 1783 1995 2047 2672 2803 2885 3014 |
| 3 | 79 870 974 1326 1449 1531 2077 2317 2467 2627 2811 3083 3101 3132 |
| 4 | 4 582 660 902 1048 1482 1697 1744 1928 2628 2699 2728 3045 3104 |
| 5 | 175 395 429 1027 1061 1068 1154 1168 1175 2147 2359 2376 2613 2682 |
| 6 | 1388 2241 3118 3148 |
| 7 | 143 506 2067 3148 |
| 8 | 1594 2217 2705 |
| 9 | 398 988 2551 |
| 10 | 1149 2588 2654 |
| 11 | 678 2844 3115 |
| 12 | 1508 1547 1954 |
| 13 | 1199 1267 1710 |
| 14 | 2589 3163 3207 |
| 15 | 1 2583 2974 |
| 16 | 2766 2897 3166 |
| 17 | 929 1823 2742 |
| 18 | 1113 3007 3239 |
| 19 | 1753 2478 3127 |
| 20 | 0 509 1811 |
| 21 | 1672 2646 2984 |
| 22 | 965 1462 3230 |
| 23 | 3 1077 2917 |
| 24 | 1183 1316 1662 |
| 25 | 968 1593 3239 |
| 26 | 64 1996 2226 |
| 27 | 1442 2058 3181 |
| 28 | 513 973 1058 |
| 29 | 1263 3185 3229 |
| 30 | 681 1394 3017 |
| 31 | 419 2853 3217 |
| 32 | 3 2404 3175 |
| 33 | 2417 2792 2854 |
| 34 | 1879 2940 3235 |
| 35 | 647 1704 3060 |

TABLE 16

| i | Index of row where 1 is located in the 0th column of the ith column group |
|---|---|
| 0 | 69 170 650 1107 1190 1250 1309 1486 1612 1625 2091 2416 2580 2673 2921 2995 3175 3234 |
| 1 | 299 652 680 732 1197 1394 1779 1848 1885 2206 2266 2286 2706 2795 3206 3229 |
| 2 | 107 133 351 640 805 1136 1175 1479 1817 2068 2139 2586 2809 2855 2862 2930 |
| 3 | 75 458 508 546 584 624 875 1948 2363 2471 2574 2715 3008 3052 3070 3166 |
| 4 | 0 7 897 1664 1981 2172 2268 2272 2364 2873 2902 3016 3020 3121 3203 3236 |
| 5 | 121 399 550 1157 1216 1326 1789 1838 1888 2160 2537 2745 2949 3001 3020 3152 |
| 6 | 1497 2022 2726 2871 |
| 7 | 872 2320 2504 3234 |
| 8 | 851 1684 3210 3217 |
| 9 | 1807 2918 3178 |
| 10 | 671 1203 2343 |
| 11 | 405 490 3212 |
| 12 | 1 1474 3235 |
| 13 | 527 1224 2139 |
| 14 | 3 1997 2072 |
| 15 | 833 2366 3183 |
| 16 | 385 1309 3196 |
| 17 | 1343 2691 3153 |
| 18 | 1815 2048 2394 |
| 19 | 812 2055 2926 |
| 20 | 166 826 2807 |
| 21 | 1 493 2961 |
| 22 | 2218 3032 3153 |
| 23 | 2099 2885 3228 |
| 24 | 1214 2677 3216 |
| 25 | 2292 2422 2835 |

TABLE 16-continued

Index of row where 1 is located in the 0th column of the ith column group

| i | |
|---|---|
| 26 | 574 2138 3053 |
| 27 | 576 1409 1912 |
| 28 | 354 1631 3142 |
| 29 | 3211 3228 3239 |
| 30 | 1335 2938 3184 |
| 31 | 729 995 1520 |
| 32 | 537 3115 3233 |
| 33 | 4 2631 3231 |
| 34 | 1130 2851 3030 |
| 35 | 1136 2728 3203 |

In another example, when the length $N_{ldpc}$ of the LDPC codeword is 16200, the code rate R is 13/15, and M is 360, the indexes of the rows where 1 is located in the 0th column of the $i^{th}$ column group of the information word submatrix 210 are as shown in Table 17 presented below:

TABLE 17

Index of row where 1 is located in the 0th column of the ith column group

| i | |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 463 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |
| 26 | 871 1935 1964 |
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607 |

In another example, when the length $N_{ldpc}$ of the LDPC codeword is 64800, the code rate R is 6/15, and M is 360, the indexes of the rows where 1 is located in the 0th column of the $i^{th}$ column group of the information word submatrix 210 are as shown in Table 18 presented below:

TABLE 18

Index of row where 1 is located in the 0th column of the ith column group

| i | |
|---|---|
| 0 | 1606 3402 4961 6751 7132 11516 12300 12482 12592 13342 13764 14123 21576 23946 24533 25376 25667 26836 31799 34173 35462 36153 36740 37085 37152 37468 37658 |
| 1 | 4621 5007 6910 8732 9757 11508 13099 15513 16335 18052 19512 21319 23663 25628 27208 31333 32219 33003 33239 33447 36200 36473 36938 37201 37283 37495 38642 |
| 2 | 16 1094 2020 3080 4194 5098 5631 6877 7889 8237 9804 10067 11017 11366 13136 13354 15379 18934 20199 24522 26172 28666 30386 32714 36390 37015 37162 |
| 3 | 700 897 1708 6017 6490 7372 7825 9546 10398 16605 18561 18745 21625 22137 23693 24340 24966 25015 26995 28586 28895 29687 33938 34520 34858 37056 38297 |
| 4 | 159 2010 2573 3617 4452 4958 5556 5832 6481 8227 9924 10836 14954 15594 16623 18065 19249 22394 22677 23408 23731 24076 24776 27007 28222 30343 38371 |
| 5 | 3118 3545 4768 4992 5227 6732 8170 9397 10522 11508 15536 20218 21921 28599 29445 29758 29968 31014 32027 33685 34378 35867 36323 36728 36870 38335 38623 |
| 6 | 1264 4254 6936 9165 9486 9950 10861 11653 13697 13961 15164 15665 18444 19470 20313 21189 24371 26431 26999 28086 28251 29261 31981 34015 35850 36129 37186 |
| 7 | 111 1307 1628 2041 2524 5358 7988 8191 10322 11905 12919 14127 15515 15711 17061 19024 21195 22902 23727 24401 24608 25111 25228 27338 35398 37794 38196 |
| 8 | 961 3035 7174 7948 13355 13607 14971 18189 18339 18665 18875 19142 20615 21136 21309 21758 23366 24745 25849 25982 27583 30006 31118 32106 36469 36583 37920 |
| 9 | 2990 3549 4273 4808 5707 6021 6509 7456 8240 10044 12262 12660 13085 14750 15680 16049 21587 23997 25803 28343 28693 34393 34860 35490 36021 37737 38296 |
| 10 | 955 4323 5145 6885 8123 9730 11840 12216 19194 20313 23056 24248 24830 25268 26617 26801 28557 29753 30745 31450 31973 32839 33025 33296 35710 37366 37509 |
| 11 | 264 605 4181 4483 5156 7238 8863 10939 11251 12964 16254 17511 20017 22395 22818 23261 23422 24064 26329 27723 28186 30434 31956 33971 34372 36764 38123 |
| 12 | 520 2562 2794 3528 3860 4402 5676 6963 8655 9018 9783 11933 16336 17193 17320 19035 20606 23579 23769 24123 24966 27866 32457 34011 34499 36620 37526 |
| 13 | 10106 10637 10906 34242 |
| 14 | 1856 15100 19378 21848 |
| 15 | 943 11191 27806 29411 |
| 16 | 4575 6359 13629 19383 |
| 17 | 4476 4953 18782 24313 |
| 18 | 5441 6381 21840 35943 |
| 19 | 9638 9763 12546 30120 |
| 20 | 9587 10626 11047 25700 |
| 21 | 4088 15298 28768 35047 |
| 22 | 2332 6363 8782 28863 |
| 23 | 4625 4933 28298 30289 |
| 24 | 3541 4918 18257 31746 |
| 25 | 1221 25233 26757 34892 |
| 26 | 8150 16677 27934 30021 |
| 27 | 8500 25016 33043 38070 |
| 28 | 7374 10207 16189 35811 |
| 29 | 611 18480 20064 38261 |
| 30 | 25416 27352 36089 38469 |
| 31 | 1667 17614 25839 32776 |
| 32 | 4118 12481 21912 37945 |
| 33 | 5573 13222 23619 31271 |
| 34 | 18271 26251 27182 30587 |
| 35 | 14690 26430 26799 34355 |
| 36 | 13688 16040 20716 34558 |
| 37 | 2740 14957 23436 32540 |
| 38 | 3491 14365 14681 36858 |
| 39 | 4796 6238 25203 27854 |
| 40 | 1731 12816 17344 26025 |
| 41 | 19182 21662 23742 27872 |
| 42 | 6502 13641 17509 34713 |
| 43 | 12246 12372 16746 27452 |
| 44 | 1589 21528 30621 34003 |
| 45 | 12328 20515 30651 31432 |
| 46 | 3415 22656 23427 36395 |
| 47 | 632 5209 25958 31085 |
| 48 | 619 3690 19648 37778 |
| 49 | 9528 13581 26965 36447 |
| 50 | 2147 26249 26968 28776 |

TABLE 18-continued

Index of row where 1 is located in the 0th column of the ith column group

| i | |
|---|---|
| 51 | 15698 18209 30683 |
| 52 | 1132 19888 34111 |
| 53 | 4608 25513 38874 |
| 54 | 475 1729 34100 |
| 55 | 7348 32277 38587 |
| 56 | 182 16473 33082 |
| 57 | 3865 9678 21265 |
| 58 | 4447 20151 27618 |
| 59 | 6335 14371 38711 |
| 60 | 704 9695 28858 |
| 61 | 4856 9757 30546 |
| 62 | 1993 19361 30732 |
| 63 | 756 28000 29138 |
| 64 | 3821 24076 31813 |
| 65 | 4611 12326 32291 |
| 66 | 7628 21515 34995 |
| 67 | 1246 13294 30068 |
| 68 | 6466 33233 35865 |
| 69 | 14484 23274 38150 |
| 70 | 21269 36411 37450 |
| 71 | 23129 26195 37653 |

In another example, when the length $N_{ldpc}$ of the LDPC codeword is 64800, the code rate R is 7/15, and M is 360, the indexes of the rows where 1 is located in the $0^{th}$ column of the $i^{th}$ column group of the information word submatrix 210 are as shown in Table 19 or 20 presented below:

TABLE 19

Index of row where 1 is located in the 0th column of the ith column group

| i | |
|---|---|
| 0 | 13 127 927 930 1606 2348 3361 3704 5194 6327 7843 8081 8615 12199 13947 15317 15774 16289 16687 17122 20468 21057 21853 22414 23829 23885 25452 28072 28699 28947 30289 31672 32470 |
| 1 | 36 53 60 86 93 407 3975 4478 5884 6578 7599 7613 7696 9573 11010 11183 11233 13750 17182 17860 20181 23974 24195 25089 25787 25892 26121 30880 32989 33383 33626 34153 34520 |
| 2 | 27 875 2693 3435 3682 6195 6227 6711 7629 8005 9081 11052 11190 11443 14832 17431 17756 17998 18254 18632 22234 22880 23562 23647 27092 29035 29620 30336 33492 33906 33960 34337 34474 |
| 3 | 10 722 1241 3558 5490 5508 6420 7128 12386 12847 12942 15305 15592 16799 18033 19134 20713 20870 21589 26380 27538 27577 27971 29744 32344 32347 32673 32892 33018 33674 33811 34253 34511 |
| 4 | 6 24 72 2552 3171 5179 11519 12484 13096 13282 15226 18193 19995 25166 25303 25693 26821 29193 30666 31952 33137 33187 33190 33319 33653 33950 34062 34255 34292 34365 34433 34443 34527 |
| 5 | 1 12 26 29 85 1532 3870 6763 7533 7630 8022 8857 11667 11919 14987 16133 20999 21830 23522 24160 27671 28451 30618 31556 31894 33436 33543 34146 34197 34313 34437 34480 34550 |
| 6 | 13 44 2482 5068 8153 13233 13728 14548 17278 20027 21273 22112 22376 24799 29175 |
| 7 | 26 50 8325 8891 12816 15672 15933 24049 30372 31245 33194 33238 33934 34093 34547 |
| 8 | 1412 6334 7945 8866 10886 14521 17224 23693 25160 29267 31337 31893 32346 33195 33687 |
| 9 | 27 47 14505 14786 18416 19963 23250 23475 27275 27921 28090 33985 34371 34374 34512 |
| 10 | 16 31 4924 7028 10240 12380 13479 16405 20197 27989 28084 32440 33996 34090 34435 |
| 11 | 17 57 95 6786 7427 7548 10452 13714 25632 30647 33054 34195 34237 34304 34447 |
| 12 | 4 62 331 10220 10518 10575 18401 19286 28718 30521 30968 31329 31848 32614 34343 |
| 13 | 42 79 4682 4747 7335 11487 17405 18089 19470 22457 33433 34373 34471 34519 34540 |
| 14 | 27 65 4911 10752 14803 24122 24531 25322 29130 30081 31280 32050 32693 34435 34508 |
| 15 | 24 29 2107 2152 5271 11032 14001 14902 21705 23126 31276 33946 34372 34380 34469 |

TABLE 19-continued

Index of row where 1 is located in the 0th column of the ith column group

| i | |
|---|---|
| 16 | 16 62 72 7470 14839 15299 15894 17716 18068 24959 25024 33343 34186 34398 34429 |
| 17 | 37 56 70 2089 10016 11316 14652 15665 17202 19804 19847 30498 33938 34126 34391 |
| 18 | 68 963 2099 9596 17606 19249 21839 27437 29901 30714 33060 33456 34347 34498 34527 |
| 19 | 6 69 1845 2504 7189 8603 10379 11421 13742 15757 16857 20642 28039 32833 34270 |
| 20 | 2235 15032 31823 |
| 21 | 4737 33978 34504 |
| 22 | 2 20263 30373 |
| 23 | 923 18929 25743 |
| 24 | 4587 22945 28380 |
| 25 | 22094 26147 34544 |
| 26 | 5177 20758 26476 |
| 27 | 8938 17291 27352 |
| 28 | 5286 24717 29331 |
| 29 | 71 16442 32683 |
| 30 | 81 22810 28015 |
| 31 | 14112 14419 29708 |
| 32 | 4156 7522 23358 |
| 33 | 12850 20777 28294 |
| 34 | 14692 31178 34238 |
| 35 | 3447 12356 21997 |
| 36 | 6098 15443 33447 |
| 37 | 5947 11648 21719 |
| 38 | 72 8695 18421 |
| 39 | 2173 18978 27232 |
| 40 | 13656 18222 19869 |
| 41 | 49 24684 33849 |
| 42 | 84 13870 18354 |
| 43 | 54 10089 10516 |
| 44 | 8035 18741 23775 |
| 45 | 7553 13539 25652 |
| 46 | 9116 26724 27525 |
| 47 | 22960 24382 26185 |
| 48 | 17384 24749 26726 |
| 49 | 12197 18965 32473 |
| 50 | 95 23126 26909 |
| 51 | 19327 31338 34320 |
| 52 | 9843 34130 34381 |
| 53 | 4031 9940 22329 |
| 54 | 58 31795 34468 |
| 55 | 103 17411 25220 |
| 56 | 26 4338 24625 |
| 57 | 9758 34395 34531 |
| 58 | 2186 17077 27646 |
| 59 | 9156 19462 34059 |
| 60 | 6 59 29352 |
| 61 | 16316 29453 34128 |
| 62 | 16244 32865 34517 |
| 63 | 918 22159 29265 |
| 64 | 13612 19465 20671 |
| 65 | 1 8261 8849 |
| 66 | 11214 28864 32696 |
| 67 | 11513 27595 34479 |
| 68 | 11895 21430 34524 |
| 69 | 82 5535 10552 |
| 70 | 66 15799 26966 |
| 71 | 20555 21816 32855 |
| 72 | 3772 27923 33492 |
| 73 | 12837 15856 21575 |
| 74 | 2 16865 34413 |
| 75 | 2682 2702 21630 |
| 76 | 10 22173 34016 |
| 77 | 9740 23216 33800 |
| 78 | 61 33792 33839 |
| 79 | 3961 29314 33446 |
| 80 | 11337 16620 20008 |
| 81 | 18461 25285 34267 |
| 82 | 46 117 8394 |
| 83 | 12291 25671 34505 |

TABLE 20

| i | Index of row where 1 is located in the 0th column of the ith column group |
|---|---|
| 0 | 7 15 26 69 1439 3712 5756 5792 5911 8456 10579 19462 19782 21709 23214 25142 26040 30206 30475 31211 31427 32105 32989 33082 33502 34116 34241 34288 34292 34318 34373 34390 34465 |
| 1 | 83 1159 2271 6500 6807 7823 10344 10700 13367 14162 14242 14352 15015 17301 18952 20811 24974 25795 27868 28081 33077 33204 33262 33350 33516 33677 33680 33930 34090 34250 34290 34377 34398 |
| 2 | 25 2281 2995 3321 6006 7482 8428 11489 11601 14011 17409 26210 29945 30675 31101 31355 31421 31543 31697 32056 32216 33282 33453 33487 33696 34044 34107 34213 34247 34261 34276 34467 34495 |
| 3 | 0 43 87 2530 4485 4595 9951 11212 12270 12344 15566 21335 24699 26580 28518 28564 28812 29821 30418 31467 31871 32513 32597 33187 33402 33706 33838 33932 33977 34084 34283 34440 34473 |
| 4 | 81 3344 5540 7711 13308 15400 15885 18265 18632 22209 23657 27736 29158 29701 29845 30409 30654 30855 31420 31604 32519 32901 33267 33444 33525 33712 33878 34031 34172 34432 34496 34502 34541 |
| 5 | 42 50 66 2501 4706 6715 6970 8637 9999 14555 22776 26479 27442 27984 28534 29587 31309 31783 31907 31927 31934 32313 32369 32830 33364 33434 33553 33654 33725 33889 33962 34467 34482 |
| 6 | 6534 7122 8723 13137 13183 15818 18307 19324 20017 26389 29326 31464 32678 33668 34217 |
| 7 | 50 113 2119 5038 5581 6397 6550 10987 22308 25141 25943 29229 30186 33240 33399 |
| 8 | 7262 8787 9246 10032 10505 13090 14587 14790 16374 19946 21129 25726 31033 33660 33675 |
| 9 | 5004 5087 5291 7949 9477 11845 12698 14585 15239 17486 18100 18259 21409 21789 24280 |
| 10 | 28 82 3939 5007 6682 10312 12485 14384 21570 25512 26612 26854 30371 31114 32689 |
| 11 | 437 3055 9100 95117 12369 19030 19950 21328 24196 24236 25928 28458 30013 32181 33560 |
| 12 | 18 3590 4832 7053 8919 21149 24256 26543 27266 30747 31839 32671 33089 33571 34296 |
| 13 | 2678 4569 4667 6551 7639 10057 24276 24563 25818 26592 27879 28028 29444 29873 34017 |
| 14 | 72 77 2874 9092 10041 13669 20676 20778 25566 28470 28888 30338 31772 32143 33939 |
| 15 | 296 2196 7309 11901 14025 15733 16768 23587 25489 30936 31533 33749 34331 34431 34507 |
| 16 | 68144 12490 13275 14140 18706 20251 20644 21441 21938 23703 34190 34444 34463 34495 |
| 17 | 5108 14499 15734 19222 24695 25667 28359 28432 30411 30720 34161 34386 34465 34511 34522 |
| 18 | 61 89 3042 5524 12128 22505 22700 22919 24454 30526 33437 34114 34188 34490 34502 |
| 19 | 11 83 4668 4856 6361 11633 15342 16393 16958 26613 29136 30917 32559 34346 34504 |
| 20 | 3185 9728 25062 |
| 21 | 1643 5531 21573 |
| 22 | 2285 6088 24083 |
| 23 | 78 14678 19119 |
| 24 | 49 13705 33535 |
| 25 | 21192 32280 32781 |
| 26 | 10753 21469 22084 |
| 27 | 10082 11950 13889 |
| 28 | 7861 25107 29167 |
| 29 | 14051 34171 34430 |
| 30 | 706 894 8316 |
| 31 | 29693 30445 32281 |
| 32 | 10202 30964 34448 |
| 33 | 15815 32453 34463 |
| 34 | 4102 21608 24740 |
| 35 | 4472 29399 31435 |
| 36 | 1162 7118 23226 |
| 37 | 4791 33548 34096 |
| 38 | 1084 34099 34418 |
| 39 | 1765 20745 33714 |
| 40 | 1302 21300 33655 |
| 41 | 33 8736 16646 |
| 42 | 53 18671 19089 |
| 43 | 21 572 2028 |
| 44 | 3339 11506 16745 |
| 45 | 285 6111 12643 |
| 46 | 27 10336 11586 |
| 47 | 21046 32728 34538 |
| 48 | 22215 24195 34026 |
| 49 | 19975 26938 29374 |
| 50 | 16473 26777 34212 |
| 51 | 20 29260 32784 |
| 52 | 35 31645 32837 |
| 53 | 26132 34410 34495 |
| 54 | 12446 20649 26851 |
| 55 | 6796 10992 31061 |
| 56 | 0 46 8420 |
| 57 | 10 636 22885 |
| 58 | 7183 16342 18305 |
| 59 | 1 5604 28258 |
| 60 | 6071 18675 34489 |
| 61 | 16786 25023 33323 |
| 62 | 3573 5081 10925 |
| 63 | 5067 31761 34415 |
| 64 | 3735 33534 34522 |
| 65 | 85 32829 34518 |
| 66 | 6555 23368 34559 |
| 67 | 22083 29335 29390 |
| 68 | 6738 21110 34316 |
| 69 | 120 4192 11123 |
| 70 | 3313 4144 20824 |
| 71 | 27783 28550 31034 |
| 72 | 6597 8164 34427 |
| 73 | 18009 23474 32460 |
| 74 | 94 6342 12656 |
| 75 | 17 31962 34535 |
| 76 | 15091 24955 28545 |
| 77 | 15 3213 28298 |
| 78 | 26562 30236 34537 |
| 79 | 16832 20334 24628 |
| 80 | 4841 20669 26509 |
| 81 | 18055 23700 34534 |
| 82 | 23576 31496 34492 |
| 83 | 10699 13826 34440 |

In another example, when the length $N_{ldpc}$ of the LDPC codeword is 64800, the code rate R is 8/15, and M is 360, the indexes of the rows where 1 is located in the 0th column of the $i^{th}$ column group of the information word submatrix 210 are as shown in Table 21 presented below:

TABLE 21

| i | Index of row where 1 is located in the 0th column of the ith column group |
|---|---|
| 0 | 2768 3039 4059 5856 6245 7013 8157 9341 9802 10470 11521 12083 16610 18361 20321 24601 27420 28206 29788 |
| 1 | 2739 8244 8891 9157 12624 12973 15534 16622 16919 18402 18780 19854 20220 20543 22306 25540 27478 27678 28053 |
| 2 | 1727 2268 6246 7815 9010 9556 10134 10472 11389 14599 15719 16204 17342 17666 18850 22058 25579 25860 29207 |
| 3 | 28 1346 3721 5565 7019 9240 12355 13109 14800 16040 16839 17369 17631 19357 19473 19891 20381 23911 29683 |
| 4 | 869 2450 4386 5316 6160 7107 10362 11132 11271 13149 16397 16532 17113 19894 22043 22784 27383 28615 28804 |
| 5 | 508 4292 5831 8559 10044 10412 11283 14810 15888 17243 17538 19903 20528 22090 22652 27235 27384 28208 28485 |
| 6 | 389 2248 5840 6043 7000 9054 11075 11760 12217 12565 13587 15403 19422 19528 21493 25142 27777 28566 28702 |
| 7 | 1015 2002 5764 6777 9346 9629 11039 11153 12690 13068 13990 16841 17702 20021 24106 26300 29332 30081 30196 |
| 8 | 1480 3084 3467 4401 4798 5187 7851 11368 12323 14325 14546 16360 17158 18010 21333 25612 26556 26906 27005 |
| 9 | 6925 8876 12392 14529 15253 15437 19226 19950 20321 23021 23651 24393 24653 26668 27205 28269 28529 29041 29292 |
| 10 | 2547 3404 3538 4666 5126 5468 7695 8799 14732 15072 15881 17410 18971 19609 19717 22150 24941 27908 29018 |
| 11 | 888 1581 2311 5511 7218 9107 10454 12252 13662 15714 15894 17025 18671 24304 25316 25556 28489 28977 29212 |

TABLE 21-continued

| i | Index of row where 1 is located in the 0th column of the ith column group |
|---|---|
| 12 | 1047 1494 1718 4645 5030 6811 7868 8146 10611 15767 17682 18391 22614 23021 23763 25478 26491 29088 29757 |
| 13 | 59 1781 1900 3814 4121 8044 8906 9175 11156 14841 15789 16033 16755 17292 18550 19310 22505 29567 29850 |
| 14 | 1952 3057 4399 9476 10171 10769 11335 11569 15002 19501 20621 22642 23452 24360 25109 25290 25828 28505 29122 |
| 15 | 2895 3070 3437 4764 4905 6670 9244 11845 13352 13573 13975 14600 15871 17996 19672 20079 20579 25327 27958 |
| 16 | 612 1528 2004 4244 4599 4926 5843 7684 10122 10443 12267 14368 18413 19058 22985 24257 26202 26596 27899 |
| 17 | 1361 2195 4146 6708 7158 7538 9138 9998 14862 15359 16076 18925 21401 21573 22503 24146 24247 27778 29312 |
| 18 | 5229 6235 7134 7655 9139 13527 15408 16058 16705 18320 19909 20901 22238 22437 23654 25131 27550 28247 29903 |
| 19 | 697 2035 4887 5275 6909 9166 11805 15338 16381 18403 20425 20688 21547 24590 25171 26726 28848 29224 29412 |
| 20 | 5379 17329 22659 23062 |
| 21 | 11814 14759 22329 22936 |
| 22 | 2423 2811 10296 12727 |
| 23 | 8460 15260 16769 17290 |
| 24 | 14191 14608 29536 30187 |
| 25 | 7103 10069 20111 22850 |
| 26 | 4285 15413 26448 29069 |
| 27 | 548 2137 9189 10928 |
| 28 | 4581 7077 23382 23949 |
| 29 | 3942 17248 19486 27922 |
| 30 | 8668 10230 16922 26678 |
| 31 | 6158 9980 13788 28198 |
| 32 | 12422 16076 24206 29887 |
| 33 | 8778 10649 18747 22111 |
| 34 | 21029 22677 27150 28980 |
| 35 | 7918 15423 27672 27803 |
| 36 | 5927 18086 23525 |
| 37 | 3397 15058 30224 |
| 38 | 24016 25880 26268 |
| 39 | 1096 4775 7912 |
| 40 | 3259 17301 20802 |
| 41 | 129 8396 15132 |
| 42 | 17825 28119 28676 |
| 43 | 2343 8382 28840 |
| 44 | 3907 18374 20939 |
| 45 | 1132 1290 8786 |
| 46 | 1481 4710 28846 |
| 47 | 2185 3705 26834 |
| 48 | 5496 15681 21854 |
| 49 | 12697 13407 22178 |
| 50 | 12788 21227 22894 |
| 51 | 629 2854 6232 |
| 52 | 2289 18227 27458 |
| 53 | 7593 21935 23001 |
| 54 | 3836 7081 12282 |
| 55 | 7925 18440 23135 |
| 56 | 497 6342 9717 |
| 57 | 11199 22046 30067 |
| 58 | 12572 28045 28990 |
| 59 | 1240 2023 10933 |
| 60 | 19566 20629 25186 |
| 61 | 6442 13303 28813 |
| 62 | 4765 10572 16180 |
| 63 | 552 19301 24286 |
| 64 | 6782 18480 21383 |
| 65 | 11267 12288 15758 |
| 66 | 771 5652 15531 |
| 67 | 16131 20047 25649 |
| 68 | 13227 23035 24450 |
| 69 | 4839 13467 27488 |
| 70 | 2852 4677 22993 |
| 71 | 2504 28116 29524 |
| 72 | 12518 17374 24267 |
| 73 | 1222 11859 27922 |
| 74 | 9660 17286 18261 |
| 75 | 232 11296 29978 |
| 76 | 9750 11165 16295 |
| 77 | 4894 9505 23622 |
| 78 | 10861 11980 14110 |
| 79 | 2128 15883 22836 |
| 80 | 6274 17243 21989 |
| 81 | 10866 13202 22517 |
| 82 | 11159 16111 21608 |
| 83 | 3719 18787 22100 |
| 84 | 1756 2020 23901 |
| 85 | 20913 29473 30103 |
| 86 | 2729 15091 26976 |
| 87 | 4410 8217 12963 |
| 88 | 5395 24564 28235 |
| 89 | 3859 17909 23051 |
| 90 | 5733 26005 29797 |
| 91 | 1935 3492 29773 |
| 92 | 11903 21380 29914 |
| 93 | 6091 10469 29997 |
| 94 | 2895 8930 15594 |
| 95 | 1827 10028 20070 |

In another example, when the length $N_{ldpc}$ of the LDPC codeword is 64800, the code rate R is 9/15, and M is 360, the indexes of the rows where 1 is located in the 0th column of the $i^{th}$ column group of the information word submatrix 210 are as shown in Table 22 presented below:

TABLE 22

| i | Index of row where 1 is located in the 0th column of the ith column group |
|---|---|
| 0 | 113 1557 3316 5680 6241 10407 13404 13947 14040 14353 15522 15698 16079 17363 19374 19543 20530 22833 24339 |
| 1 | 271 1361 6236 7006 7307 7333 12768 15441 15568 17923 18341 20321 21502 22023 23938 25351 25590 25876 25910 |
| 2 | 73 605 872 4008 6279 7653 10346 10799 12482 12935 13604 15909 16526 19782 20506 22804 23629 24859 25600 |
| 3 | 1445 1690 4304 4851 8919 9176 9252 13783 16076 16675 17274 18806 18882 20819 21958 22451 23869 23999 24177 |
| 4 | 1290 2337 5661 6371 8996 10102 10941 11360 12242 14918 16808 20571 23374 24046 25045 25060 25662 25783 25913 |
| 5 | 28 42 1926 3421 3503 8558 9453 10168 15820 17473 19571 19685 22790 23336 23367 23890 24061 25657 25680 |
| 6 | 0 1709 4041 4932 5968 7123 8430 9564 10596 11026 14761 19484 20762 20858 23803 24016 24795 25853 25863 |
| 7 | 29 1625 6500 6609 16831 18517 18568 18738 19387 20159 20544 21603 21941 24137 24269 24416 24803 25154 25395 |
| 8 | 55 66 871 3700 11426 13221 15001 16367 17601 18380 22796 23488 23938 25476 25635 25678 25807 25857 25872 |
| 9 | 1 19 5958 8548 8860 11489 16845 18450 18469 19496 20190 23173 25262 25566 25668 25679 25858 25888 25915 |
| 10 | 7520 7690 8855 9183 14654 16695 17121 17854 18083 18428 19633 20470 20736 21720 22335 23273 25083 25293 25403 |
| 11 | 48 58 410 1299 3786 10668 18523 18963 20864 22106 22308 23033 23107 23128 23990 24286 24409 24595 25802 |
| 12 | 12 51 3894 6539 8276 10885 11644 12777 13427 14039 15954 17078 19053 20537 22863 24521 25087 25463 25838 |
| 13 | 3509 8748 9581 11509 15884 16230 17583 19264 20900 21001 21310 22547 22756 22959 24768 24814 25594 25626 25880 |
| 14 | 21 29 69 1448 2386 4601 6626 6667 10242 13141 13852 14137 18640 19951 22449 23454 24431 25512 25814 |
| 15 | 18 53 7890 9934 10063 16728 19040 19809 20825 21522 21800 23582 24556 25031 25547 25562 25733 25789 25906 |
| 16 | 4096 4582 5766 5894 6517 10027 12182 13247 15207 17041 18958 20133 20503 22228 24332 24613 25689 25855 25883 |
| 17 | 0 25 819 5539 7076 7536 7695 9532 13668 15051 17683 19665 20253 21996 24136 24890 25758 25784 25807 |
| 18 | 34 40 44 4215 6076 7427 7965 8777 11017 15593 19542 22202 22973 23397 23423 24418 24873 25107 25644 |
| 19 | 1595 6216 22850 25439 |
| 20 | 1562 15172 19517 22362 |
| 21 | 7508 12879 24324 24496 |
| 22 | 6298 15819 16757 18721 |
| 23 | 11173 15175 19966 21195 |
| 24 | 59 13505 16941 23793 |
| 25 | 2267 4830 12023 20587 |

TABLE 22-continued

Index of row where 1 is located in the 0th column of the ith column group

| i | |
|---|---|
| 26 | 8827 9278 13072 16664 |
| 27 | 14419 17463 23398 25348 |
| 28 | 6112 16534 20423 22698 |
| 29 | 493 8914 21103 24799 |
| 30 | 6896 12761 13206 25873 |
| 31 | 2 1380 12322 21701 |
| 32 | 11600 21306 25753 25790 |
| 33 | 8421 13076 14271 15401 |
| 34 | 9630 14112 19017 20955 |
| 35 | 212 13932 21781 25824 |
| 36 | 5961 9110 16654 19636 |
| 37 | 58 5434 9936 12770 |
| 38 | 6575 11433 19798 |
| 39 | 2731 7338 20926 |
| 40 | 14253 18463 25404 |
| 41 | 21791 24805 25869 |
| 42 | 2 11646 15850 |
| 43 | 6075 8586 23819 |
| 44 | 18435 22093 24852 |
| 45 | 2103 2368 11704 |
| 46 | 10925 17402 18232 |
| 47 | 9062 25061 25674 |
| 48 | 18497 20853 23404 |
| 49 | 18606 19364 19551 |
| 50 | 7 1022 25543 |
| 51 | 6744 15481 25868 |
| 52 | 9081 17305 25164 |
| 53 | 8 23701 25883 |
| 54 | 9680 19955 22848 |
| 55 | 56 4564 19121 |
| 56 | 5595 15086 25892 |
| 57 | 3174 17127 23183 |
| 58 | 19397 19817 20275 |
| 59 | 12561 24571 25825 |
| 60 | 7111 9889 25865 |
| 61 | 19104 20189 21851 |
| 62 | 549 9686 25548 |
| 63 | 6586 20325 25906 |
| 64 | 3224 20710 21637 |
| 65 | 641 15215 25754 |
| 66 | 13484 23729 25818 |
| 67 | 2043 7493 24246 |
| 68 | 16860 25230 25768 |
| 69 | 22047 24200 24902 |
| 70 | 9391 18040 19499 |
| 71 | 7855 24336 25069 |
| 72 | 23834 25570 25852 |
| 73 | 1977 8800 25756 |
| 74 | 6671 21772 25859 |
| 75 | 3279 6710 24444 |
| 76 | 24099 25117 25820 |
| 77 | 5553 12306 25915 |
| 78 | 48 11107 23907 |
| 79 | 10832 11974 25773 |
| 80 | 2223 17905 25484 |
| 81 | 16782 17135 20446 |
| 82 | 475 2861 3457 |
| 83 | 16218 22449 24362 |
| 84 | 11716 22200 25897 |
| 85 | 8315 15009 22633 |
| 86 | 13 20480 25852 |
| 87 | 12352 18658 25687 |
| 88 | 3681 14794 23703 |
| 89 | 30 24531 25846 |
| 90 | 4103 22077 24107 |
| 91 | 23837 25622 25812 |
| 92 | 3627 13387 25839 |
| 93 | 908 5367 19388 |
| 94 | 0 6894 25795 |
| 95 | 20322 23546 25181 |
| 96 | 8178 25260 25437 |
| 97 | 2449 13244 22565 |
| 98 | 31 18928 22741 |
| 99 | 1312 5134 14838 |
| 100 | 6085 13937 24220 |
| 101 | 66 14633 25670 |
| 102 | 47 22512 25472 |
| 103 | 8867 24704 25279 |
| 104 | 6742 21623 22745 |
| 105 | 147 9948 24178 |
| 106 | 8522 24261 24307 |
| 107 | 19202 22406 24609 |

According to an exemplary embodiment, even when the order of numbers, i.e., indexes, in a sequence corresponding to the $i^{th}$ column group of the parity check matrix 200 as shown in the above-described Tables 4 to 22 is changed, the changed parity check matrix is a parity check matrix used for the same LDPC code. Therefore, a case in which the order of numbers in the sequence corresponding to the $i^{th}$ column group in Tables 4 to 22 is changed is covered by the inventive concept.

According to an exemplary embodiment, even when one sequence corresponding to one column group is changed and another sequence corresponding to another column group are changed to each other in Tables 4 to 22, cycle characteristics on a graph of the LDPC code and algebraic characteristics such as degree distribution are not changed. Therefore, a case in which the arrangement order of the sequences shown in Tables 4 to 22 is changed is also covered by the inventive concept.

In addition, even when a multiple of $Q_{ldpc}$ is equally added to all numbers, i.e., indexes, corresponding to a certain column group in Tables 4 to 22, the cycle characteristics on the graph of the LDPC code or the algebraic characteristics such as degree distribution are not changed. Therefore, a result of equally adding a multiple of $Q_{ldpc}$ to the sequences shown in Tables 4 to 22 is also covered by the inventive concept. However, it should be noted that, when the resulting value obtained by adding a multiple of $Q_{ldpc}$ to a given sequence is greater than or equal to $(N_{ldpc}-K_{ldpc})$, a value obtained by applying a modulo operation for $(N_{ldpc}-K_{ldpc})$ to the resulting value should be applied instead.

Once positions of the rows where 1 exists in the $0^{th}$ column of the $i^{th}$ column group of the information word submatrix 210 are defined as shown in Tables 4 to 22, positions of rows where 1 exists in another column of each column group may be defined since the positions of the rows where 1 exists in the $0^{th}$ column are cyclic-shifted by $Q_{ldpc}$ in the next column.

For example, in the case of Table 4, in the $0^{th}$ column of the $0^{th}$ column group of the information word submatrix 210, 1 exists in the $245^{th}$ row, $449^{th}$ row, $491^{st}$ row, . . . .

In this case, since $Q_{ldpc}=(N_{ldpc}-K_{ldpc})/M=(16200-5400)/360=30$, the indexes of the rows where 1 is located in the $1^{st}$ column of the $0^{th}$ column group may be 275(=245+30), 479(=449+30), 521(=491+30), . . . , and the indexes of the rows where 1 is located in the $2^{nd}$ column of the $0^{th}$ column group may be 305(=275+30), 509(=479+30), 551(=521+30).

In the above-described method, the indexes of the rows where 1 is located in all rows of each column group may be defined.

The parity submatrix 220 of the parity check matrix 200 shown in FIG. 2 may be defined as follows:

The parity submatrix 220 includes $N_{ldpc}-K_{ldpc}$ number of columns (that is, $K_{ldpc}^{th}$ column to $(N_{ldpc}-1)^{th}$ column), and has a dual diagonal or staircase configuration. Accordingly, the degree of columns except the last column (that is, ($N_{ldpc}-1$)$^{th}$ column) from among the columns included in the parity submatrix 220 is 2, and the degree of the last column is 1.

As a result, the information word submatrix 210 of the parity check matrix 200 may be defined by Tables 4 to 22, and the parity submatrix 220 may have a dual diagonal configuration.

Figure 3:
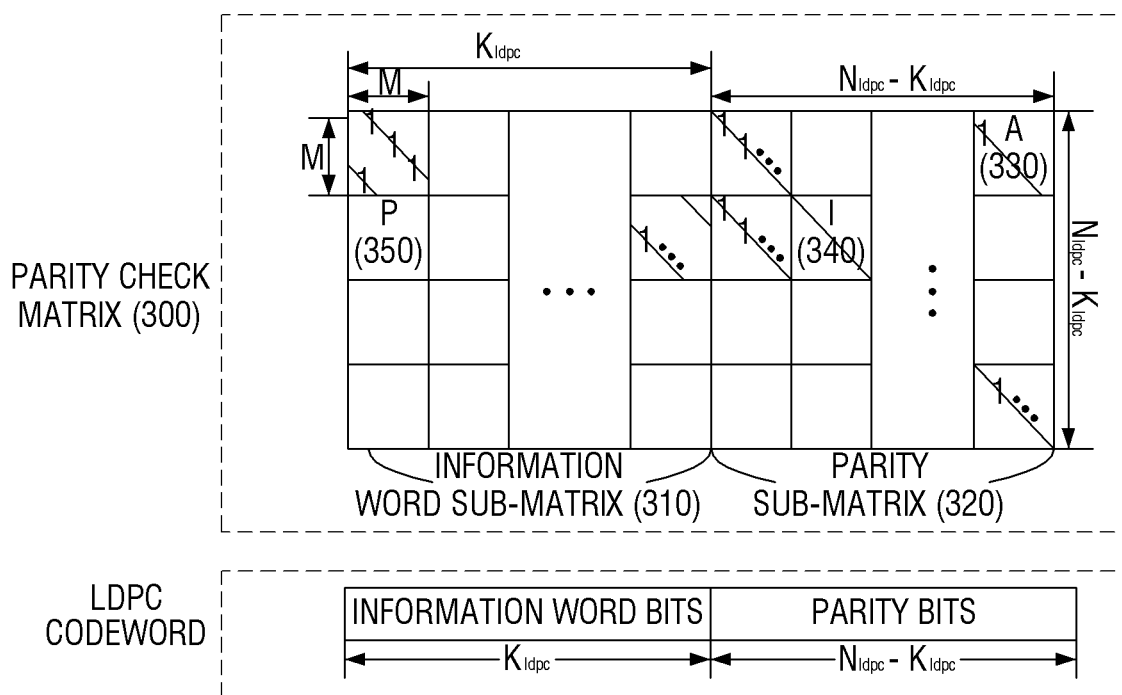

When the columns and rows of the parity check matrix 200 shown in FIG. 2 are permutated based on Equation 4 and Equation 5, the parity check matrix shown in FIG. 2 may be changed to a parity check matrix 300 shown in FIG. 3.

$$Q_{ldpc} \cdot i + j \Rightarrow M \cdot j + i \ (0 \leq i < M, 0 \leq j < Q_{ldpc}) \quad (4)$$

$$K_{ldpc} + Q_{ldpc} \cdot k + l \Rightarrow K_{ldpc} M \cdot l + k \ (0 \leq k < M, 0 \leq l < Q_{ldpc}) \quad (5)$$

The method for permutating based on Equation 4 and Equation 5 will be explained below. Since row permutation and column permutation apply the same principle, the row permutation will be explained by the way of an example.

In the case of the row permutation, regarding the $X^{th}$ row, i and j satisfying $X=Q_{ldpc} \times i + j$ are calculated and the $X^{th}$ row is permutated by assigning the calculated i and j to $M \times j + i$. For example, regarding the $7^{th}$ row, i and j satisfying $7 = 2 \times i + j$ are 3 and 1, respectively. Therefore, the $7^{th}$ row is permutated to the $13^{th}$ row ($10 \times 1 + 3 = 13$).

When the row permutation and the column permutation are performed in the above-described method, the parity check matrix of FIG. 2 may be converted into the parity check matrix of FIG. 3.

Referring to FIG. 3, the parity check matrix 300 is divided into a plurality of partial blocks, and a quasi-cyclic matrix of $M \times M$ corresponds to each partial block.

Accordingly, the parity check matrix 300 having the configuration of FIG. 3 is formed of matrix units of $M \times M$. That is, the submatrices of $M \times M$ are arranged in the plurality of partial blocks, constituting the parity check matrix 300.

Since the parity check matrix 300 is formed of the quasi-cyclic matrices of $M \times M$, M number of columns may be referred to as a column block and M number of rows may be referred to as a row block. Accordingly, the parity check matrix 300 having the configuration of FIG. 3 is formed of $N_{qc\_column} = N_{ldpc}/M$ number of column blocks and $N_{qc\_row} = N_{parity}/M$ number of row blocks.

Hereinafter, the submatrix of $M \times M$ will be explained.

First, the ($N_{qc\_column}-1$)$^{th}$ column block of the $0^{th}$ row block has a form shown in Equation 6 presented below:

$$A = \begin{bmatrix} 0 & 0 & \ldots & 0 & 0 \\ 1 & 0 & \ldots & 0 & 0 \\ 0 & 1 & \ldots & 0 & 0 \\ \vdots & \vdots & \vdots & \vdots & \vdots \\ 0 & 0 & \ldots & 1 & 0 \end{bmatrix} \quad (6)$$

As described above, A 330 is an $M \times M$ matrix, values of the $0^{th}$ row and the $(M-1)^{th}$ column are all "0", and, regarding $0 \leq i \leq (M-2)$, the $(i+1)^{th}$ row of the $i^{th}$ column is "1" and the other values are "0".

Second, regarding $0 < i < (N_{ldpc}-K_{ldpc})/M-1$ in the parity submatrix 320, the $i^{th}$ row block of the $(K_{ldpc}/M+i)^{th}$ column block is configured by a unit matrix $I_{M \times M}$ 340. In addition, regarding $0 \leq i \leq (N_{ldpc}-K_{ldpc})/M-2$, the $(i+1)^{th}$ row block of the $(K_{ldpc}/M+i)$ column block is configured by a unit matrix $I_{M \times M}$ 340.

Third, a block 350 constituting the information word submatrix 310 may have a cyclic-shifted format of a cyclic matrix P, $P^{a_{ij}}$, or an added format of the cyclic-shifted matrix $P^{a_{ij}}$ of the cyclic matrix P (or an overlapping format).

For example, a format in which the cyclic matrix P is cyclic-shifted to the right by 1 may be expressed by Equation 7 presented below:

$$P = \begin{bmatrix} 0 & 1 & 0 & & 0 \\ 0 & 0 & 1 & \ldots & 0 \\ \vdots & \vdots & \vdots & & \vdots \\ 0 & 0 & 0 & \ldots & 1 \\ 1 & 0 & 0 & & 0 \end{bmatrix} \quad (7)$$

The cyclic matrix P is a square matrix having an $M \times M$ size and is a matrix in which a weight of each of M number of rows is 1 and a weight of each of M number of columns is 1. When $a_{ij}$ is 0, the cyclic matrix P, that is, $P^0$ indicates a unit matrix $I_{M \times M}$, and when $a_{ij}$ is $\infty$, $P^\infty$ is a zero matrix.

A submatrix existing where the $i^{th}$ row block and the $j^{th}$ column block intersect in the parity check matrix 300 of FIG. 3 may be $P^{a_{ij}}$. Accordingly, i and j indicate the number of row blocks and the number of column blocks in the partial blocks corresponding to the information word. Accordingly, in the parity check matrix 300, the total number of columns is $N_{ldpc} = M \times N_{qc\_column}$, and the total number of rows is $N_{parity} = M \times N_{qc\_row}$. That is, the parity check matrix 300 is formed of $N_{qc\_column}$ number of column blocks and $N_{qc\_row}$ number of row blocks.

Referring back to FIG. 1, the encoder 110 may perform the LDPC encoding by using various code rates such as 5/15, 6/15, 7/15, 8/15, 9/15, 10/15, 11/15, 12/15, 13/15, etc. In addition, the encoder 110 may generate an LDPC codeword having various lengths such as 16200, 64800, etc., based on the length of the information word bits and the code rate.

In this case, the encoder 110 may perform the LDPC encoding by using the parity check matrix, and the parity check matrix is configured as shown in FIGS. 2 and 3.

In addition, the encoder 110 may perform Bose, Chaudhuri, Hocquenghem (BCH) encoding as well as LDPC encoding. To achieve this, the encoder 110 may further include a BCH encoder (not shown) to perform BCH encoding.

In this case, the encoder 110 may perform encoding in an order of BCH encoding and LDPC encoding. Specifically, the encoder 110 may add BCH parity bits to input bits by performing BCH encoding and LDPC-encodes the bits to which the BCH parity bits are added into information word bits, thereby generating the LDPC codeword.

The interleaver 120 interleaves the LDPC codeword. That is, the interleaver 120 receives the LDPC codeword from the encoder 110, and interleaves the LDPC codeword based on various interleaving rules.

In particular, the interleaver 120 may interleave the LDPC codeword such that a bit included in a predetermined group from among a plurality of groups constituting the LDPC codeword (that is, a plurality of bit groups or a plurality of blocks) is mapped onto a predetermined bit of a modulation symbol. Accordingly, the modulator 130 may map a bit included in a predetermined group from among the plurality of groups of the LDPC codeword onto a predetermined bit of the modulation symbol.

Hereinafter, interleaving rules used in the interleaver 120 will be explained in detail according to cases.

Case in which a Block Interleaver is Used

According to an exemplary embodiment, the interleaver 120 may interleave the LDPC codeword in a method described below such that a bit included in a predetermined group from among a plurality of groups constituting the interleaved LDPC codeword is mapped onto a predetermined bit in a modulation symbol. A detailed description thereof is provided with reference to FIG. 4.

Figure 4:
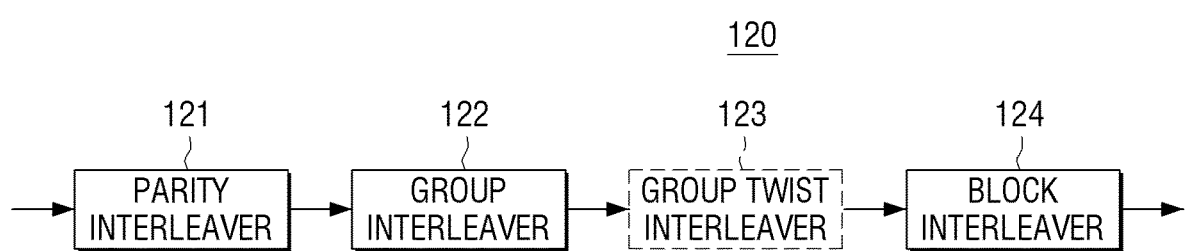
FIG. 4 is a block diagram to illustrate a configuration of an interleaver according to an exemplary embodiment.

FIG. 4 is a block diagram to illustrate a configuration of an interleaver according to exemplary embodiment. Referring to FIG. 4, the interleaver 120 includes a parity interleaver 121, a group interleaver (or a group-wise interleaver 122), a group twist interleaver 123 and a block interleaver 124.

The parity interleaver 121 interleaves parity bits constituting the LDPC codeword.

Specifically, when the LDPC codeword is generated based on the parity check matrix 200 having the configuration of FIG. 2, the parity interleaver 121 may interleave only the parity bits of the LDPC codeword by using Equations 8 presented below:

$$u_i = c_i \text{ for } 0 \leq i < K_{ldpc}, \text{ and}$$

$$u_{K_{ldpc}+M \cdot t+s} = c_{K_{ldpc}+Q_{ldpc} \cdot s+t} \text{ for } 0 \leq s < M, 0 \leq t < Q_{ldpc} \quad (8),$$

where M is an interval at which a pattern of a column group, which includes a plurality of columns, is repeated in the information word submatrix 210, that is, the number of columns included in a column group (for example, M=360), and $Q_{ldpc}$ is a size by which each column is cyclic-shifted in the information word submatrix 210. That is, the parity interleaver 121 performs parity interleaving with respect to the LDPC codeword $c = (c_0, c_1, \ldots, C_{N_{ldpc}-1})$, and outputs $U = (u_0, u_1, \ldots, u_{N_{ldpc}-1})$.

When the LDPC codeword encoded based on the parity check matrix 200 of FIG. 2 is parity-interleaved based on Equations 8, the parity-interleaved LDPC codeword is the same as the LDPC codeword encoded by the parity check matrix 300 of FIG. 3. Accordingly, when the LDPC codeword is generated based on the parity check matrix 300 of FIG. 3, the parity interleaver 121 may be omitted.

The LDPC codeword parity-interleaved after having been encoded based on the parity check matrix 200 of FIG. 2, or the LDPC codeword encoded based on the parity check matrix having the format of FIG. 3 may be characterized in that a predetermined number of continuous bits of the LDPC codeword have similar decoding characteristics (cycle distribution, a degree of a column, etc.).

For example, the LDPC codeword may have the same characteristics on the basis of M number of continuous bits. Herein, M is an interval at which a pattern of a column group is repeated in the information word submatrix and, for example, may be 360.

Specifically, a product of the LDPC codeword bits and the parity check matrix should be "0". This means that a sum of products of the $i^{th}$ LDPC codeword bit, $c_i$ (i=0, 1, . . . , $N_{ldpc}$-1) and the $i^{th}$ column of the parity check matrix should be a "0" vector. Accordingly, the $i^{th}$ LDPC codeword bit may be regarded as corresponding to the $i^{th}$ column of the parity check matrix.

In the case of the parity check matrix of FIG. 2, M number of columns in the information word submatrix 210 belong to the same group and the information word submatrix 210 has the same characteristics on the basis of a column group (for example, the columns belonging to the same column group have the same degree distribution and the same cycle characteristic).

In this case, since M number of continuous bits in the information word bits correspond to the same column group of the information word submatrix 210, the information word bits may be formed of M number of continuous bits having the same codeword characteristics. When the parity bits of the LDPC codeword are interleaved by the parity interleaver 121, the parity bits of the LDPC codeword may be formed of M number of continuous bits having the same codeword characteristics.

In addition, in the case of the parity check matrix 300 of FIG. 3, since the information word submatrix 310 and the parity submatrix 320 of the parity check matrix 300 have the same characteristics on the basis of a column group including M number of columns due to the row and column permutation, the information word bits and the parity bits of the LDPC codeword encoded based on the parity check matrix 300 are formed of M number of continuous bits of the same codeword characteristics.

Herein, the row permutation does not influence the cycle characteristic or algebraic characteristic of the LDPC codeword such as a degree distribution, a minimum distance, etc. since the row permutation is just to rearrange the order of rows in the parity check matrix. In addition, since the column permutation is performed for the parity submatrix 320 to correspond to parity interleaving performed in the parity interleaver 121, the parity bits of the LDPC codeword encoded by the parity check matrix 300 of FIG. 3 are formed of M number of continuous bits like the parity bits of the LDPC codeword encoded by the parity check matrix 200 of FIG. 2.

Accordingly, the bits constituting an LDPC codeword may have the same characteristics on the basis of M number of continuous bits, according to the present exemplary embodiment.

The group interleaver 122 may divide the LDPC codeword into a plurality of groups and rearrange the order of the plurality of groups or may divide the parity-interleaved LDPC codeword into a plurality of groups and rearrange the order of the plurality of groups. That is, the group interleaver 122 interleaves the plurality of groups in group units.

To achieve this, the group interleaver 122 divides the parity-interleaved LDPC codeword into a plurality of groups by using Equation 9 or Equation 10 presented below.

$$X_j = \left\{ u_k \mid j = \left\lfloor \frac{k}{360} \right\rfloor, 0 \leq k < N_{ldpc} \right\} \text{for } 0 \leq j < N_{group} \quad (9)$$

$$X_j = \quad (10)$$
$$\{ u_k \mid 360 \times j \leq k < 360 \times (j+1), 0 \leq k < N_{ldpc} \} \text{for } 0 \leq j < N_{group}$$

where $N_{group}$ is the total number of groups, $X_j$ is the $j^{th}$ group, and $u_k$ is the $k^{th}$ LDPC codeword bit input to the group interleaver 122. In addition, $$\left\lfloor \frac{k}{360} \right\rfloor$$

is the largest integer below k/360.

Since 360 in these equations indicates an example of the interval M at which the pattern of a column group is repeated in the information word submatrix, 360 in these equations can be changed to M.

Figure 5:
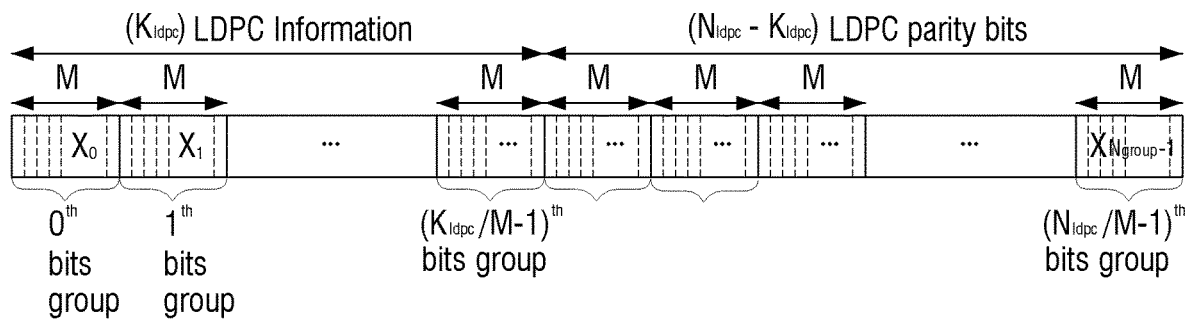
FIGS. 5 to 7 are views illustrating a method for processing an LDPC codeword on a group basis according to exemplary embodiments.

The LDPC codeword which is divided into the plurality of groups may be as shown in FIG. 5.

Referring to FIG. 5, the LDPC codeword is divided into the plurality of groups and each group is formed of M number of continuous bits. When M is 360, each of the plurality of groups may be formed of 360 bits. Accordingly, each group may be formed of bits corresponding to each column group of the parity check matrix.

Specifically, since the LDPC codeword is divided by M number of continuous bits, $K_{ldpc}$ number of information word bits are divided into ($K_{ldpc}$/M) number of groups and $N_{ldpc}-K_{ldpc}$ number of parity bits are divided into ($N_{ldpc}-K_{ldpc}$)/M number of groups. Accordingly, the LDPC codeword may be divided into ($N_{ldpc}$/M) number of groups in total.

For example, when M=360 and the length $N_{ldpc}$ of the LDPC codeword is 64800, the number of groups $N_{groups}$ is 180, and, when the length $N_{ldpc}$ of the LDPC codeword is 16200, the number of groups $N_{group}$ is 45.

As described above, the group interleaver 122 divides the LDPC codeword such that M number of continuous bits are included in a same group since the LDPC codeword has the same codeword characteristics on the basis of M number of continuous bits. Accordingly, when the LDPC codeword is grouped by M number of continuous bits, the bits having the same codeword characteristics belong to the same group.

In the above-described example, the number of bits constituting each group is M. However, this is merely an example and the number of bits constituting each group is variable.

For example, the number of bits constituting each group may be an aliquot part of M. That is, the number of bits constituting each group may be an aliquot part of the number of columns constituting a column group of the information word submatrix of the parity check matrix. In this case, each group may be formed of aliquot part of M number of bits. For example, when the number of columns constituting a column group of the information word submatrix is 360, that is, M=360, the group interleaver 122 may divide the LDPC codeword into a plurality of groups such that the number of bits constituting each group is one of the aliquot parts of 360.

Hereinafter, the case in which the number of bits constituting a group is M will be explained for convenience of explanation.

Thereafter, the group interleaver 122 interleaves the LDPC codeword in group units. That is, the group interleaver 122 changes positions of the plurality of groups constituting the LDPC codeword and rearranges the order of the plurality of groups constituting the LDPC codeword.

Herein, the group interleaver may rearrange an order of the plurality of groups in group units so that groups including bits mapped onto the same modulation symbol from among the plurality of groups are spaced a predetermined distance apart.

In this case, the group interleaver may rearrange the order of the plurality of groups in group units so that the groups including the bits mapped onto the same modulation symbol are spaced a predetermined distance apart, by considering the number of columns and rows constituting the block interleaver 124, the number of groups constituting the LDPC codeword, and the number of bits included in each group.

For doing this, the group interleaver 122 may rearrange the order of the plurality of groups by using Equation 11 presented below:

$$Y_j = X_{\pi(j)} \; (0 \le j < N_{group}) \tag{11}$$

where $X_j$ is the $j^{th}$ group before group interleaving, and $Y_j$ is the $j^{th}$ group after group interleaving. In addition, π(j) is a parameter indicating an interleaving order and is determined by at least one of a length of an LDPC codeword, a code rate and a modulation method.

Accordingly, $X_{\pi(j)}$ is a π(j)$^{th}$ group before group interleaving, and Equation 11 means that the pre-interleaving π(j)$^{th}$ group is interleaved into the $j^{th}$ group.

According to an exemplary embodiment, an example of π(j) may be defined as in Tables 23 to 27 presented below.

In this case, π(j) is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in group units based on π(j) satisfying the corresponding length of the LDPC codeword and code rate.

For example, when the encoder 110 performs LDPC encoding at a code rate of 10/15 to generate an LDPC codeword of a length of 16200, the group interleaver 122 may perform interleaving by using π(j) which is defined according to the length of the LDPC codeword of 16200 and the code rate of 10/15 in tables 23 to 27 presented below.

For example, when the length of the LDPC codeword is 16200, the code rate is 10/15, and the modulation method is 16-Quadrature Amplitude Modulation (QAM), the group interleaver 122 may perform interleaving by using π(j) defined as in table 23.

An example of π(j) is as follows:

For example, when the length $N_{ldpc}$ of the LDPC codeword is 16200, the code rate is 10/15, 11/15, 12/15 and 13/15, and the modulation method is 16-QAM, π(j) may be defined as in Table 23 presented below:

TABLE 23

| Code Rate | Order of bits group to be block interleaved π(j) (0 ≤ j < 45) | | | | | | | | | | | | | | | | | | | | | |
|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 |
| 10/15, 11/15, | 35 | 31 | 39 | 19 | 29 | 20 | 36 | 0 | 9 | 13 | 5 | 37 | 17 | 43 | 21 | 41 | 25 | 1 | 33 | 24 | 12 | 30 | 16 |
| 12/15, 13/15 | 32 | 10 | 28 | 4 | 26 | 8 | 40 | 42 | 3 | 6 | 2 | 38 | 14 | 34 | 22 | 18 | 27 | 23 | 7 | 11 | 15 | 44 |

In the case of Table 23, Equation 11 may be expressed as $Y_0 = X_{\pi(0)} = X_{35}$, $Y_1 = X_{\pi(1)} = X_{31}$, $Y_2 = X_{\pi(2)} = X_{39}$, ..., $Y_{43} = X_{\pi(43)} = X_{15}$, and $Y_{44} = X_{\pi(44)} = X_{44}$. Accordingly, the group interleaver 122 may rearrange the order of the plurality of groups by changing the 35$^{th}$ group to the 0$^{th}$ group, the 31$^{st}$ group to the 1$^{st}$ group, the 39$^{th}$ group to the 2$^{nd}$ group, ..., the 15$^{th}$ group to the 43$^{rd}$ group, and the 44$^{th}$ group to the 44$^{th}$ group.

In another example, when the length $N_{ldpc}$ of the LDPC codeword is 16200, the code rate is 6/15, 7/15, 8/15 and 9/15, and the modulation method is 16-QAM, π(j) may be defined as in Table 22 presented below:

TABLE 24

Order of bits group to be block interleaved
$\pi(j)$ $(0 \le j < 45)$

| Code Rate | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
|  | 23 | 24 | 25 | 26 | 27 | 28 | 29 | 30 | 31 | 32 | 33 | 34 | 35 | 36 | 37 | 38 | 39 | 40 | 41 | 42 | 43 | 44 |  |
| 6/15, 7/15, | 18 | 31 | 41 | 35 | 1 | 8 | 15 | 40 | 14 | 33 | 26 | 39 | 30 | 13 | 24 | 19 | 6 | 25 | 12 | 37 | 36 | 20 | 9 |
| 8/15, 9/15 | 2 | 5 | 28 | 23 | 3 | 29 | 32 | 22 | 27 | 0 | 10 | 17 | 4 | 38 | 16 | 21 | 7 | 11 | 34 | 42 | 43 | 44 |  |

In the case of Table 24, Equation 11 may be expressed as $Y_0=X_{\pi(0)}=X_{18}$, $Y_1=X_{\pi(1)}=X_{31}$, $Y_2=X_{\pi(2)}=X_{41}$, ..., $Y_{43}=X_{\pi(43)}=X_{43}$, and $Y_{44}=X_{\pi(44)}=X_{44}$. Accordingly, the group interleaver 122 may rearrange the order of the plurality of groups by changing the 18$^{th}$ group to the 0$^{th}$ group, the 31$^{st}$ group to the 1$^{st}$ group, the 41$^{st}$ group to the 2$^{nd}$ group, ..., the 43$^{rd}$ group to the 43$^{rd}$ group, and the 44$^{th}$ group to the 44$^{th}$ group.

In another example, when the length $N_{ldpc}$ of the LDPC codeword is 16200, the code rate is 10/15, 11/15, 12/15 and 13/15, and the modulation method is 256-QAM, $\pi(j)$ may be defined as in Table 25 presented below:

TABLE 25

Order of bits group to be block interleaved
$\pi(j)$ $(0 \le j < 45)$

| Code Rate | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
|  | 23 | 24 | 25 | 26 | 27 | 28 | 29 | 30 | 31 | 32 | 33 | 34 | 35 | 36 | 37 | 38 | 39 | 40 | 41 | 42 | 43 | 44 |  |
| 10/15, 11/15, | 4 | 13 | 31 | 37 | 32 | 28 | 1 | 10 | 3 | 21 | 18 | 17 | 11 | 16 | 35 | 2 | 29 | 25 | 19 | 33 | 36 | 8 | 5 |
| 12/15, 13/15 | 34 | 24 | 27 | 9 | 12 | 0 | 26 | 30 | 38 | 14 | 15 | 20 | 7 | 39 | 6 | 23 | 22 | 40 | 41 | 42 | 43 | 44 |  |

In the case of Table 25, Equation 11 may be expressed as $Y_0=X_{\pi(0)}=X_4$, $Y_1=X_{\pi(1)}=X_{13}$, $Y_2=X_{\pi(2)}=X_{31}$, ..., $Y_{43}=X_{\pi(43)}=X_{43}$, and $Y_{44}=X_{\pi(44)}=X_{44}$. Accordingly, the group interleaver 122 may rearrange the order of the plurality of groups by changing the 4$^{th}$ group to the 0$^{th}$ group, the 13$^{th}$ group to the 1$^{st}$ group, the 31$^{st}$ group to the 2$^{nd}$ group, ..., the 43$^{rd}$ group to the 43$^{rd}$ group, and the 44$^{th}$ group to the 44$^{th}$ group.

In another example, when the length $N_{ldpc}$ of the LDPC codeword is 16200, the code rate is 6/15, 7/15, 8/15 and 9/15, and the modulation method is 1024-QAM, $\pi(j)$ may be defined as in Table 26 presented below:

TABLE 26

Order of bits group to be block interleaved
$\pi(j)$ $(0 \le j < 45)$

| Code Rate | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
|  | 23 | 24 | 25 | 26 | 27 | 28 | 29 | 30 | 31 | 32 | 33 | 34 | 35 | 36 | 37 | 38 | 39 | 40 | 41 | 42 | 43 | 44 |  |
| 6/15, 7/15, | 10 | 2 | 28 | 33 | 6 | 24 | 25 | 31 | 14 | 15 | 22 | 17 | 20 | 1 | 30 | 21 | 0 | 11 | 13 | 32 | 23 | 34 | 12 |
| 8/15, 9/15 | 35 | 4 | 3 | 29 | 16 | 38 | 7 | 9 | 36 | 8 | 5 | 37 | 19 | 26 | 18 | 27 | 39 | 40 | 41 | 42 | 43 | 44 |  |

In the case of Table 26, Equation 11 may be expressed as $Y_0=X_{\pi(0)}=X_{10}$, $Y_1=X_{\pi(1)}=X_2$, $Y_2=X_{\pi(2)}=X_{28}$, ..., $Y_{43}=X_{\pi(43)}=X_{43}$, and $Y_{44}=X_{\pi(44)}=X_{44}$. Accordingly, the group interleaver 122 may rearrange the order of the plurality of groups by changing the 10$^{th}$ group to the 0$^{th}$ group, the 2$^{nd}$ group to the 1$^{st}$ group, the 28$^{th}$ group to the 2$^{nd}$ group, ..., the 43$^{rd}$ group to the 43$^{rd}$ group, and the 44$^{th}$ group to the 44$^{th}$ group.

In another example, when the length $N_{ldpc}$ of the LDPC codeword is 64800, the code rate is 6/15, 7/15, 8/15 and 9/15, and the modulation method is 256-QAM, $\pi(j)$ may be defined as in Table 27 presented below:

TABLE 27

Order of bits group to be block interleaved
$\pi(j)$ $(0 \le j < 180)$

| Code Rate | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
|  | 19 | 20 | 21 | 22 | 23 | 24 | 25 | 26 | 27 | 28 | 29 | 30 | 31 | 32 | 33 | 34 | 35 | 36 | 37 |
|  | 38 | 39 | 40 | 41 | 42 | 43 | 44 | 45 | 46 | 47 | 48 | 49 | 50 | 51 | 52 | 53 | 54 | 55 | 56 |
|  | 57 | 58 | 59 | 60 | 61 | 62 | 63 | 64 | 65 | 66 | 67 | 68 | 69 | 70 | 71 | 72 | 73 | 74 | 75 |
|  | 76 | 77 | 78 | 79 | 80 | 81 | 82 | 83 | 84 | 85 | 86 | 87 | 88 | 89 | 90 | 91 | 92 | 93 | 94 |
|  | 95 | 96 | 97 | 98 | 99 | 100 | 101 | 102 | 103 | 104 | 105 | 106 | 107 | 108 | 109 | 110 | 111 | 112 | 113 |

TABLE 27-continued

Order of bits group to be block interleaved
$\pi(j)$ ($0 \leq j < 180$)

|  | | | | | | | | | | | | | | | | | | | |
|---|---|---|---|---|---|---|---|---|---|---|---|---|---|---|---|---|---|---|---|
|  | 114 | 115 | 116 | 117 | 118 | 119 | 120 | 121 | 122 | 123 | 124 | 125 | 126 | 127 | 128 | 129 | 130 | 131 | 132 |
|  | 133 | 134 | 135 | 136 | 137 | 138 | 139 | 140 | 141 | 142 | 143 | 144 | 145 | 146 | 147 | 148 | 149 | 150 | 151 |
|  | 152 | 153 | 154 | 155 | 156 | 157 | 158 | 159 | 160 | 161 | 162 | 163 | 164 | 165 | 166 | 167 | 168 | 169 | 170 |
|  | 171 | 172 | 173 | 174 | 175 | 176 | 177 | 178 | 179 | | | | | | | | | | |
| 6/15, | 9 | 6 | 160 | 78 | 1 | 35 | 102 | 104 | 86 | 145 | 111 | 58 | 166 | 161 | 92 | 2 | 124 | 74 | 117 |
| 7/15, | 19 | 168 | 73 | 122 | 32 | 139 | 42 | 40 | 105 | 100 | 144 | 115 | 154 | 136 | 97 | 155 | 24 | 41 | 138 |
| 8/15, | 128 | 89 | 50 | 80 | 49 | 26 | 64 | 75 | 169 | 146 | 0 | 33 | 98 | 72 | 59 | 120 | 173 | 96 | 43 |
| 9/15 | 129 | 48 | 10 | 147 | 8 | 25 | 56 | 83 | 16 | 67 | 114 | 112 | 90 | 152 | 11 | 174 | 29 | 110 | 143 |
|  | 5 | 38 | 85 | 70 | 47 | 133 | 94 | 53 | 99 | 162 | 27 | 170 | 163 | 57 | 131 | 34 | 107 | 66 | 171 |
|  | 130 | 65 | 3 | 17 | 37 | 121 | 18 | 113 | 51 | 153 | 101 | 81 | 123 | 4 | 21 | 46 | 55 | 20 | 88 |
|  | 15 | 108 | 165 | 158 | 87 | 137 | 12 | 127 | 68 | 69 | 82 | 159 | 76 | 54 | 157 | 119 | 140 | 93 | 106 |
|  | 62 | 95 | 164 | 141 | 150 | 23 | 172 | 91 | 71 | 61 | 126 | 60 | 103 | 149 | 84 | 118 | 39 | 77 | 116 |
|  | 22 | 28 | 63 | 45 | 44 | 151 | 134 | 52 | 175 | 142 | 148 | 167 | 109 | 31 | 156 | 14 | 79 | 36 | 125 |
|  | 135 | 132 | 30 | 7 | 13 | 179 | 178 | 177 | 176 | | | | | | | | | | |

In the case of Table 27, Equation 11 may be expressed as $Y_0 = X_{\pi(0)} = X_9$, $Y_1 = X_{\pi(1)} = X_6$, $Y_2 = X_{\pi(2)} = X_{160}$, ..., $Y_{178} = X_{\pi(178)} = X_{177}$, and $Y_{179} = X_{\pi(179)} = X_{176}$. Accordingly, the group interleaver 122 may rearrange the order of the plurality of groups by changing the 9$^{th}$ group to the 0$^{th}$ group, the 6$^{th}$ group to the 1$^{st}$ group, the 160$^{th}$ group to the 2$^{nd}$ group, ..., the 177$^{th}$ group to the 178$^{th}$ group, and the 176$^{th}$ group to the 179$^{th}$ group.

As described above, the group interleaver 122 may rearrange the order of the plurality of groups by using Equation 11 and Tables 23 to 27.

On the other hand, since the order of the groups constituting the LDPC codeword is rearranged by the group interleaver 122, and then the groups are block-interleaved by the block interleaver 124, which will be described below, "Order of bits groups to be block interleaved" is set forth in Tables 23 to 27 in relation to $\pi(j)$.

Figure 6:
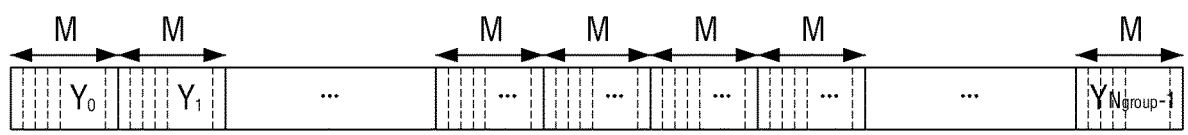

The LDPC codeword which is group-interleaved in the above-described method is illustrated in FIG. 6. Comparing the LDPC codeword of FIG. 6 and the LDPC codeword of FIG. 5 before group interleaving, it can be seen that the order of the plurality of groups constituting the LDPC codeword is rearranged.

That is, as shown in FIGS. 5 and 6, the groups of the LDPC codeword are arranged in order of group $X_0$, group $X_1$, ..., group $X_{N_{group}-1}$ before being group-interleaved, and are arranged in an order of group $Y_0$, group $Y_1$, ..., group $Y_{N_{group}-1}$ after being group-interleaved. In this case, the order of arranging the groups by the group interleaving may be determined based on Tables 23 to 27.

The group twist interleaver 123 interleaves bits in a same group. That is, the group twist interleaver 123 may rearrange the order of the bits in the same group by changing the order of the bits in the same group.

In this case, the group twist interleaver 123 may rearrange the order of the bits in the same group by cyclic-shifting a predetermined number of bits from among the bits in the same group.

Figure 7:
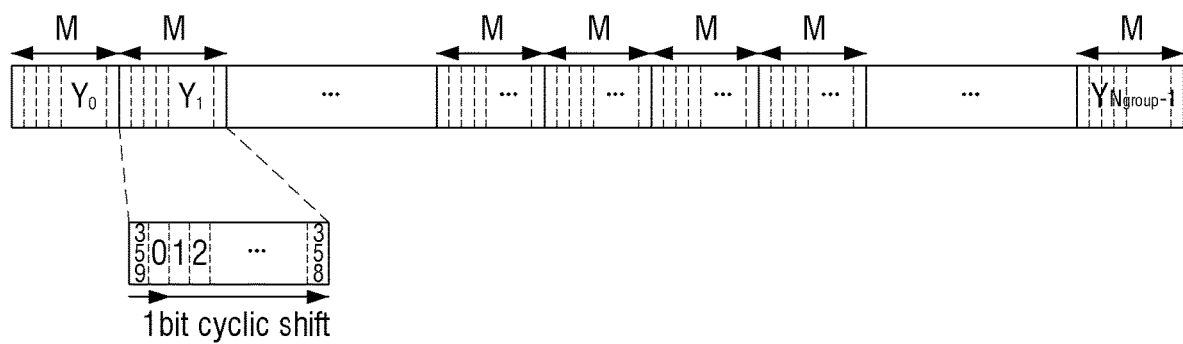

For example, as shown in FIG. 7, the group twist interleaver 123 may cyclic-shift bits included in the group $Y_1$ to the right by 1 bit. In this case, the bits located in the 0$^{th}$ position, the 1$^{st}$ position, the 2$^{nd}$ position, ..., the 358$^{th}$ position, and the 359$^{th}$ position in the group $Y_1$ as shown in FIG. 7 are cyclic-shifted to the right by 1 bit. As a result, the bit located in the 359$^{th}$ position before being cyclic-shifted is located in the front of the group $Y_1$ and the bits located in the 0$^{th}$ position, the 1$^{st}$ position, the 2$^{nd}$ position, ..., the 358$^{th}$ position before being cyclic-shifted are shifted to the right serially by 1 bit and located.

In addition, the group twist interleaver 123 may rearrange the order of bits in each group by cyclic-shifting a different number of bits in each group.

For example, the group twist interleaver 123 may cyclic-shift the bits included in the group $Y_1$ to the right by 1 bit, and may cyclic-shift the bits included in the group $Y_2$ to the right by 3 bits.

However, the above-described group twist interleaver 123 may be omitted according to circumstances.

In addition, the group twist interleaver 123 is placed after the group interleaver 122 in the above-described example. However, this is merely an example. That is, the group twist interleaver 123 changes only the order of bits in a certain group and does not change the order of the groups. Therefore, the group twist interleaver 123 may be placed before the group interleaver 122.

The block interleaver 124 interleaves the plurality of groups the order of which has been rearranged. Specifically, the block interleaver 124 is formed of a plurality of columns each including a plurality of rows. In addition, the block interleaver 124 may divide each of the plurality of columns into a first part and a second part according to the number of columns and the number of groups and interleave the LDPC codeword.

In this case, the block interleaver 124 may interleave the plurality of groups the order of which has been rearranged by the group interleaver 122 in group units. Specifically, the block interleaver 124 may divide and interleave the plurality of rearranged groups based on a modulation order by using the first part and the second part.

Herein, the number of groups which are interleaved in group units may be determined by at least one of the number of rows and columns constituting the block interleaver 124, the number of groups and the number of bits included in each group. In other words, the block interleaver 124 may determine the groups which are to be interleaved in group units considering at least one of the number of rows and columns constituting the block interleaver 124, the number of groups and the number of bits included in each group, interleave the corresponding groups in group units, and divide and interleave the remaining groups. For example, the block interleaver 124 may interleave at least a part of the plurality of groups in group units by using the first part and divide and interleave the remaining groups by using the second part.

Meanwhile, interleaving groups in group units means that the bits included in the same group are written in the same column. In other words, in case of groups which are interleaved in group units, the block interleaver 124 may not divide the bits included in the same groups and write the bits in the same column, and in case of groups which are not interleaved in group units, the block interleaver 124 may divide the bits included in the groups and write and interleave the bits in different columns.

Accordingly, in case of all groups which are interleaved by the first part, the bits included in the same groups may be written in the same column of the first part and interleaved, and in case of at least one group which is interleaved by the second part, the bits may be divided and written in at least two columns constituting the second part.

The specific interleaving method will be described later.

Meanwhile, the group twist interleaver 123 changes only the order of bits in the same group and does not change the order of groups by interleaving. Accordingly, the order of the groups to be block-interleaved by the block interleaver 124, that is, the order of the groups to be input to the block interleaver 124, may be determined by the group interleaver 122. Specifically, the order of the groups to be block-interleaved by the block interleaver 124 may be determined by $\pi(j)$ defined in Tables 23 to 27.

As described above, the block interleaver 124 may be formed of a plurality of columns each including a plurality of rows, and may divide the plurality of columns into at least two parts and interleave an LDPC codeword.

For example, the block interleaver 124 may divide each of a plurality of columns into a first part and a second part and interleave a plurality of groups constituting an LDPC codeword.

In this case, the block interleaver 124 may divide each of the plurality of columns into N number of parts (N is an integer greater than or equal to 2) according to whether the number of groups constituting the LDPC codeword is an integer multiple of the number of columns constituting the block interleaver 124, and may perform interleaving.

When the number of groups constituting the LDPC codeword is an integer multiple of the number of columns constituting the block interleaver 124, the block interleaver 124 may interleave the plurality of groups constituting the LDPC codeword in group units without dividing each of the plurality of columns into parts.

Specifically, the block interleaver 124 may interleave by writing the plurality of groups of the LDPC codeword on each of the columns in group units in a column direction, and reading each row of the plurality of columns in which the plurality of groups are written in group units in a row direction.

In this case, the block interleaver 124 may interleave by writing bits included in a predetermined number of groups which corresponds to a quotient of the number of groups of the LDPC codeword divided by the number of columns of the block interleaver 124 on each of the plurality of columns serially in a column direction, and reading each row of the plurality of columns in which the bits are written in a row direction.

Hereinafter, the group located in the $j^{th}$ position after being interleaved by the group interleaver 122 will be referred to as group $Y_j$.

For example, it is assumed that the block interleaver 124 is formed of C number of columns each including $R_1$ number of rows. In addition, it is assumed that the LDPC codeword is formed of $Y_{group}$ number of groups and the number of groups $Y_{group}$ is a multiple of C.

In this case, since a quotient obtained by dividing the number of groups constituting the LDPC codeword, that is, $Y_{group}$ by the number of columns constituting the block interleaver 12, that is, C, is Y group/C, the block interleaver 124 may interleave by writing $Y_{group}/C$ number of groups on each column serially in a column direction and reading bits written on each column in a row direction.

Figure 8:
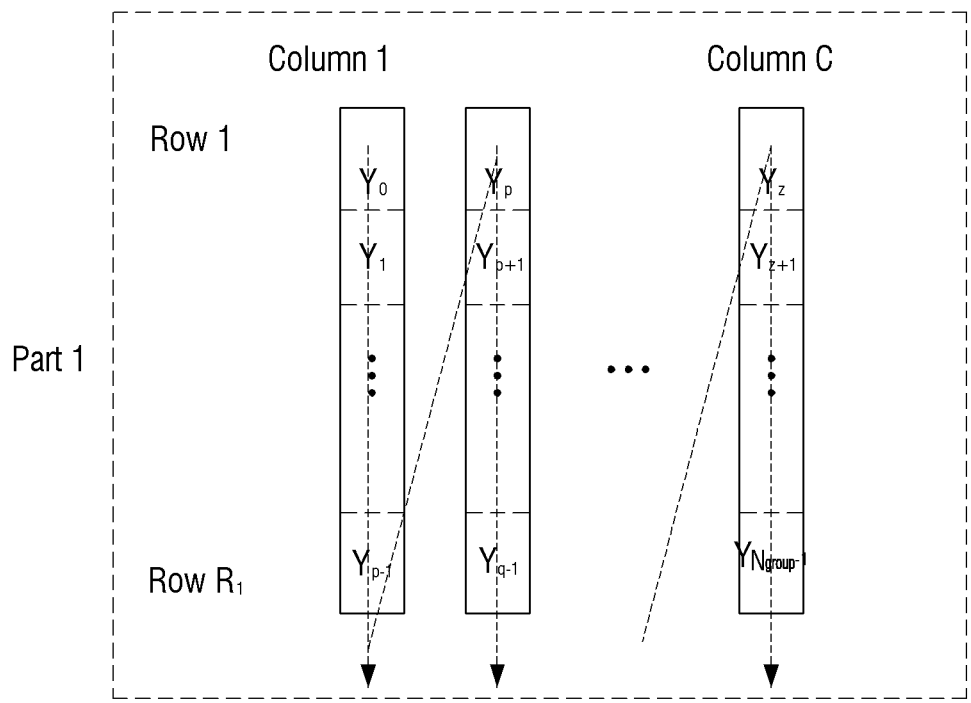
FIGS. 8 to 11 are views to illustrate a configuration of a block interleaver and an interleaving method according to exemplary embodiments.
Figure 8:
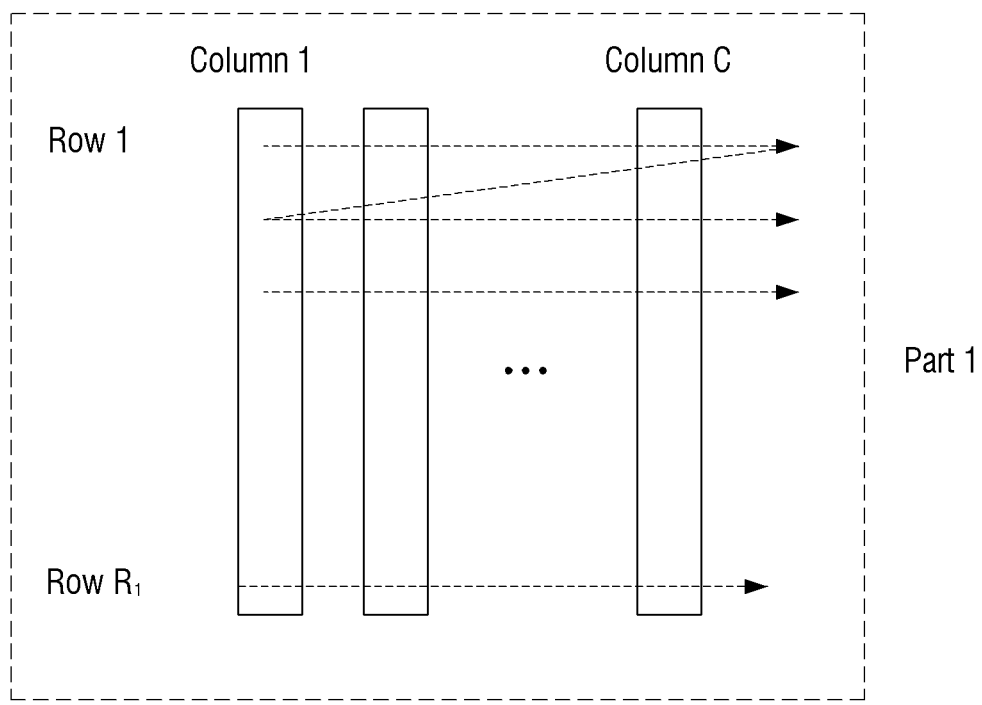

For example, as shown in FIG. 8, the block interleaver 124 writes bits included in group $Y_0$, group $Y_1$, ..., group $Y_{p-1}$ in the $1^{st}$ column from the $1^{st}$ row to the $R_1^{th}$ row, writes bits included in group $Y_p$, group $Y_{p+1}$, ..., group $Y_{q-1}$ in the 2nd column from the $1^{st}$ row to the $R_1^{th}$ row, ..., and writes bits included in group $Y_z$, $Y_{z+1}$, ..., group $Y_{Ngroup-1}$ in the column C from the $1^{st}$ row to the $R_1^{th}$ row. The block interleaver 124 may read the bits written in each row of the plurality of columns in a row direction.

Accordingly, the block interleaver 124 interleaves all groups constituting the LDPC codeword in group units.

However, when the number of groups of the LDPC codeword is not an integer multiple of the number of columns of the block interleaver 124, the block interleaver 124 may interleave a part of the plurality of groups of the LDPC codeword in group units by dividing each column into 2 parts and divide and interleave the remaining groups. In this case, the bits included in the remaining groups, that is, the bits included in the groups which correspond to remainder obtained by dividing the number of groups constituting the LDPC codeword by the number of columns are not interleaved in group units, but interleaved by being divided according to the number of columns.

Specifically, the block interleaver 124 may interleave the LDPC codeword by dividing each of the plurality of columns into two parts.

In this case, the block interleaver 124 may divide the plurality of columns into a first part (part 1) and a second part (part 2) based on the number of columns of the block interleaver 124, the number of groups constituting the LDPC codeword, and the number of bits of each of the plurality of groups.

Here, each of the plurality of groups may be formed of 360 bits. In addition, the number of groups constituting the LDPC codeword is determined according to a length of the LDPC codeword and the number of bits included in each group. For example, when an LDPC codeword length of which is 16200 is divided in such a way that each group is formed of 360 bits, the LDPC codeword may be divided into 45 groups. When an LDPC codeword length of which is 64800 is divided in such a way that each group is formed of 360 bits, the LDPC codeword may be divided into 180 groups. In addition, the number of columns constituting the block interleaver 124 may be determined according to a modulation method. This will be explained in detail below.

Accordingly, the number of rows constituting each of the first part and the second part may be determined based on the number of columns constituting the block interleaver 124, the number of groups constituting the LDPC codeword, and the number of bits constituting each of the plurality of groups.

Specifically, in each of the plurality of columns, the first part may be formed of as many rows as the number of bits included in at least one group which can be written in each column in group units from among the plurality of groups of the LDPC codeword, according to the number of columns constituting the block interleaver 124, the number of groups constituting the LDPC codeword, and the number of bits constituting each group.

In each of the plurality of columns, the second part may be formed of rows excluding as many rows as the number of bits included in at least some groups which can be written in each of the plurality of columns in group units. Specifically, the number rows of the second part may be the same value as a quotient when the number of bits included in all bit groups excluding groups corresponding to the first part is divided by the number of columns constituting the block interleaver 124. In other words, the number of rows of the second part may be the same value as a quotient when the number of bits included in the remaining groups which are not written in the first part from among groups constituting the LDPC codeword is divided by the number of columns.

That is, the block interleaver 124 may divide each of the plurality of columns into the first part including as many rows as the number of bits included in groups which can be written in each column in group units, and the second part including the other rows.

Accordingly, the first part may be formed of as many rows as the number of bits included in groups, that is, as many rows as an integer multiple of M. However, since the number of codeword bits constituting each group may be an aliquot part of M as described above, the first part may be formed of as many rows as an integer multiple of the number of bits constituting each group.

In this case, the block interleaver 124 may interleave by writing and reading the LDPC codeword in the first part and the second part in the same method.

Specifically, the block interleaver 124 may interleave by writing the LDPC codeword in the plurality of columns constituting each of the first part and the second part in a column direction, and reading the plurality of columns constituting the first part and the second part in which the LDPC codeword is written in a row direction.

That is, the block interleaver may interleave by writing bits included in at least some groups which can be written in each of the plurality of columns in group units in each of the plurality of columns of the first part sequentially, dividing bits included in the other groups except the at least some groups and writing in each of the plurality of columns of the second part in a column direction, and reading the bits written in each of the plurality of columns constituting each of the first part and the second part in a row direction.

In this case, the block interleaver 124 may divide and interleave the other groups except the at least some groups from among the plurality of groups based on the number of columns constituting the block interleaver 124.

Specifically, the block interleaver 124 may perform interleaving by dividing the bits include in the other groups by the number of a plurality of columns, writing each of the divided bits in each of a plurality of columns constituting the second part in a column direction, and reading the plurality of columns constituting the second part in which the divided bits are written in a row direction.

That is, the block interleaver 124 may divide the bits included in the other groups except the groups written in the first part from among the plurality of groups of the LDPC codeword, that is, the bits included in the groups which correspond to the remainder obtained by dividing the number of groups constituting the LDCP codeword by the number of columns, by the number of columns, and may write the divided bits in each column of the second part serially in a column direction.

For example, it is assumed that the block interleaver 124 is formed of C number of columns each including $R_1$ number of rows. In addition, it is assumed that the LDPC codeword is formed of $Y_{group}$ number of groups, the number of groups $Y_{group}$ is not a multiple of C, and $A \times C + 1 = Y_{group}$ (A is an integer greater than 0). That is, it is assumed that, when the number of groups constituting the LDCP codeword is divided by the number of columns, the quotient is A and the remainder is 1.

Figure 9:
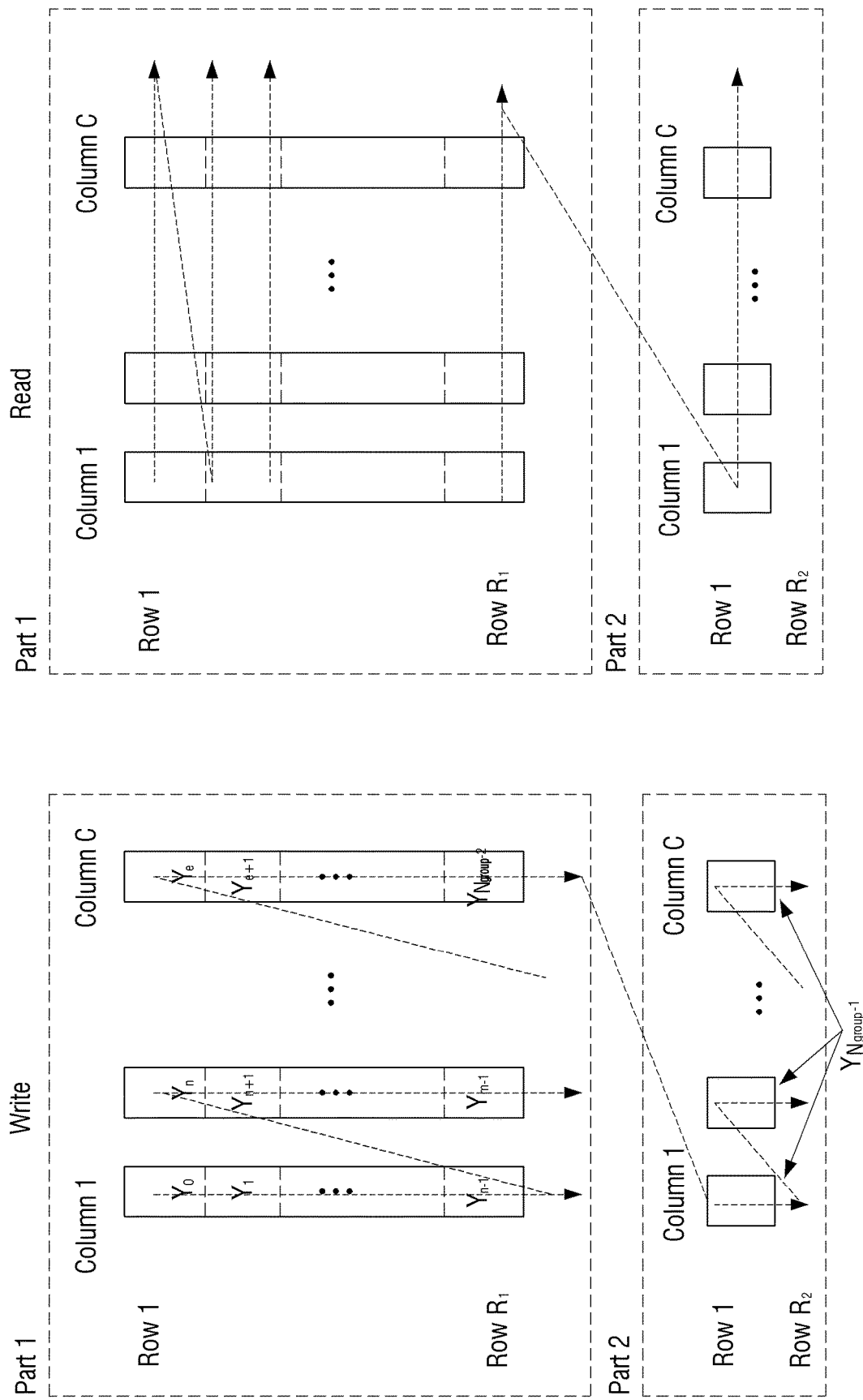
Figure 10:
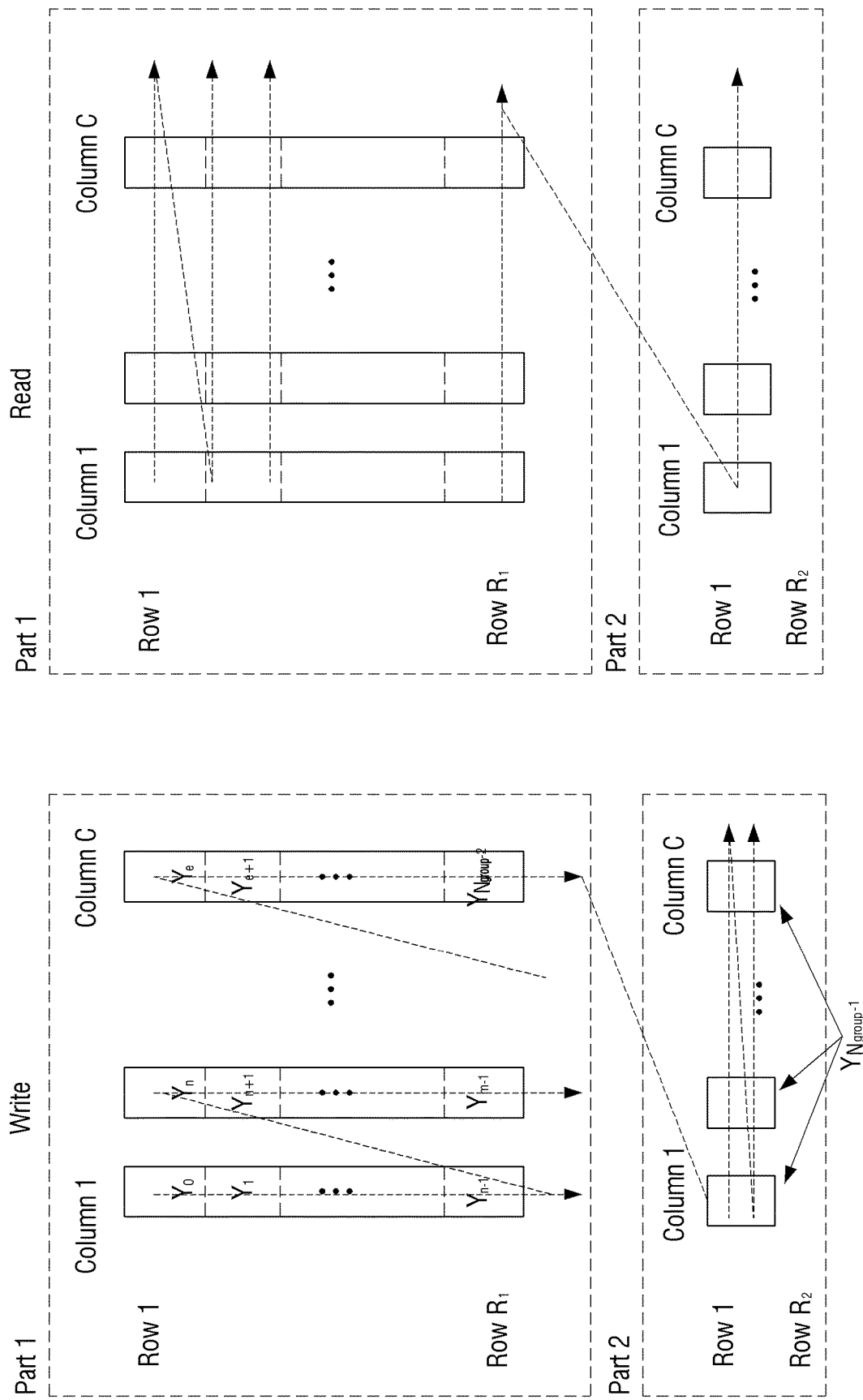

In this case, as shown in FIGS. 9 and 10, the block interleaver 124 may divide each column into a first part including $R_1$ number of rows and a second part including $R_2$ number of rows. In this case, $R_1$ may correspond to the number of bits included in groups which can be written in each column in group units, and $R_2$ may be $R_1$ subtracted from the number of rows of each column.

That is, in the above-described example, the number of groups which can be written in each column in group units is A, and the first part of each column may be formed of as many rows as the number of bits included in A number of groups, that is, may be formed of as many rows as A×M number.

In this case, the block interleaver 124 writes the bits included in the groups which can be written in each column in group units, that is, A number of groups, in the first part of each column in the column direction.

That is, as shown in FIGS. 9 and 10, the block interleaver 124 writes the bits included in each of group $Y_0$, group $Y_1, \ldots,$ group $Y_{n-1}$ in the $1^{st}$ to $R_1^{th}$ rows of the first part of the $1^{st}$ column, writes bits included in each of group $Y_n$, group $Y_{n+1}, \ldots,$ group $Y_{m-1}$ in the $1^{st}$ to $R_1^{th}$ rows of the first part of the $2^{nd}$ column, . . . , writes bits included in each of group $Y_e$, group $Y_{e+1}, \ldots,$ group $Y_{Ngroup-2}$ in the $1^{st}$ to $R_1^{th}$ rows of the first part of the column C.

As described above, the block interleaver 124 writes the bits included in the groups which can be written in each column in group units in the first part of each column in group units.

That is, the bits included in each of group $Y_0$, group $Y_1, \ldots,$ group $Y_{n-1}$ may not be divided and may be written in the first column, and the bits included in each of group $Y_n$, group $Y_{n+1}, \ldots,$ group $Y_{m-1}$ may not be divided and may be written in the second column, and the bits included in each of group $Y_e$, group $Y_{e+1}, \ldots,$ group $Y_{Ngroup-2}$ may not be divided and may be written in C column. As such, it can be seen that, in case of all groups which are interleaved by the first part, the bits included in the same group are written in the same column of the first part.

Thereafter, the block interleaver 124 divides bits included in the other groups except the groups written in the first part of each column from among the plurality of groups, and writes the bits in the second part of each column in the column direction. In this case, the block interleaver 124 divides the bits included in the other groups except the groups written in the first part of each column by the number of columns, so that the same number of bits are written in the second part of each column, and writes the divided bits in the second part of each column in the column direction.

Herein, each of the bits divided based on the number of columns may be referred to as a sub bit group and in this case, each sub bit group is written in each column of the second part.

In the above-described example, since $A \times C + 1 = Y_{group}$, when the groups constituting the LDPC codeword are written in the first part sequentially, the last group $Y_{Ngroup-1}$ of the LDPC codeword is not written in the first part and remains. Accordingly, the block interleaver 124 divides the bits included in the group $Y_{Ngroup-1}$ by C as shown in FIG. 9, and writes the divided bits (that is, the bits which correspond to the quotient obtained by dividing the bits included in the last group $Y_{Ngroup-1}$ by C) in the second part of each column serially.

That is, the block interleaver 124 writes the bits in the $1^{st}$ to $R_2^{th}$ rows of the second part of the $1^{st}$ column, writes the bits in the $1^{st}$ to $R_2^{th}$ rows of the second part of the $2^{nd}$ column, . . . , etc., and writes the bits in the $1^{st}$ to $R_2^{th}$ rows of the second part of the column C. In this case, the block interleaver 124 may write the bits in the second part of each column in the column direction as shown in FIG. 9.

That is, in the second part, the bits constituting the bit group may not be written in the same column and may be written in the plurality of columns. That is, in the above example, since the last group $Y_{Ngroup-1}$ is formed of M bits, the bits included in the last group $Y_{Ngroup-1}$ may be divided in M/C units and written in each column. In other words, the bits included in the last group ($Y_{Ngroup-1}$) may be divided by M/C, the bits divided by M/C may form a sub bit group, and each sub bit group may be written in each column of the second part.

Accordingly, it can be seen that, in case of at least one group which is interleaved by the second part, the bits included in at least one group are divided and written in at least two columns constituting the second part.

In the above-described example, the block interleaver 124 writes the bits in the second part in the column direction. However, this is merely an example. That is, the block interleaver 124 may write the bits in the plurality of columns of the second parts in a row direction. In this case, the block interleaver 124 may write the bits in the first part in the same method as described above.

Specifically, referring to FIG. 10, the block interleaver 124 writes the bits from the $1^{st}$ row of the second part in the $1^{st}$ column to the $1^{st}$ row of the second part in the column C, writes the bits from the $2^{nd}$ row of the second part in the $1^{st}$ column to the $2^{nd}$ row of the second part in the column C, . . . , etc., and writes the bits from the $R_2^{th}$ row of the second part in the $1^{st}$ column to the $R_2^{th}$ row of the second part in the column C.

On the other hand, the block interleaver 124 reads the bits written in each row of each part serially in the row direction. That is, as shown in FIGS. 9 and 10, the block interleaver 124 reads the bits written in each row of the first part of the plurality of columns serially in the row direction, and reads the bits written in each row of the second part of the plurality of columns serially in the row direction.

Accordingly, the block interleaver 124 may interleave a part of a plurality of groups constituting the LDPC codeword in group units, and divide and interleave the remaining groups. That is, the block interleaver 124 may perform interleaving by writing the LDCP codeword constituting a predetermined number of groups from among a plurality of groups in a plurality of columns constituting the first part in group units, dividing and writing the LDPC codeword constituting the other groups in each column constituting the second part, and reading a plurality of columns constituting the first part and the second part in a row direction.

As described above, the block interleaver 124 may interleave the plurality of groups in the methods described above with reference to FIGS. 8 to 10.

In particular, in the case of FIG. 9, the bits included in the group which does not belong to the first part are written in the second part in the column direction and read in the row direction. In view of this, the order of the bits included in the group which does not belong to the first part is rearranged. Since the bits included in the group which does not belong to the first part are interleaved as described above, Bit Error Rate (BER)/Frame Error Rate (FER) performance can be improved in comparison with a case in which such bits are not interleaved.

However, the group which does not belong to the first part may not be interleaved as shown in FIG. 10. That is, since the block interleaver 124 writes and read the bits included in the group which does not belong to the first part on and from the second part in the row direction, the order of the bits included in the group which does not belong to the first part is not changed and the bits are output to the modulator 130 serially. In this case, the bits included in the group which does not belong to the first part may be output serially and mapped onto a modulation symbol.

In FIGS. 9 and 10, the last single group of the plurality of groups is written in the second part. However, this is merely an example. The number of groups written in the second part may vary according to the total number of groups of the LDPC codeword, the number of columns and rows, the number of transmission antennas, etc.

The block interleaver 124 may have a different configuration according to whether bits included in a same group are mapped onto a single bit of each modulation symbol or bits included in a same group are mapped onto two bits of each modulation symbol.

On the other hand, in the case of a transceiving system using a plurality of antennas, the number of columns constituting the block interleaver 124 may be determined by considering the number of bits constituting a modulation symbol and the number of used antennas simultaneously. For example, when bits included in a same group are mapped onto a single bit in a modulation symbol and two antennas are used, the block interleaver 124 may determine the number of columns to be two times the number of bits constituting the modulation symbol.

First, when bits included in the same group are mapped onto a single bit of each modulation symbol, the block interleaver 124 may have configurations as shown in Tables 28 and 29:

TABLE 28

| | \multicolumn{6}{c}{$N_{ldpc}$ = 64800} |
| | QPSK | 16 QAM | 64 QAM | 256 QAM | 1024 QAM | 4096 QAM |
|---|---|---|---|---|---|---|
| C | 2 | 4 | 6 | 8 | 10 | 12 |
| $R_1$ | 32400 | 16200 | 10800 | 7920 | 6480 | 5400 |
| $R_2$ | 0 | 0 | 0 | 180 | 0 | 0 |

TABLE 29

| | \multicolumn{6}{c}{$N_{ldpc}$ = 16200} |
| | QPSK | 16 QAM | 64 QAM | 256 QAM | 1024 QAM | 4096 QAM |
|---|---|---|---|---|---|---|
| C | 2 | 4 | 6 | 8 | 10 | 12 |
| $R_1$ | 7920 | 3960 | 2520 | 1800 | 1440 | 1080 |
| $R_2$ | 180 | 90 | 180 | 225 | 180 | 270 |

Herein, C (or $N_C$) is the number of columns of the block interleaver 124, $R_1$ is the number of rows constituting the first part in each column, and $R_2$ is the number of rows constituting the second part in each column.

Referring to Tables 28 and 29, the number of a plurality of columns has the same value as a modulation order according to a modulation method, and each of the plurality of columns is formed of columns which correspond to a value obtained by dividing the number of bits constituting the LDPC codeword by the number of the plurality of columns.

For example, when a length of the LDPC codeword is $N_{ldpc}$=64800, and modulation is performed in a 16-QAM method, a modulation order is 4. Thus, the block interleaver

124 is formed of four columns, and each column is formed of rows of $R_1+R_2=16200(=64800/4)$.

Meanwhile, referring to Tables 28 and 29, when the number of groups constituting an LDPC codeword is an integer multiple of the number of columns, the block interleaver 124 interleaves without dividing each column. Therefore, $R_1$ corresponds to the number of rows constituting each column, and $R_2$ is 0. In addition, when the number of groups constituting an LDPC codeword is not an integer multiple of the number of columns, the block interleaver 124 interleaves the groups by dividing each column into the first part formed of $R_1$ number of rows, and the second part formed of $R_2$ number of rows.

When the number of columns of the block interleaver 124 is equal to the number of bits constituting a modulation symbol, bits included in a same group are mapped onto a single bit of each modulation symbol as shown in Tables 28 and 29.

For example, when $N_{ldpc}=64800$ and the modulation method is 16-QAM, the block interleaver 124 may use four (4) columns each including 16200 rows. In this case, a plurality of groups of an LDPC codeword are written in the four (4) columns in group units and bits written in the same row in each column are output serially. In this case, since four (4) bits constitute a single modulation symbol in the modulation method of 16-QAM, bits included in the same group, that is, bits output from a single column, may be mapped onto a single bit of each modulation symbol. For example, bits included in a group written in the $1^{st}$ column may be mapped onto the first bit of each modulation symbol.

On the other hand, when bits included in a same group are mapped onto two bits of each modulation symbol, the block interleaver 124 may have configurations as shown in Tables 30 and 31:

TABLE 30

| | $N_{ldpc}$ = 64800 | | | | | |
|---|---|---|---|---|---|---|
| | QPSK | 16 QAM | 64 QAM | 256 QAM | 1024 QAM | 4096 QAM |
| C | 1 | 2 | 3 | 4 | 5 | 6 |
| $R_1$ | 64800 | 32400 | 21600 | 16200 | 12960 | 10800 |
| $R_2$ | 0 | 0 | 0 | 0 | 0 | 0 |

TABLE 31

| | $N_{ldpc}$ = 16200 | | | | | |
|---|---|---|---|---|---|---|
| | QPSK | 16 QAM | 64 QAM | 256 QAM | 1024 QAM | 4096 QAM |
| C | 1 | 2 | 3 | 4 | 5 | 6 |
| $R_1$ | 16200 | 7920 | 5400 | 3960 | 3240 | 2520 |
| $R_2$ | 0 | 180 | 0 | 90 | 0 | 180 |

Herein, C (or $N_C$) is the number of columns of the block interleaver 124, $R_1$ is the number of rows constituting the first part in each column, and $R_2$ is the number of rows constituting the second part in each column.

Referring to Tables 30 and 31, when the number of groups constituting an LDPC codeword is an integer multiple of the number of columns, the block interleaver 124 interleaves without dividing each column. Therefore, $R_1$ corresponds to the number of rows constituting each column, and $R_2$ is 0. In addition, when the number of groups constituting an LDPC codeword is not an integer multiple of the number of columns, the block interleaver 124 interleaves the groups by dividing each column into the first part formed of $R_1$ number of rows, and the second part formed of $R_2$ number of rows.

When the number of columns of the block interleaver 124 is half of the number of bits constituting a modulation symbol as shown in Tables 30 and 31, bits included in a same group are mapped onto two bits of each modulation symbol.

For example, when $N_{ldpc}=64800$ and the modulation method is 16-QAM, the block interleaver 124 may use two (2) columns each including 32400 rows. In this case, a plurality of groups of an LDPC codeword are written in the two (2) columns in group units and bits written in the same row in each column are output serially. Since four (4) bits constitute a single modulation symbol in the modulation method of 16-QAM, bits output from two rows constitute a single modulation symbol. Accordingly, bits included in the same group, that is, bits output from a single column, may be mapped onto two bits of each modulation symbol. For example, bits included in a group written in the $1^{st}$ column may be mapped onto bits existing in any two positions of each modulation symbol.

Referring to Tables 28 to 31, the total number of rows of the block interleaver 124, that is, $R_1+R_2$, is $N_{ldpc}/C$.

In addition, the number of rows of the first part, $R_1$, is an integer multiple of the number of bits included in each group, M (e.g., M=360), and may be expressed as $\lfloor N_{group}/C \rfloor \times M$, and the number of rows of the second part, $R_2$, may be $N_{ldpc}/C - R_1$. Herein, $\lfloor N_{group}/C \rfloor$ is the largest integer below $N_{group}/C$. Since $R_1$ is an integer multiple of the number of bits included in each group, M, bits may be written in $R_1$ in group units.

In addition, when the number of groups of an LDPC codeword is not a multiple of the number of columns, it can be seen from Tables 28 to 31 that the block interleaver 124 interleaves a plurality of groups of the LDPC codeword by dividing each column into two parts.

Specifically, the length of an LDPC codeword divided by the number of columns is the total number of rows included in the each column. In this case, when the number of groups of the LDPC codeword is a multiple of the number of columns, each column is not divided into two parts. However, when the number of groups of the LDPC codeword is not a multiple of the number of columns, each column is divided into two parts.

For example, it is assumed that the number of columns of the block interleaver 124 is identical to the number of bits constituting a modulation symbol, and an LDPC codeword is formed of 64800 bits as shown in Table 28. In this case, each group of the LDPC codeword is formed of 360 bits, and the LDPC codeword is formed of 64800/360(=180) groups.

When the modulation method is 16-QAM, the block interleaver 124 may use four (4) columns and each column may have 64800/4(=16200) rows.

In this case, since the number of groups of an LDPC codeword divided by the number of columns is 180/4(=45), bits can be written in each column in group units without dividing each column into two parts. That is, bits included in 45 groups which are the quotients obtained by dividing the number of groups constituting the LDPC codeword by the number of columns, that is, 45×360(=16200) bits can be written in each column.

However, when the modulation method is 256-QAM, the block interleaver 124 may use eight (8) columns and each column may have 64800/8(=8100) rows.

In this case, since the number of groups of an LDPC codeword divided by the number of columns is 180/8=22.5, the number of groups constituting the LDPC codeword is not an integer multiple of the number of columns. Accordingly, the block interleaver 124 divides each of the eight (8) columns into two parts to perform interleaving in group units.

In this case, since the bits should be written in the first part of each column in group units, the number of groups which can be written in the first part of each column in group units is 22 which are the quotients obtained by dividing the number of groups constituting the LDPC codeword by the number of columns, and accordingly, the first part of each column has 22×360(=7920) rows. Accordingly, 7920 bits included in 22 groups may be written in the first part of each column.

The second part of each column has rows which are the rows of the first part subtracted from the total rows of each column. Accordingly, the second part of each column includes 8100−7920(=180) rows.

In this case, the bits included in the other group which has not been written in the first part are divided and written in the second part of each column.

Specifically, since 22×8(=176) groups are written in the first part, the number of groups to be written in the second part is 180−176 (=4) (for example, group $Y_{176}$, group $Y_{177}$, group $Y_{178}$, and group $Y_{179}$ from among group $Y_0$, group $Y_1$, group $Y_2$, . . . , group $Y_{178}$, and group $Y_{179}$ constituting an LDPC codeword).

Accordingly, the block interleaver 124 may write the four (4) groups which have not been written in the first part and remains from among the groups constituting the LDPC codeword in the second part of each column serially.

That is, the block interleaver 124 may write 180 bits of the 360 bits included in the group $Y_{176}$ in the $1^{st}$ row to the $180^{th}$ row of the second part of the $1^{st}$ column in the column direction, and may write the other 180 bits in the $1^{st}$ row to the $180^{th}$ row of the second part of the $2^{nd}$ column in the column direction. In addition, the block interleaver 124 may write 180 bits of the 360 bits included in the group $Y_{177}$ in the $1^{st}$ row to the $180^{th}$ row of the second part of the $3^{rd}$ column in the column direction, and may write the other 180 bits in the $1^{st}$ row to the $180^{th}$ row of the second part of the $4^{th}$ column in the column direction. In addition, the block interleaver 124 may write 180 bits of the 360 bits included in the group $Y_{178}$ in the $1^{st}$ row to the $180^{th}$ row of the second part of the $5^{th}$ column in the column direction, and may write the other 180 bits in the $1^{st}$ row to the $180^{th}$ row of the second part of the $6^{th}$ column in the column direction. In addition, the block interleaver 124 may write 180 bits of the 360 bits included in the group $Y_{179}$ in the $1^{st}$ row to the $180^{th}$ row of the second part of the $7^{th}$ column in the column direction, and may write the other 180 bits in the $1^{st}$ row to the $180^{th}$ row of the second part of the $8^{th}$ column in the column direction.

Accordingly, the bits included in the group which has not been written in the first part and remains are not written in the same column in the second part and may be divided and written in the plurality of columns.

Hereinafter, the block interleaver of FIG. 4 according to an exemplary embodiment will be explained in detail with reference to FIG. 11.

In a group-interleaved LDPC codeword ($v_0$, $v_1$, . . . , $v_{N_{ldpc}-1}$), $Y_j$ is continuously arranged like $V=\{Y_0, Y_1, \ldots Y_{N_{group}-1}\}$.

Figure 11:
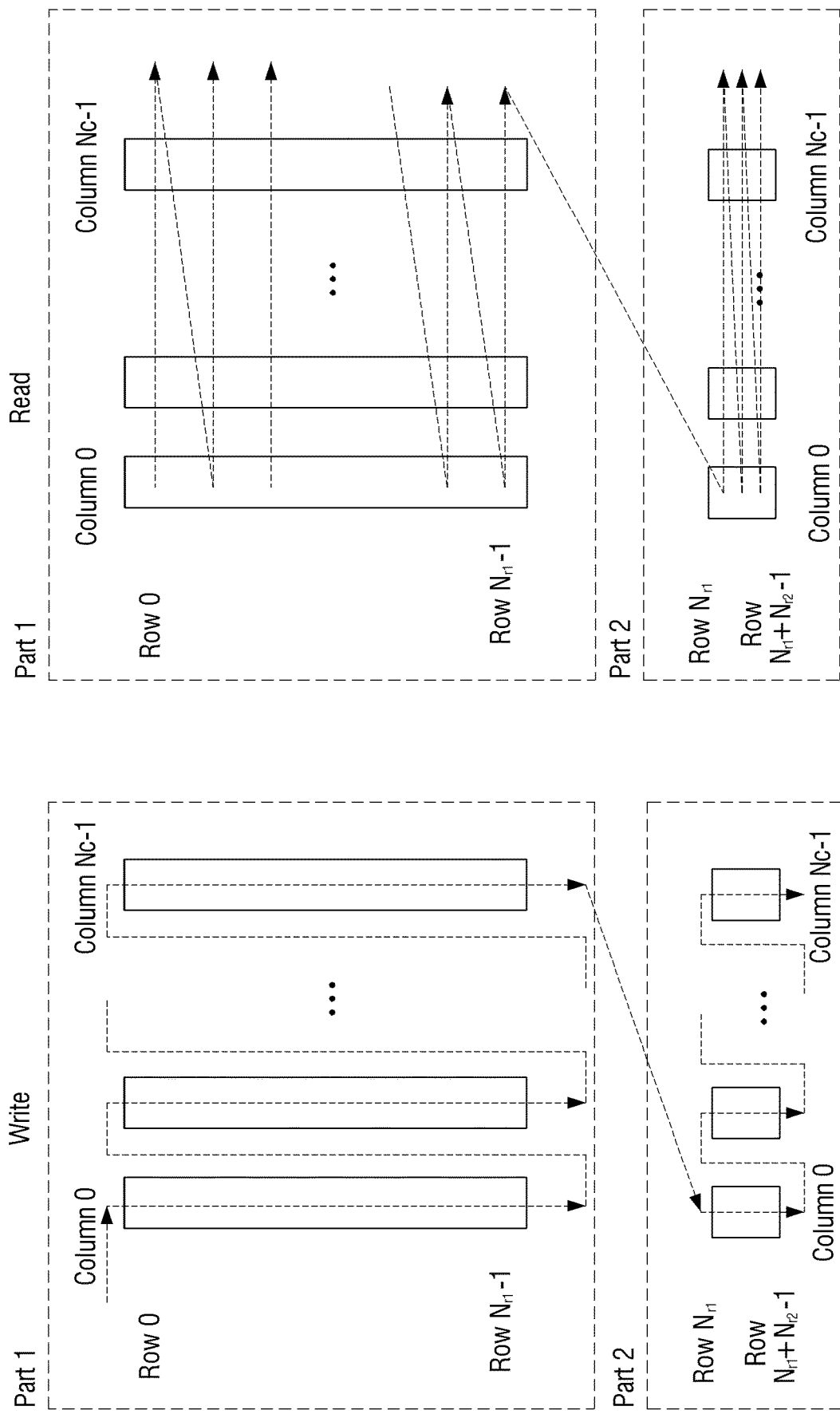

The LDPC codeword after group interleaving may be interleaved by the block interleaver 124 as shown in FIG. 11. In this case, the block interleaver 124 divide a plurality of columns into the first part (Part 1) and the second part (Part 2) based on the number of columns of the block interleaver 124 and the number of bits of groups. In this case, in the first part, the bits constituting groups may be written in the same column, and in the second part, the bits constituting groups may be written in a plurality of columns.

In the block interleaver 124, the data bits $v_i$ from the group-wise interleaver 122 are written serially into the block interleaver column-wise starting in the first part and continuing column-wise finishing in the second part, and then read out serially row-wise from the first part and then row-wise from the second part. Accordingly, the bits included in the same group in the first part may be mapped onto single bit of each modulation symbol.

In this case, the number of columns and the number of rows of the first part and the second part of the block interleaver 124 vary according to a modulation method as in Table 32 presented below. The first part and the second part block interleaving configurations for each modulation format and code length are specified in Table 32. Herein, the number of columns of the block interleaver 124 may be equal to the number of bits constituting a modulation symbol. In addition, a sum of the number of rows of the first part, $N_{r1}$ and the number of rows of the second part, $N_{r2}$, is equal to $N_{ldpc}/N_C$ (herein, $N_C$ is the number of columns). In addition, since $N_{r1}(=\lfloor N_{group}/N_C \rfloor \times 360)$ is a multiple of 360, so that multiple of bit groups are written into the first part of block interleaver,

TABLE 32

|  | Rows in Part 1 $N_{r1}$ | | Rows in Part 2 $N_{r2}$ | | |
| --- | --- | --- | --- | --- | --- |
| Modulation | $N_{ldpc}$ = 64800 | $N_{ldpc}$ = 16200 | $N_{ldpc}$ = 64800 | $N_{ldpc}$ = 16200 | Columns $N_c$ |
| QPSK | 32400 | 7920 | 0 | 180 | 2 |
| 16-QAM | 16200 | 3960 | 0 | 90 | 4 |
| 64-QAM | 10800 | 2520 | 0 | 180 | 6 |
| 256-QAM | 7920 | 1800 | 180 | 225 | 8 |
| 1024-QAM | 6480 | 1440 | 0 | 180 | 10 |
| 4096-QAM | 5400 | 1080 | 0 | 270 | 12 |

Hereinafter, an operation of the block interleaver 124 will be explained in detail.

Specifically, as shown in FIG. 11, the input bit $v_i$ ($0 \leq i < N_C \times N_{r1}$) is written in $r_i$ row of $c_i$ column of the first part of the block interleaver 124. Herein, $c_i$ and $r_i$ are $$c_i = \left\lfloor \frac{i}{N_{r1}} \right\rfloor$$

and $r_i = (i \bmod N_{r1})$, respectively.

In addition, the input bit $v_i$ ($N_C \times N_{r1} \leq i < N_{ldpc}$) is written in an $r_i$ row of $c_i$ column of the second part of the block interleaver 124. Herein, $c_i$ and $r_i$ are $$c_i = \left\lfloor \frac{(i - N_C \times N_{r1})}{N_{r2}} \right\rfloor$$

and $r_i = N_{r1} + \{(i - N_C \times N_{r1}) \bmod N_{r2}\}$, respectively.

An output bit $q_j$ ($0 \leq j < N_{ldpc}$) is read from $c_j$ column of $r_j$ row. Herein, $r_j$ and $c_j$ are $$r_j = \left\lfloor \frac{j}{N_c} \right\rfloor$$

and $c_j = (j \bmod N_C)$, respectively.

For example, when the length $N_{ldpc}$ of an LDPC codeword is 64800 and the modulation method is 256-QAM, an order of bits output from the block interleaver 124 may be $(q_0, q_1, q_2, \ldots, q_{63357}, q_{63358}, q_{63359}, q_{63360}, q_{63361}, \ldots, q_{64799}) = (v_0, v_{7920}, v_{15840}, \ldots, v_{47519}, v_{55439}, v_{63359}, v_{63360}, v_{63540}, \ldots, v_{64799})$. Herein, the indexes of the right side of the foregoing equation may be specifically expressed for the eight (8) columns as 0, 7920, 15840, 23760, 31680, 39600, 47520, 55440, 1, 7921, 15841, 23761, 31681, 39601, 47521, 55441, . . . , 7919, 15839, 23759, 31679, 39599, 47519, 55439, 63359, 63360, 63540, 63720, 63900, 64080, 64260, 64440, 64620, . . . , 63539, 63719, 63899, 64079, 64259, 64439, 64619, 64799.

Meanwhile, in the above example, the number of columns constituting the block interleaver 124 may be the same value as a modulation order or half the modulation degree, but this is only an example. The number of columns constituting the block interleaver 124 may be a multiple value of the modulation degree. In this case, the number of rows constituting each column may be the length of the LDPC codeword divided by the number of columns.

For example, in case that the modulation method is QPSK (that is, the modulation order is 2), the number of columns may be 4 instead of 2. In this case, if the length $N_{ldpc}$ of the LDPC codeword is 16200, the number of rows constituting each column may be 4050(=16200/4).

Meanwhile, even when the number of columns is the multiple value of the modulation degree, the block interleaver 124 may perform interleaving using the same method as when the number of columns is the same value as the modulation order of half the modulation degree, so detailed description thereof will not be provided.

In this case, the number of columns constituting the block interleaver 124 may have the same value as the modulation order or the integer multiple of the modulation order and thus, the number of the second part may be the same value as a quotient when the number of bits included in all bit groups excluding groups corresponding to the first part is divided by the modulation order or the multiple of the modulation degree.

Referring back to FIG. 1, the modulator 130 modulates an interleaved LDPC codeword according to a modulation method to generate a modulation symbol. Specifically, the modulator 130 may demultiplex the interleaved LDPC codeword and modulate the demultiplexed LDPC codeword and map it onto a constellation, thereby generating a modulation symbol.

In this case, the modulator 130 may generate a modulation symbol using bits included in each of a plurality of groups.

In other words, as described above, the bits included in different groups are written in each column of the block interleaver 124, and the block interleaver 124 reads the bits written in each column in a row direction. In this case, the modulator 130 generates a modulation symbol by mapping the bits read in each column onto each bit of the modulation symbol. Accordingly, each bit of the modulation symbol belongs to a different group.

For example, it is assumed that the modulation symbol consists of C bits (C refers to the number of bits). In this case, the bits which are read from each row of C columns of the block interleaver 124 may be mapped onto each bit of the modulation symbol and thus, each bit of the modulation symbol consisting of C bits belong to C different groups.

Hereinbelow, the above feature will be described in greater detail.

First, the modulator 130 demultiplexes the interleaved LDPC codeword. To achieve this, the modulator 130 may include a demultiplexer (not shown) to demultiplex the interleaved LDPC codeword.

The demultiplexer (not shown) demultiplexes the interleaved LDPC codeword. Specifically, the demultiplexer (not shown) performs serial-to-parallel conversion with respect to the interleaved LDPC codeword, and demultiplexes the interleaved LDPC codeword into a cell having a predetermined number of bits (or a data cell).

Figure 12:
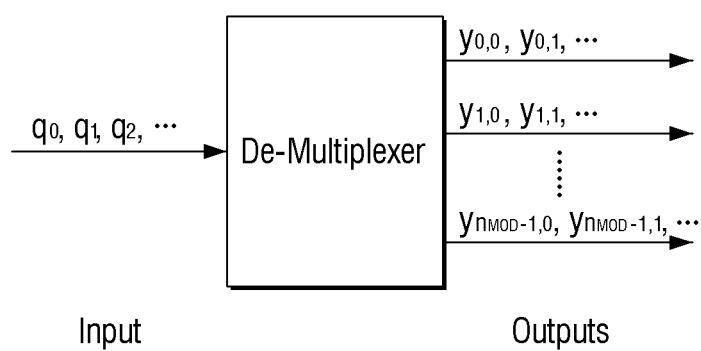
FIGS. 12 and 13 are views to illustrate an operation of a demultiplexer according to exemplary embodiments.

For example, as shown in FIG. 12, the demultiplexer (not shown) receives the LDPC codeword $Q=(q_0, q_1, q_2, \ldots)$ output from the interleaver 120, outputs the received LDPC codeword bits to one of a plurality of substreams serially, converts the input LDPC codeword bits into cells, and outputs the cells.

Herein, the number of substreams, Nsubstreams, may be equal to the number of bits constituting a modulation symbol, $\eta_{mod}$, and the number of bits constituting the cell may be equal to $N_{ldpc}/\eta_{mod}$. $\eta_{mod}$ varying according to a modulation method and the number of cells generated according to the length $N_{ldpc}$ of the LDPC codeword are as in Table 33 presented below:

TABLE 33

| Modulation mode | $\eta_{MOD}$ | Number of output data cells for $N_{ldpc}$ = 64 800 | Number of output data cells for $N_{ldpc}$ = 16 200 |
| --- | --- | --- | --- |
| QPSK | 2 | 32 400 | 8 100 |
| 16-QAM | 4 | 16 200 | 4 050 |
| 64-QAM | 6 | 10 800 | 2 700 |
| 256-QAM | 8 | 8 100 | 2 025 |
| 1024-QAM | 10 | 6 480 | 1 620 |

Bits having the same index in each of the plurality of sub-streams may constitute a same cell. That is, in FIG. 12, each cell may be expressed as $(y_{0,0}, y_{1,0}, \ldots, y_{\eta_{MOD}-1,0})$, $(y_{0,1}, y_{1,1}, \ldots, y_{\eta_{MOD}-1,1})$.

The demultiplexer (not shown) may demultiplex input LDPC codeword bits in various methods. That is, the demultiplexer (not shown) may change an order of the LDPC codeword bits and output the bits to each of the plurality of substreams, or may output the bits to each of the plurality of streams serially without changing the order of the LDPC codeword bits. These operations may be determined according to the number of columns used for interleaving in the block interleaver 124.

Specifically, when the block interleaver 124 includes as many columns as half of the number of bits constituting a modulation symbol, the demultiplexer (not shown) may change the order of the input LDPC codeword bits and output the bits to each of the plurality of sub-streams. An example of a method for changing the order is illustrated in Table 34 presented below:

TABLE 34

| Modulation format | QPSM | | | | | | | | | | |
|---|---|---|---|---|---|---|---|---|---|---|---|
| input bit di mod $N_{substreams}$ | 0 | 1 | | | | | | | | | |
| output bit-number | 0 | 1 | | | | | | | | | |
| Modulation format | 16 QAM | | | | | | | | | | |
| input bit di mod $N_{substreams}$ | 0 | 1 | 2 | 3 | | | | | | | |
| output bit-number | 0 | 2 | 1 | 3 | | | | | | | |
| Modulation format | 64 QAM | | | | | | | | | | |
| input bit di mod $N_{substreams}$ | 0 | 1 | 2 | 2 | 4 | 5 | | | | | |
| output bit-number | 0 | 3 | 1 | 4 | 2 | 5 | | | | | |
| Modulation format | 256 QAM | | | | | | | | | | |
| input bit di mod $N_{substreams}$ | 0 | 1 | 2 | 3 | 4 | 5 | 6 | 7 | | | |
| output bit-number | 0 | 4 | 1 | 5 | 2 | 6 | 3 | 7 | | | |
| Modulation format | 1024 QAM | | | | | | | | | | |
| input bit di mod $N_{substreams}$ | 0 | 1 | 2 | 3 | 4 | 5 | 6 | 7 | 8 | 9 | |
| output bit-number | 0 | 5 | 1 | 6 | 2 | 7 | 3 | 5 | 4 | 9 | |
| Modulation format | 4096 QAM | | | | | | | | | | |
| input bit di mod $N_{substreams}$ | 0 | 1 | 2 | 3 | 4 | 5 | 6 | 7 | 8 | 9 | 10 | 11 |
| output bit-number | 0 | 6 | 1 | 7 | 2 | 6 | 3 | 9 | 4 | 10 | 5 | 11 |

According to Table 34, when the modulation method is 16-QAM for example, the number of substreams is four (4) since the number of bits constituting the modulation symbol is four (4) in the case of 16-QAM. In this case, the demultiplexer (not shown) may output, from among the serially input bits, bits with an index i satisfying i mod 4=0 to the $0^{th}$ substream, bits with an index i satisfying i mod 4=1 to the $2^{nd}$ substream, bits with an index i satisfying i mode 4=2 to the $1^{st}$ substream, and bits with an index i satisfying i mode 4=3 to the $3^{rd}$ substream.

Accordingly, the LDPC codeword bits input to the demultiplexer (not shown), $(q_0, q_1, q_2, \ldots)$, may be output as cells like $(y_{0,0}, y_{1,0}, y_{2,0}, y_{3,0})=(q_0, q_2, q_i, q_3)$, $(y_{0,1}, y_{1,1}, y_{2,1}, y_{3,1})=(q_4, q_6, q_5, q_7), \ldots$.

Figure 13:
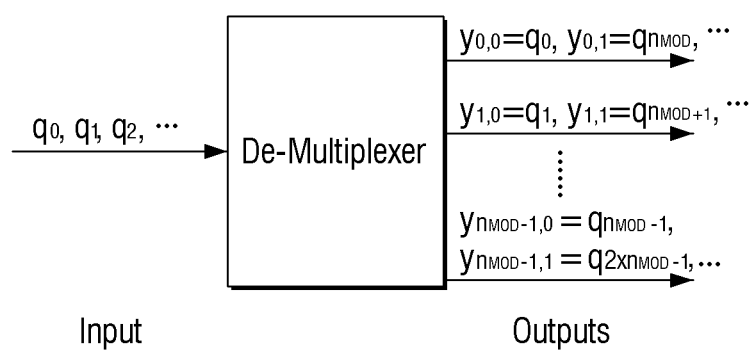

When the block interleaver 124 includes the same number of columns as the number of bits constituting a modulation symbol, the demultiplexer (not shown) may output the input LDPC codeword bits to each of the plurality of streams serially without changing the order of the bits. That is, as shown in FIG. 13, the demultiplexer (not shown) may output the input LDPC codeword bits $(q_0, q_1, q_2, \ldots)$ to each of the substreams serially, and accordingly, each cell may be configured as $(y_{0,0}, y_{1,0}, \ldots, y_{\eta\ MOD-1,0})=(q_0, q_1, \ldots, q_{\eta\ MOD-1})$, $(y_{0,1}, y_{1,1}, \ldots, y_{\eta\ MOD-1,1})=(q_{\eta\ MOD}, q_{\eta\ MOD+1}, \ldots, q_{2\times\eta\ MOD-1}), \ldots$.

In the above-described example, the demultiplexer (not shown) outputs the input LDPC codeword bits to each of the plurality of streams serially without changing the order of the bits. However, this is merely an example. That is, according to an exemplary embodiment, when the block interleaver 124 includes the same number of columns as the number of bits constituting a modulation symbol, the demultiplexer (not shown) may be omitted.

The modulator 130 may map the demultiplexed LDPC codeword onto modulation symbols. However, when the demultiplexer (not shown) is omitted as described above, the modulator 130 may map LDPC codeword bits output from the interleaver 120, that is, block-interleaved LDPC codeword bits, onto modulation symbols.

The modulator 130 may modulate bits (that is, cells) output from the demultiplexer (not shown) in various modulation methods such as QPSK, 16-QAM, 64-QAM, 256-QAM, 1024-QAM, 4096-QAM, etc. When the modulation method is QPSK, 16-QAM, 64-QAM, 256-QAM, 1024-QAM and 4096-QAM, the number of bits constituting a modulation symbol, $\eta_{MOD}$ (that is, a modulation degree), may be 2, 4, 6, 8, 10 and 12, respectively.

In this case, since each cell output from the demultiplexer (not shown) is formed of as many bits as the number of bits constituting a modulation symbol, the modulator 130 may generate a modulation symbol by mapping each cell output from the demultiplexer (not shown) onto a constellation point serially. Herein, a modulation symbol corresponds to a constellation point on the constellation.

However, when the demultiplexer (not shown) is omitted, the modulator 130 may generate modulation symbols by grouping a predetermined number of bits from interleaved bits sequentially and mapping the predetermined number of bits onto constellation points. In this case, the modulator 130 may generate the modulation symbols by using $\eta_{MOD}$ number of bits sequentially according to a modulation method.

The modulator 130 may modulate by mapping cells output from the demultiplexer (not shown) onto constellation points in a uniform constellation (UC) method.

The uniform constellation method refers to a method for mapping a modulation symbol onto a constellation point so that a real number component $Re(z_q)$ and an imaginary number component $Im(z_q)$ of a constellation point have symmetry and the modulation symbol is placed at equal intervals. Accordingly, at least two of modulation symbols mapped onto constellation points in the uniform constellation method may have the same demodulation performance.

Figure 14:
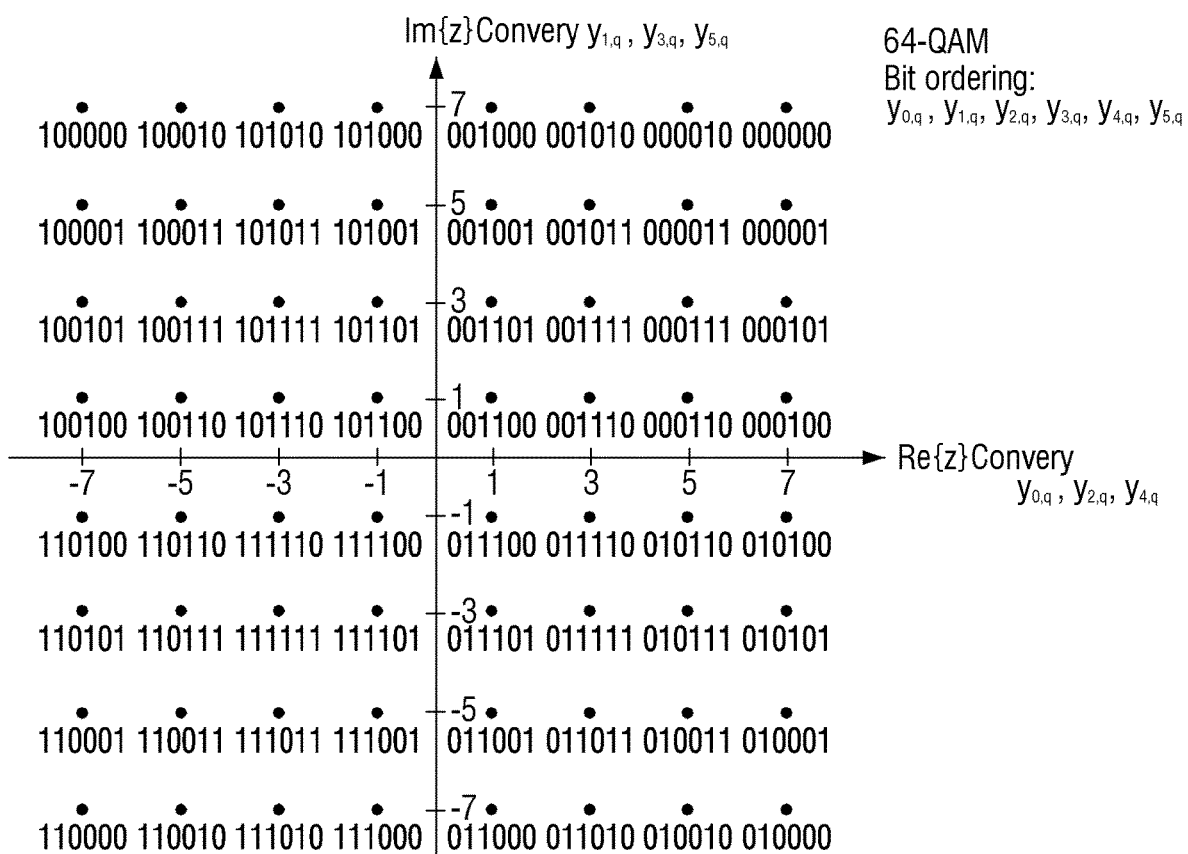
FIG. 14 is a view to illustrate an example of a uniform constellation modulation method according to an exemplary embodiment.

Examples of the method for generating a modulation symbol in the uniform constellation method according to an exemplary embodiment are illustrated in Tables 35 to 42 presented below, and an example of a case of a uniform constellation 64-QAM is illustrated in FIG. 14.

TABLE 35

| $y_{o,q}$ | 1 | 0 |
|---|---|---|
| $Re(z_q)$ | -1 | 1 |

TABLE 36

| $y_{1,q}$ | 1 | 0 |
|---|---|---|
| $Im(z_q)$ | -1 | 1 |

TABLE 37

| $y_{o,q}$ | 1 | 1 | 0 | 0 |
|---|---|---|---|---|
| $y_{2,q}$ | 0 | 1 | 1 | 0 |
| $Re(z_q)$ | -3 | -1 | 1 | 3 |

TABLE 38

| $y_{1,q}$ | 1 | 1 | 0 | 0 |
|---|---|---|---|---|
| $y_{3,q}$ | 0 | 1 | 1 | 0 |
| $Im(z_q)$ | -3 | -1 | 1 | 3 |

TABLE 39

| $y_{0,q}$ | 1 | 1 | 1 | 1 | 0 | 0 | 0 | 0 |
|---|---|---|---|---|---|---|---|---|
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | -7 | -5 | -3 | -1 | 1 | 3 | 5 | 7 |

TABLE 40

| $y_{1,q}$ | 1 | 1 | 1 | 1 | 0 | 0 | 0 | 0 |
|---|---|---|---|---|---|---|---|---|
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | -7 | -5 | -3 | -1 | 1 | 3 | 5 | 7 |

TABLE 41

| $y_{0,q}$ | 1 | 1 | 1 | 1 | 1 | 1 | 1 | 1 | 0 | 0 | 0 | 0 | 0 | 0 | 0 | 0 |
|---|---|---|---|---|---|---|---|---|---|---|---|---|---|---|---|---|
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | -15 | -13 | -11 | -9 | -7 | -5 | -3 | -1 | 1 | 3 | 5 | 7 | 9 | 11 | 13 | 15 |

TABLE 42

| $y_{1,q}$ | 1 | 1 | 1 | 1 | 1 | 1 | 1 | 1 | 0 | 0 | 0 | 0 | 0 | 0 | 0 | 0 |
|---|---|---|---|---|---|---|---|---|---|---|---|---|---|---|---|---|
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | -15 | -13 | -11 | -9 | -7 | -5 | -3 | -1 | 1 | 3 | 5 | 7 | 9 | 11 | 13 | 15 |

Tables 35 and 36 are used for determining a real number component $Re(z_q)$ and an imaginary number component $Im(z_q)$ when the modulation is performed in a QPSK method, Tables 37 and 38 are used for determining a real number component $Re(z_q)$ and an imaginary number component $Im(z_q)$ when the modulation is performed in a 16-QAM method, Tables 39 and 40 are used for determining a real number component $Re(z_q)$ and an imaginary number component $Im(z_q)$ when the modulation is performed in a 64-QAM method, and Tables 41 and 42 are used for determining a real number component $Re(z_q)$ and an imaginary number component $Im(z_q)$ when the modulation is performed in a 256-QAM method.

Referring to Tables 35 to 42, performance (e.g., reliability) varies according to whether a plurality of bits constituting a modulation symbol correspond to most significant bits (MSBs) or least significant bits (LSBs).

For example, in the case of 16-QAM, from among four (4) bits constituting a modulation symbol, each of the first and second bits determines a sign of each of the real number component $Re(z_q)$ and the imaginary number component $Im(z_q)$ of a constellation point onto which a modulation symbol is mapped, and the third and fourth bits determine a size of the constellation point onto which the modulation symbol is mapped.

In this case, the first and second bits for determining the sign from among the four (4) bits constituting the modulation symbol have a higher reliability than the third and fourth bits for determining the size.

In another example, in the case of 64-QAM, from among six (6) bits constituting a modulation symbol, each of the first and second bits determines a sign of each of the real number component $Re(z_q)$ and the imaginary number component $Im(z_q)$ of a constellation point onto which the modulation symbol is mapped. In addition, the third to sixth bits determine a size of the constellation point onto which the modulation symbol is mapped. From among these bits, the third and fourth bits determine a relatively large size, and the fifth and sixth bits determine a relatively small size (for example, the third bit determines which of sizes (-7, -5) and (-3, -1) corresponds to the constellation point onto which the modulation symbol is mapped, and, when (-7, -5) is determined by the third bit, the fourth bit determines which of -7 and -5 corresponds to the size of the constellation point.).

In this case, the first and second bits for determining the sign from among the six bits constituting the modulation symbol have the highest reliability, and the third and fourth bits for determining the relatively large size has the higher reliability than the fifth and sixth bits for determining the relatively small size.

As described above, in the case of the uniform constellation method, the bits constituting a modulation symbol have different reliability according to mapping locations in the modulation symbol.

The modulator 130 may modulate by mapping cells output from the demultiplexer (not shown) onto constellation points in a non-uniform constellation (NUC) method.

Specifically, the modulator 130 may modulate bits output from the demultiplexer (not shown) in various modulation methods such as non-uniform 16-QAM, non-uniform 64-QAM, non-uniform 256-QAM, non-uniform 1024-QAM, non-uniform 4096-QAM, etc.

Hereinafter, a method for generating a modulation symbol by using the non-uniform constellation method according to an exemplary embodiment will be explained.

First, the non-uniform constellation method has the following characteristics:

In the non-uniform constellation method, the constellation points may not regularly be arranged unlike in the uniform constellation method. Accordingly, when the non-uniform constellation method is used, performance for a signal-to-noise ratio (SNR) less than a specific value can be improved and a high SNR gain can be obtained in comparison to the uniform constellation method.

In addition, the characteristics of the constellation may be determined by one or more parameters such as a distance between constellation points. Since the constellation points are regularly distributed in the uniform constellation, the number of parameters for specifying the uniform constellation method may be one (1). However, the number of parameters necessary for specifying the non-uniform constellation method is relatively larger and the number of parameters increases as the constellation (e.g., the number of constellation points) increases.

In the case of the non-uniform constellation method, an x-axis and a y-axis may be designed to be symmetric to each other or may be designed to be asymmetric to each other. When the x-axis and the y-axis are designed to be asymmetric to each other, improved performance can be guaranteed, but decoding complexity may increase.

Hereinafter, an example of a case in which the x-axis and the y-axis are designed to be asymmetric to each other will be explained. In this case, once a constellation point of the first quadrant is defined, locations of constellation points in the other three quadrants may be determined as follows. For example, when a set of constellation points defined for the first quadrant is X, the set becomes −conj(X) in the case of the second quadrant, becomes conj(X) in the case of the third quadrant, and becomes −(X) in the case of the fourth quadrant.

That is, once the first quadrant is defined, the other quadrants may be expressed as follows:
1 Quarter (first quadrant)=X
2 Quarter (second quadrant)=−conj(X)
3 Quarter (third quadrant)=conj(X)
4 Quarter (fourth quadrant)=−X Specifically, when the non-uniform M-QAM is used, M number of constellation points may be defined as $z=\{z_0, z_1, \ldots, z_{M-1}\}$. In this case, when the constellation points existing in the first quadrant are defined as $\{x_0, x_1, x_2, \ldots, x_{M/4-1}\}$, z may be defined as follows:
from $z_0$ to $z_{M/4-1}$=from $x_0$ to $x_{M/4}$
from $z_{M/4}$ to $z_{2xM/4-1}$=−conj(from $x_0$ to $x_{M/4}$)
from $z_{2xM/4}$ to $z_{3xM/4-1}$=conj(from $x_0$ to $x_{M/4}$)
from $z_{3xM/4}$ to $z_{4xM/4-1}$=−(from $x_0$ to $x_{M/4}$)

Accordingly, the modulator 130 may map the bits $[y_0, \ldots, y_{m-1}]$ output from the demultiplexer (not shown) onto constellation points in the non-uniform constellation method by mapping the output bits onto $z_L$ having an index of $$L = \sum_{i=0}^{m-1} (y_1 \times 2^{m-1}).$$

An example of the constellation of the non-uniform constellation method is illustrated in FIGS. 15 to 19.

An example of the method for modulating asymmetrically in the non-uniform constellation method in the modulator 130 is illustrated as in Tables 43 to 46 presented below. That is, according to an exemplary embodiment, modulation is performed in the non-uniform constellation method by defining constellation points existing in the first quadrant and defining constellations points existing in the other quadrants based on Tables 43 to 46.

TABLE 43

| | Shape | | | |
|---|---|---|---|---|
| x | R6/15 | R7/15 | R8/15 | R9/15 |
| x0 | 0.4530 + 0.2663i | 1.2103 + 0.5026i | 0.4819 + 0.2575 | 0.4909 + 1.2007 |
| x1 | 0.2663 + 0.4530i | 0.5014 + 1.2103i | 0.2575 + 0.4819 | 1.2007 + 0.4909 |
| x2 | 1.2092 + 0.5115i | 0.4634 + 0.2624i | 1.2068 + 0.4951 | 0.2476 + 0.5065 |
| x3 | 0.5115 + 1.2092i | 0.2624 + 0.4627i | 0.4951 + 1.2068 | 0.5053 + 0.2476 |

| | Shape | | | |
|---|---|---|---|---|
| x | R10/15 | R11/15 | R12/15 | R13/15 |
| x0 | 0.2173 + 0.4189i | 0.9583 + 0.9547i | 0.2999 + 0.2999i | 0.9517 + 0.9511i |
| x1 | 0.6578 + 0.2571i | 0.9547 + 0.2909i | 0.9540 + 0.2999i | 0.9524 + 0.3061i |
| x2 | 0.4326 + 1.1445i | 0.2921 + 0.9583i | 0.2999 + 0.9540i | 0.3067 + 0.9524i |
| x3 | 1.2088 + 0.5659i | 0.2909 + 0.2927i | 0.9540 + 0.9540i | 0.3061 + 0.3067i |

TABLE 44

| | Shap | | | |
|---|---|---|---|---|
| x | R64_6/15 | R64_7/15 | R64_8/15 | R64_9/15 |
| x0 | 0.4387 + 1.6023 | 0.3352 + 0.6028 | 1.4827 + 0.2920 | 0.3547 + 0.6149 |
| x1 | 1.6023 + 0.4387 | 0.2077 + 0.6584 | 1.2563 + 0.8411 | 0.1581 + 0.6842 |
| x2 | 0.8753 + 1.0881 | 0.1711 + 0.3028 | 1.0211 + 0.2174 | 0.1567 + 0.2749 |
| x3 | 1.0881 + 0.8753 | 0.1556 + 0.3035 | 0.8798 + 0.5702 | 0.1336 + 0.2700 |
| x4 | 0.2202 + 0.9238 | 0.6028 + 0.3345 | 0.2920 + 1.4827 | 0.6177 + 0.4030 |

TABLE 44-continued

| | | Shap | | |
|---|---|---|---|---|
| x5 | 0.2019 + 0.7818 | 0.6577 + 0.2084 | 0.8410 + 1.2563 | 0.7262 + 0.1756 |
| x6 | 0.3049 + 0.8454 | 0.3021 + 0.1711 | 0.2174 + 1.0211 | 0.3568 + 0.1756 |
| x7 | 0.2653 + 0.7540 | 0.3028 + 0.1556 | 0.5702 + 0.8798 | 0.3771 + 0.1336 |
| x8 | 0.7818 + 0.2019 | 0.5556 + 0.8922 | 0.3040 + 0.1475 | 0.5639 + 0.8864 |
| x9 | 0.9238 + 0.2202 | 0.2352 + 1.0190 | 0.3028 + 0.1691 | 0.1980 + 1.0277 |
| x10 | 0.7540 + 0.2653 | 0.8450 + 1.2619 | 0.6855 + 0.1871 | 0.8199 + 1.2515 |
| x11 | 0.8454 + 0.3049 | 0.2922 + 1.4894 | 0.6126 + 0.3563 | 0.2854 + 1.4691 |
| x12 | 0.2675 + 0.2479 | 0.8929 + 0.5549 | 0.1475 + 0.3040 | 0.8654 + 0.6058 |
| x13 | 0.2479 + 0.2675 | 1.0197 + 0.2359 | 0.1691 + 0.3028 | 1.0382 + 0.2141 |
| x14 | 0.2890 + 0.2701 | 1.2626 + 0.8457 | 0.1871 + 0.6855 | 1.2362 + 0.8416 |
| x15 | 0.2701 + 0.2890 | 1.4894 + 0.2922 | 0.3563 + 0.6126 | 1.4663 + 0.2973 |

| | | Shap | | |
|---|---|---|---|---|
| x | R64_10/15 | R64_11/15 | R64_12/15 | E64_13/15 |
| x0 | 1.4388 + 0.2878 | 0.3317 + 0.6970 | 1.0854 + 0.5394 | 0.4108 + 0.7473 |
| x1 | 1.2150 + 0.8133 | 0.1386 + 0.8824 | 0.7353 + 0.4623 | 0.1343 + 0.5338 |
| x2 | 1.0386 + 0.2219 | 0.1323 + 0.4437 | 1.0474 + 0.1695 | 0.1570 + 0.9240 |
| x3 | 0.8494 + 0.6145 | 0.1015 + 0.1372 | 0.7243 + 0.1504 | 0.1230 + 0.1605 |
| x4 | 0.2931 + 1.4656 | 0.5682 + 0.4500 | 1.0693 + 0.9408 | 0.6285 + 0.4617 |
| x5 | 0.8230 + 1.2278 | 0.6739 + 0.1435 | 0.7092 + 0.8073 | 0.3648 + 0.3966 |
| x6 | 0.2069 + 1.0649 | 0.3597 + 0.3401 | 1.4261 + 0.2216 | 0.6907 + 0.1541 |
| x7 | 0.5677 + 0.8971 | 0.3660 + 0.1204 | 0.6106 + 1.1783 | 0.3994 + 0.1308 |
| x8 | 0.4119 + 0.1177 | 0.6004 + 0.8922 | 0.1392 + 0.4078 | 0.7268 + 0.8208 |
| x9 | 0.3998 + 0.2516 | 0.2120 + 1.2253 | 0.4262 + 0.4205 | 1.0463 + 0.9495 |
| x10 | 0.7442 + 0.1559 | 0.9594 + 1.0714 | 0.1407 + 0.1336 | 0.1866 + 1.2733 |
| x11 | 0.5954 + 0.4328 | 0.5829 + 1.3995 | 0.4265 + 0.1388 | 0.5507 + 1.1793 |
| x12 | 0.1166 + 0.1678 | 0.8439 + 0.5675 | 0.1388 + 0.7057 | 0.9283 + 0.5140 |
| x13 | 0.1582 + 0.3325 | 0.9769 + 0.1959 | 0.4197 + 0.7206 | 1.2648 + 0.5826 |
| x14 | 0.1355 + 0.7408 | 1.2239 + 0.6760 | 0.1682 + 1.0316 | 0.9976 + 0.1718 |
| x15 | 0.3227 + 0.6200 | 1.3653 + 0.2323 | 0.2287 + 1.3914 | 1.3412 + 0.1944 |

TABLE 45

| | | Shap | | |
|---|---|---|---|---|
| x | NUC_64_6/15 | NUC_64_7/15 | NUC_64_8/15 | NUC_64_9/15 |
| x0 | 0.4387 + 1.6023 | 0.3352 + 0.6028 | 1.4827 + 0.2920 | 0.3547 + 0.6149 |
| x1 | 1.6023 + 0.4387 | 0.2077 + 0.6584 | 1.2563 + 0.8411 | 0.1581 + 0.6842 |
| x2 | 0.8753 + 1.0881 | 0.1711 + 0.3028 | 1.0211 + 0.2174 | 0.1567 + 0.2749 |
| x3 | 1.0881 + 0.8753 | 0.1556 + 0.3035 | 0.8798 + 0.5702 | 0.1336 + 0.2700 |
| x4 | 0.2202 + 0.9238 | 0.6028 + 0.3345 | 0.2920 + 1.4827 | 0.6177 + 0.4030 |
| x5 | 0.2019 + 0.7818 | 0.6577 + 0.2084 | 0.8410 + 1.2563 | 0.7262 + 0.1756 |
| x6 | 0.3049 + 0.8454 | 0.3021 + 0.1711 | 0.2174 + 1.0211 | 0.3568 + 0.1756 |
| x7 | 0.2653 + 0.7540 | 0.3028 + 0.1556 | 0.5702 + 0.8798 | 0.3771 + 0.1336 |
| x8 | 0.7818 + 0.2019 | 0.5556 + 0.8922 | 0.3040 + 0.1475 | 0.5639 + 0.8864 |
| x9 | 0.9238 + 0.2202 | 0.2352 + 1.0190 | 0.3028 + 0.1691 | 0.1980 + 1.0277 |
| x10 | 0.7540 + 0.2653 | 0.8450 + 1.2619 | 0.6855 + 0.1871 | 0.8199 + 1.2515 |
| x11 | 0.8454 + 0.3049 | 0.2922 + 1.4894 | 0.6126 + 0.3563 | 0.2854 + 1.4691 |
| x12 | 0.2675 + 0.2479 | 0.8929 + 0.5549 | 0.1475 + 0.3040 | 0.8654 + 0.6058 |
| x13 | 0.2479 + 0.2675 | 1.0197 + 0.2359 | 0.1691 + 0.3028 | 1.0382 + 0.2141 |
| x14 | 0.2890 + 0.2701 | 1.2626 + 0.8457 | 0.1871 + 0.6855 | 1.2362 + 0.8416 |
| x15 | 0.2701 + 0.2890 | 1.4894 + 0.2922 | 0.3563 + 0.6126 | 1.4663 + 0.2973 |

| | | Shap | | |
|---|---|---|---|---|
| x | NUC_64_10/1 | NUC_64_11/1 | NUC_64_12/1 | NUC_64_13/1 |
| x0 | 1.4388 + 0.2878 | 0.3317 + 0.6970 | 1.0854 + 0.5394 | 0.4108 + 0.7473 |
| x1 | 1.2150 + 0.8133 | 0.1386 + 0.8824 | 0.7353 + 0.4623 | 0.1343 + 0.5338 |
| x2 | 1.0386 + 0.2219 | 0.1323 + 0.4437 | 1.0474 + 0.1695 | 0.1570 + 0.9240 |
| x3 | 0.8494 + 0.6145 | 0.1015 + 0.1372 | 0.7243 + 0.1504 | 0.1230 + 0.1605 |
| x4 | 0.2931 + 1.4656 | 0.5682 + 0.4500 | 1.0693 + 0.9408 | 0.6285 + 0.4617 |
| x5 | 0.8230 + 1.2278 | 0.6739 + 0.1435 | 0.7092 + 0.8073 | 0.3648 + 0.3966 |
| x6 | 0.2069 + 1.0649 | 0.3597 + 0.3401 | 1.4261 + 0.2216 | 0.6907 + 0.1541 |
| x7 | 0.5677 + 0.8971 | 0.3660 + 0.1204 | 0.6106 + 1.1783 | 0.3994 + 0.1308 |
| x8 | 0.4119 + 0.1177 | 0.6004 + 0.8922 | 0.1392 + 0.4078 | 0.7268 + 0.8208 |
| x9 | 0.3998 + 0.2516 | 0.2120 + 1.2253 | 0.4262 + 0.4205 | 1.0463 + 0.9495 |
| x10 | 0.7442 + 0.1559 | 0.9594 + 1.0714 | 0.1407 + 0.1336 | 0.1866 + 1.2733 |
| x11 | 0.5954 + 0.4328 | 0.5829 + 1.3995 | 0.4265 + 0.1388 | 0.5507 + 1.1793 |
| x12 | 0.1166 + 0.1678 | 0.8439 + 0.5675 | 0.1388 + 0.7057 | 0.9283 + 0.5140 |
| x13 | 0.1582 + 0.3325 | 0.9769 + 0.1959 | 0.4197 + 0.7206 | 1.2648 + 0.5826 |
| x14 | 0.1355 + 0.7408 | 1.2239 + 0.6760 | 0.1682 + 1.0316 | 0.9976 + 0.1718 |
| x15 | 0.3227 + 0.6200 | 1.3653 + 0.2323 | 0.2287 + 1.3914 | 1.3412 + 0.1944 |

TABLE 46

| x | Shape | | | |
|---|---|---|---|---|
| | R6/15 | R7/15 | R8/15 | R9/15 |
| x0 | 0.6800 + 1.6926i | 1.2905 + 1.3099i | 1.0804 + 1.3788i | 1.3231 + 1.1506i |
| x1 | 0.3911 + 1.3645i | 1.0504 + 0.9577i | 1.0487 + 0.9862i | 0.9851 + 1.2311i |
| x2 | 0.2191 + 1.7524i | 1.5329 + 0.8935i | 1.6464 + 0.7428i | 1.1439 + 0.8974i |
| x3 | 0.2274 + 1.4208i | 1.1577 + 0.8116i | 1.3245 + 0.9414i | 0.9343 + 0.9271i |
| x4 | 0.8678 + 1.2487i | 1.7881 + 0.2509i | 0.7198 + 1.2427i | 1.5398 + 0.7962i |
| x5 | 0.7275 + 1.1667i | 1.4275 + 0.1400i | 0.8106 + 1.0040i | 0.9092 + 0.5599i |
| x6 | 0.8747 + 1.0470i | 1.4784 + 0.5201i | 0.5595 + 1.0317i | 1.2222 + 0.6574i |
| x7 | 0.7930 + 1.0406i | 1.3408 + 0.4346i | 0.6118 + 0.9722i | 0.9579 + 0.6373i |
| x8 | 0.2098 + 0.9768i | 0.7837 + 0.5867i | 1.6768 + 0.2002i | 0.7748 + 1.5867i |
| x9 | 0.2241 + 1.0454i | 0.8250 + 0.6455i | 0.9997 + 0.6844i | 0.6876 + 1.2489i |
| x10 | 0.1858 + 0.9878i | 0.8256 + 0.5601i | 1.4212 + 0.4769i | 0.5992 + 0.9208i |
| x11 | 0.1901 + 1.0659i | 0.8777 + 0.6110i | 1.1479 + 0.6312i | 0.6796 + 0.9743i |
| x12 | 0.5547 + 0.8312i | 1.0080 + 0.1843i | 0.6079 + 0.6566i | 0.5836 + 0.5879i |
| x13 | 0.5479 + 0.8651i | 1.0759 + 0.1721i | 0.7284 + 0.6957i | 0.6915 + 0.5769i |
| x14 | 0.6073 + 0.8182i | 1.0056 + 0.2758i | 0.5724 + 0.7031i | 0.5858 + 0.7058i |
| x15 | 0.5955 + 0.8420i | 1.0662 + 0.2964i | 0.6302 + 0.7259i | 0.6868 + 0.6793i |
| x16 | 1.4070 + 0.1790i | 0.8334 + 1.5554i | 0.1457 + 1.4010i | 1.6118 + 0.1497i |
| x17 | 1.7227 + 0.2900i | 0.8165 + 1.1092i | 0.1866 + 1.7346i | 0.9511 + 0.1140i |
| x18 | 1.3246 + 0.2562i | 0.6092 + 1.2729i | 0.1174 + 1.1035i | 1.2970 + 0.1234i |
| x19 | 1.3636 + 0.3654i | 0.6728 + 1.1456i | 0.1095 + 1.0132i | 1.0266 + 0.1191i |
| x20 | 1.3708 + 1.2834i | 0.3061 + 1.7469i | 0.4357 + 1.3636i | 1.5831 + 0.4496i |
| x21 | 1.6701 + 0.8403i | 0.1327 + 1.4056i | 0.5853 + 1.6820i | 0.9328 + 0.3586i |
| x22 | 1.1614 + 0.7909i | 0.3522 + 1.3414i | 0.3439 + 1.0689i | 1.2796 + 0.3894i |
| x23 | 1.2241 + 0.7367i | 0.2273 + 1.3081i | 0.3234 + 0.9962i | 1.0188 + 0.3447i |
| x24 | 0.9769 + 0.1863i | 0.5007 + 0.8098i | 0.1092 + 0.6174i | 0.5940 + 0.1059i |
| x25 | 0.9452 + 0.2057i | 0.5528 + 0.8347i | 0.1074 + 0.6307i | 0.7215 + 0.1100i |
| x26 | 1.0100 + 0.2182i | 0.4843 + 0.8486i | 0.1109 + 0.6996i | 0.5863 + 0.1138i |
| x27 | 0.9795 + 0.2417i | 0.5304 + 0.8759i | 0.1076 + 0.7345i | 0.6909 + 0.1166i |
| x28 | 0.8241 + 0.4856i | 0.1715 + 0.9147i | 0.3291 + 0.6264i | 0.5843 + 0.3604i |
| x29 | 0.8232 + 0.4837i | 0.1540 + 0.9510i | 0.3126 + 0.6373i | 0.6970 + 0.3592i |
| x30 | 0.8799 + 0.5391i | 0.1964 + 0.9438i | 0.3392 + 0.6999i | 0.5808 + 0.3250i |
| x31 | 0.8796 + 0.5356i | 0.1788 + 0.9832i | 0.3202 + 0.7282i | 0.6678 + 0.3290i |
| x32 | 0.1376 + 0.3342i | 0.3752 + 0.1667i | 0.9652 + 0.1066i | 0.1406 + 1.6182i |
| x33 | 0.1383 + 0.3292i | 0.3734 + 0.1667i | 0.9075 + 0.1666i | 0.1272 + 1.2984i |
| x34 | 0.1363 + 0.3322i | 0.3758 + 0.1661i | 0.9724 + 0.1171i | 0.1211 + 0.9644i |
| x35 | 0.1370 + 0.3273i | 0.3746 + 0.1649i | 0.9186 + 0.1752i | 0.1220 + 1.0393i |
| x36 | 0.1655 + 0.3265i | 0.4013 + 0.1230i | 0.6342 + 0.1372i | 0.1124 + 0.6101i |
| x37 | 0.1656 + 0.3227i | 0.4001 + 0.1230i | 0.6550 + 0.1495i | 0.1177 + 0.6041i |
| x38 | 0.1634 + 0.3246i | 0.4037 + 0.1230i | 0.6290 + 0.1393i | 0.1136 + 0.7455i |
| x39 | 0.1636 + 0.3208i | 0.4019 + 0.1218i | 0.6494 + 0.1504i | 0.1185 + 0.7160i |
| x40 | 0.1779 + 0.6841i | 0.6025 + 0.3934i | 1.3127 + 0.1240i | 0.4324 + 1.5679i |
| x41 | 0.1828 + 0.6845i | 0.5946 + 0.3928i | 0.9572 + 0.4344i | 0.3984 + 1.2825i |
| x42 | 0.1745 + 0.6828i | 0.6116 + 0.3879i | 1.2403 + 0.2631i | 0.3766 + 0.9534i |
| x43 | 0.1793 + 0.6829i | 0.6019 + 0.3837i | 1.0254 + 0.4130i | 0.3668 + 1.0301i |
| x44 | 0.3547 + 0.6009i | 0.7377 + 0.1618i | 0.6096 + 0.4214i | 0.3667 + 0.5995i |
| x45 | 0.3593 + 0.6011i | 0.7298 + 0.1582i | 0.6773 + 0.4284i | 0.3328 + 0.5960i |
| x46 | 0.3576 + 0.5990i | 0.7274 + 0.1782i | 0.5995 + 0.4102i | 0.3687 + 0.7194i |
| x47 | 0.3624 + 0.5994i | 0.7165 + 0.1746i | 0.6531 + 0.4101i | 0.3373 + 0.6964i |
| x48 | 0.2697 + 0.1443i | 0.1509 + 0.2425i | 0.1250 + 0.1153i | 0.1065 + 0.1146i |
| x49 | 0.2704 + 0.1433i | 0.1503 + 0.2400i | 0.1252 + 0.1158i | 0.1145 + 0.1108i |
| x50 | 0.2644 + 0.1442i | 0.1515 + 0.2437i | 0.1245 + 0.1152i | 0.1053 + 0.1274i |
| x51 | 0.2650 + 0.1432i | 0.1503 + 0.2425i | 0.1247 + 0.1156i | 0.1134 + 0.1236i |
| x52 | 0.2763 + 0.1638i | 0.1285 + 0.2388i | 0.3768 + 0.1244i | 0.1111 + 0.3821i |
| x53 | 0.2768 + 0.1626i | 0.1279 + 0.2419i | 0.3707 + 0.1237i | 0.1186 + 0.3867i |
| x54 | 0.2715 + 0.1630i | 0.1279 + 0.2431i | 0.3779 + 0.1260i | 0.1080 + 0.3431i |
| x55 | 0.2719 + 0.1618i | 0.1279 + 0.2406i | 0.3717 + 0.1252i | 0.1177 + 0.3459i |
| x56 | 0.6488 + 0.1696i | 0.3394 + 0.5764i | 0.1161 + 0.3693i | 0.3644 + 0.1080i |
| x57 | 0.6462 + 0.1706i | 0.3364 + 0.5722i | 0.1157 + 0.3645i | 0.3262 + 0.1104i |
| x58 | 0.6456 + 0.1745i | 0.3328 + 0.5758i | 0.1176 + 0.3469i | 0.3681 + 0.1173i |
| x59 | 0.6431 + 0.1753i | 0.3303 + 0.5698i | 0.1171 + 0.3424i | 0.3289 + 0.1196i |
| x60 | 0.5854 + 0.3186i | 0.1491 + 0.6316i | 0.3530 + 0.3899i | 0.3665 + 0.3758i |
| x61 | 0.5862 + 0.3167i | 0.1461 + 0.6280i | 0.3422 + 0.3808i | 0.3310 + 0.3795i |
| x62 | 0.5864 + 0.3275i | 0.1509 + 0.6280i | 0.3614 + 0.3755i | 0.3672 + 0.3353i |
| x63 | 0.5873 + 0.3254i | 0.1473 + 0.6225i | 0.3509 + 0.3656i | 0.3336 + 0.3402i |

| x | Shape | | | |
|---|---|---|---|---|
| | R10/15 | R11/15 | R12/15 | R13/15 |
| x0 | 1.6097 + 0.1548i | 0.3105 + 0.3382i | 1.1014 + 1.1670i | 0.3556 + 0.3497i |
| x1 | 1.5549 + 0.4605i | 0.4342 + 0.3360i | 0.8557 + 1.2421i | 0.3579 + 0.4945i |
| x2 | 1.3226 + 0.1290i | 0.3149 + 0.4829i | 1.2957 + 0.8039i | 0.5049 + 0.3571i |
| x3 | 1.2772 + 0.3829i | 0.4400 + 0.4807i | 1.0881 + 0.8956i | 0.5056 + 0.5063i |
| x4 | 1.2753 + 1.0242i | 0.1811 + 0.3375i | 0.5795 + 1.2110i | 0.2123 + 0.3497i |
| x5 | 1.4434 + 0.7540i | 0.0633 + 0.3404i | 0.6637 + 1.4215i | 0.2116 + 0.4900i |
| x6 | 1.0491 + 0.8476i | 0.1818 + 0.4851i | 0.6930 + 1.0082i | 0.0713 + 0.3489i |

TABLE 46-continued

| | | | | |
|---|---|---|---|---|
| x7  | 1.1861 + 0.6253i | 0.0633 + 0.4815i | 0.8849 + 0.9647i | 0.0690 + 0.4960i |
| x8  | 0.9326 + 0.0970i | 0.3084 + 0.1971i | 1.2063 + 0.5115i | 0.3527 + 0.2086i |
| x9  | 0.8962 + 0.2804i | 0.4356 + 0.1993i | 1.0059 + 0.4952i | 0.3497 + 0.0713i |
| x10 | 1.1044 + 0.1102i | 0.3098 + 0.0676i | 1.4171 + 0.5901i | 0.4960 + 0.2123i |
| x11 | 1.0648 + 0.3267i | 0.4342 + 0.0691i | 1.0466 + 0.6935i | 0.4974 + 0.0698i |
| x12 | 0.7325 + 0.6071i | 0.1775 + 0.1985i | 0.6639 + 0.6286i | 0.2086 + 0.2079i |
| x13 | 0.8260 + 0.4559i | 0.0640 + 0.1978i | 0.8353 + 0.5851i | 0.2094 + 0.0690i |
| x14 | 0.8744 + 0.7153i | 0.1775 + 0.0676i | 0.6879 + 0.8022i | 0.0676 + 0.2079i |
| x15 | 0.9882 + 0.5300i | 0.0647 + 0.0669i | 0.8634 + 0.7622i | 0.0698 + 0.0683i |
| x16 | 0.1646 + 1.6407i | 0.7455 + 0.3411i | 0.1213 + 1.4366i | 0.3586 + 0.7959i |
| x17 | 0.4867 + 1.5743i | 0.5811 + 0.3396i | 0.1077 + 1.2098i | 0.3571 + 0.6392i |
| x18 | 0.1363 + 1.3579i | 0.7556 + 0.4669i | 0.0651 + 0.9801i | 0.5034 + 0.8271i |
| x19 | 0.4023 + 1.3026i | 0.5862 + 0.4756i | 0.2009 + 1.0115i | 0.5063 + 0.6600i |
| x20 | 1.0542 + 1.2584i | 0.9556 + 0.3280i | 0.3764 + 1.4264i | 0.2146 + 0.7862i |
| x21 | 0.7875 + 1.4450i | 1.1767 + 0.3091i | 0.3237 + 1.2130i | 0.2109 + 0.6340i |
| x22 | 0.8687 + 1.0407i | 0.9673 + 0.4720i | 0.5205 + 0.9814i | 0.0713 + 0.8093i |
| x23 | 0.6502 + 1.1951i | 1.2051 + 0.5135i | 0.3615 + 1.0163i | 0.0698 + 0.6467i |
| x24 | 0.0982 + 0.9745i | 0.7367 + 0.2015i | 0.0715 + 0.6596i | 0.2799 + 1.0862i |
| x25 | 0.2842 + 0.9344i | 0.5811 + 0.2015i | 0.2116 + 0.6597i | 0.2806 + 1.2755i |
| x26 | 0.1142 + 1.1448i | 0.7316 + 0.0669i | 0.0729 + 0.8131i | 0.4328 + 0.9904i |
| x27 | 0.3385 + 1.0973i | 0.5782 + 0.0669i | 0.2158 + 0.8246i | 0.4551 + 1.1812i |
| x28 | 0.6062 + 0.7465i | 0.9062 + 0.1971i | 0.5036 + 0.6467i | 0.2309 + 0.9414i |
| x29 | 0.4607 + 0.8538i | 1.2829 + 0.1185i | 0.3526 + 0.6572i | 0.1077 + 1.3891i |
| x30 | 0.7263 + 0.8764i | 0.9156 + 0.0735i | 0.5185 + 0.8086i | 0.0772 + 0.9852i |
| x31 | 0.5450 + 1.0067i | 1.1011 + 0.0735i | 0.3593 + 0.8245i | 0.0802 + 1.1753i |
| x32 | 0.2655 + 0.0746i | 0.3244 + 0.8044i | 1.2545 + 0.1010i | 0.8301 + 0.3727i |
| x33 | 0.2664 + 0.0759i | 0.4589 + 0.8218i | 1.0676 + 0.0956i | 0.8256 + 0.5556i |
| x34 | 0.4571 + 0.0852i | 0.3207 + 0.6415i | 1.4782 + 0.1167i | 0.6593 + 0.3668i |
| x35 | 0.4516 + 0.1062i | 0.4509 + 0.6371i | 0.8981 + 0.0882i | 0.6623 + 0.5182i |
| x36 | 0.2559 + 0.1790i | 0.1920 + 0.8196i | 0.5518 + 0.0690i | 1.0186 + 0.3645i |
| x37 | 0.2586 + 0.1772i | 0.0633 + 0.8167i | 0.6903 + 0.0552i | 1.0001 + 0.5242i |
| x38 | 0.3592 + 0.2811i | 0.1811 + 0.6371i | 0.5742 + 0.1987i | 1.1857 + 0.2725i |
| x39 | 0.3728 + 0.2654i | 0.0640 + 0.6415i | 0.7374 + 0.1564i | 1.3928 + 0.3408i |
| x40 | 0.7706 + 0.0922i | 0.3331 + 1.0669i | 1.2378 + 0.3049i | 0.8011 + 0.2227i |
| x41 | 0.7407 + 0.2260i | 0.4655 + 1.0087i | 1.0518 + 0.3032i | 0.7981 + 0.0735i |
| x42 | 0.6180 + 0.0927i | 0.3433 + 1.2865i | 1.4584 + 0.3511i | 0.6459 + 0.2198i |
| x43 | 0.6019 + 0.1658i | 0.5004 + 1.5062i | 0.9107 + 0.2603i | 0.6430 + 0.0713i |
| x44 | 0.6007 + 0.4980i | 0.1971 + 1.0051i | 0.6321 + 0.4729i | 0.9681 + 0.2205i |
| x45 | 0.6673 + 0.3928i | 0.0735 + 1.0298i | 0.7880 + 0.4392i | 0.9615 + 0.0735i |
| x46 | 0.4786 + 0.3935i | 0.1498 + 1.5018i | 0.6045 + 0.3274i | 1.3327 + 0.1039i |
| x47 | 0.5176 + 0.3391i | 0.0865 + 1.2553i | 0.7629 + 0.2965i | 1.1359 + 0.0809i |
| x48 | 0.0757 + 0.1003i | 0.7811 + 0.8080i | 0.0596 + 0.0739i | 0.8382 + 0.8709i |
| x49 | 0.0753 + 0.1004i | 0.6167 + 0.8153i | 0.1767 + 0.0731i | 0.8145 + 0.6934i |
| x50 | 0.0777 + 0.4788i | 0.7636 + 0.6255i | 0.0612 + 0.2198i | 0.6645 + 0.8486i |
| x51 | 0.0867 + 0.4754i | 0.6000 + 0.6327i | 0.1815 + 0.2192i | 0.6600 + 0.6786i |
| x52 | 0.1023 + 0.2243i | 0.9898 + 0.7680i | 0.4218 + 0.0715i | 1.1612 + 0.6949i |
| x53 | 0.1010 + 0.2242i | 1.5855 + 0.1498i | 0.2978 + 0.0725i | 0.9785 + 0.6942i |
| x54 | 0.1950 + 0.3919i | 0.9476 + 0.6175i | 0.4337 + 0.2115i | 1.3698 + 0.6259i |
| x55 | 0.1881 + 0.3969i | 1.4625 + 0.4015i | 0.3057 + 0.2167i | 1.2183 + 0.4841i |
| x56 | 0.0930 + 0.8122i | 0.8276 + 1.0225i | 0.0667 + 0.5124i | 0.7989 + 1.0498i |
| x57 | 0.2215 + 0.7840i | 0.6313 + 1.0364i | 0.2008 + 0.5095i | 0.4395 + 1.4203i |
| x58 | 0.0937 + 0.6514i | 0.8815 + 1.2865i | 0.0625 + 0.3658i | 0.6118 + 1.0246i |
| x59 | 0.1540 + 0.6366i | 0.6342 + 1.2705i | 0.1899 + 0.3642i | 0.6303 + 1.2421i |
| x60 | 0.4810 + 0.6306i | 1.0422 + 0.9593i | 0.4818 + 0.4946i | 1.0550 + 0.8924i |
| x61 | 0.3856 + 0.7037i | 1.2749 + 0.8538i | 0.3380 + 0.5050i | 0.8612 + 1.2800i |
| x62 | 0.3527 + 0.5230i | 1.1556 + 1.1847i | 0.4571 + 0.3499i | 1.2696 + 0.8969i |
| x63 | 0.3100 + 0.5559i | 1.4771 + 0.6742i | 0.3216 + 0.3599i | 1.0342 + 1.1181i |

Table 43 indicates non-uniform 16-QAM, Tables 44 and 45 indicate non-uniform 64-QAM, and table 46 indicates non-uniform 256-QAM, and different mapping methods may be applied according to a code rate.

On the other hand, when the non-uniform constellation is designed to have the x-axis and the y-axis symmetric to each other, constellation points may be expressed similarly to those of uniform QAM and an example is illustrated as in Tables 47 to 49 presented below:

TABLE 47

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | $-x_{15}$ | $-x_{14}$ | $-x_{13}$ | $-x_{12}$ | $-x_{11}$ | $-x_{10}$ | $-x_9$ | $-x_8$ | $-x_7$ | $-x_6$ | $-x_5$ | $-x_4$ | $-x_3$ | $-x_2$ | $-x_1$ | $-1$ |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |

TABLE 47-continued

| | | | | | | | | | | | | | | | | |
|---|---|---|---|---|---|---|---|---|---|---|---|---|---|---|---|---|
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | 1 | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ |

TABLE 48

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | $-x_{15}$ | $-x_{14}$ | $-x_{13}$ | $-x_{12}$ | $-x_{11}$ | $-x_{10}$ | $-x_9$ | $-x_8$ | $-x_7$ | $-x_6$ | $-x_5$ | $-x_4$ | $-x_3$ | $-x_2$ | $-x_1$ | $-1$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ |

TABLE 49

| | Shape | | | | | | | |
|---|---|---|---|---|---|---|---|---|
| x | R6/15 | R7/15 | R8/15 | R9/15 | R10/15 | R11/15 | R12/15 | R13/15 |
| x1 | 1.0003 | 1 | 1.0005 | 1 | 1.0772 | 1.16666667 | 2.5983 | 2.85714286 |
| x2 | 1.0149 | 1.04 | 2.0897 | 2.78571429 | 2.8011 | 1.08333333 | 8.5193 | 4.85714286 |
| x3 | 1.0158 | 1.04 | 2.0888 | 2.78571429 | 2.9634 | 3.33333333 | 6.1649 | 6.85714286 |
| x4 | 2.6848 | 3 | 3.9345 | 4.85714286 | 4.8127 | 5.16666667 | 8.2107 | 8.85714286 |
| x5 | 2.6903 | 3.04 | 3.9931 | 4.85714286 | 5.1864 | 5.75 | 9.9594 | 11 |
| x6 | 2.882 | 3.28 | 5.3843 | 6.85714286 | 6.7838 | 7.41666667 | 12.0321 | 13.2857143 |
| x7 | 2.8747 | 3.32 | 5.3893 | 6.85714286 | 7.5029 | 8.5 | 13.9574 | 15.7142857 |
| x8 | 4.7815 | 5.24 | 7.5206 | 9.14285714 | 9.238 | 10.0233333 | 16.2598 | 18.1428571 |
| x9 | 4.7619 | 5.32 | 7.6013 | 9.28571429 | 10.32 | 11.5833333 | 18.4269 | 20.7142857 |
| x10 | 5.5729 | 6.04 | 9.3371 | 11.5714286 | 12.0115 | 13.3333333 | 20.9273 | 23.4285714 |
| x11 | 5.6434 | 6.28 | 9.8429 | 12.2142857 | 13.5356 | 15.25 | 23.4863 | 26.2857143 |
| x12 | 7.3854 | 8.24 | 11.9255 | 14.6428571 | 15.6099 | 17.3333333 | 26.4823 | 29.2857143 |
| x13 | 7.8797 | 8.81 | 13.3962 | 16.4285714 | 17.7524 | 19.75 | 29.7085 | 32.4285714 |
| x14 | 9.635 | 11.04 | 15.8981 | 19.4285714 | 20.5256 | 22.4166667 | 33.6247 | 35.7142857 |
| x15 | 11.7874 | 13.68 | 19.1591 | 23.2857143 | 24.1254 | 25.5833333 | 38.5854 | 39.4285714 |

Tables 47 and 49 are tables for determining the real number component $Re(z_q)$ and the imaginary number component $Im(z_q)$ when modulation is performed in the non-uniform 1024-QAM method. That is, Table 47 indicates the real number part of the 1024-QAM, and Table 48 indicates the imaginary number part of the 1024-QAM. In addition, Table 49 illustrate an example of a case in which modulation is performed in the non-uniform 1024-QAM method, and show $x_i$ values of Tables 47 and 48.

Since the non-uniform constellation method asymmetrically map the modulation symbol onto the constellation point as shown in Tables 47 to 49, modulation symbols mapped onto constellation points may have different decoding performance. That is, bits constituting a modulation symbol may have different performance.

Figure 15:
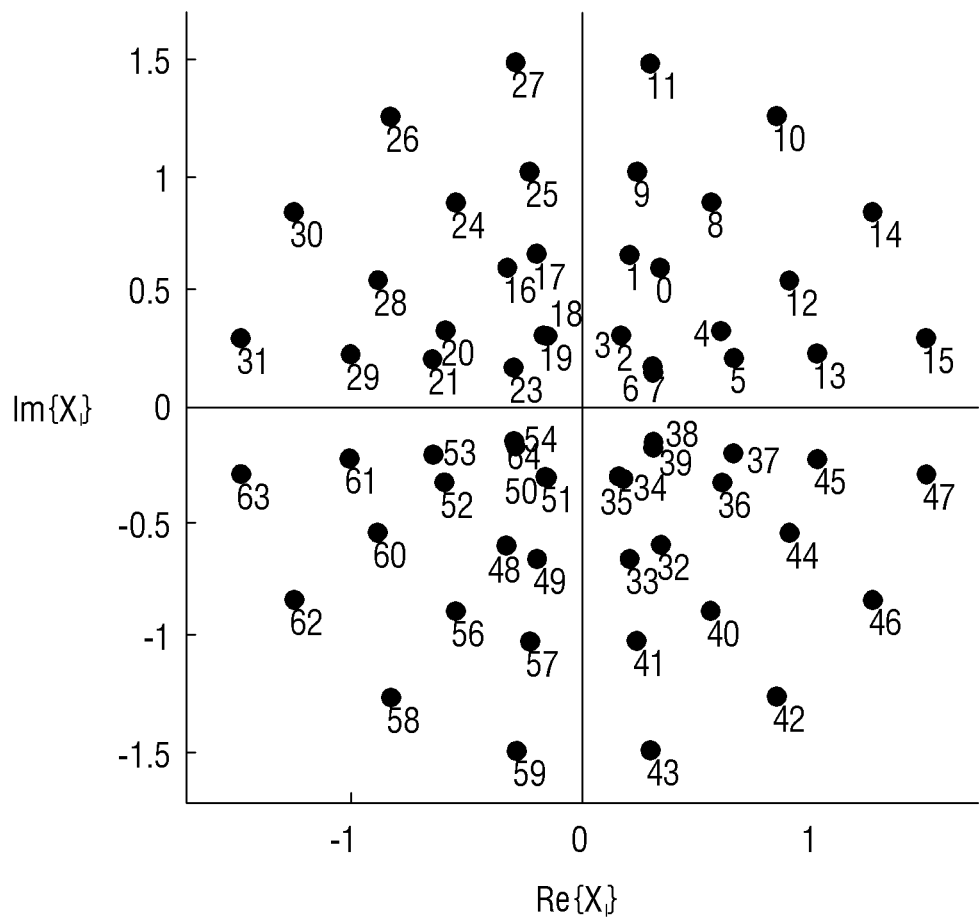
FIGS. 15 to 19 are views to illustrate an example of a non-uniform constellation modulation method according to exemplary embodiments.
Figure 16:
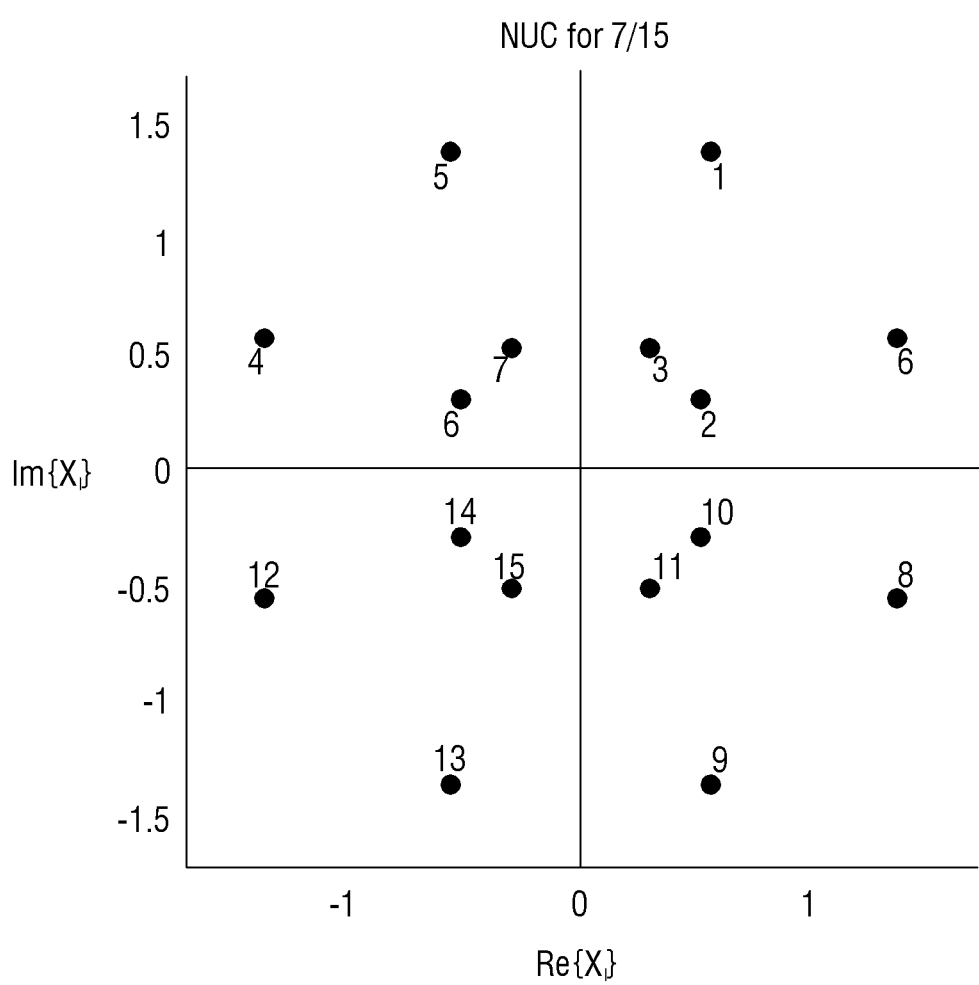
Figure 17:
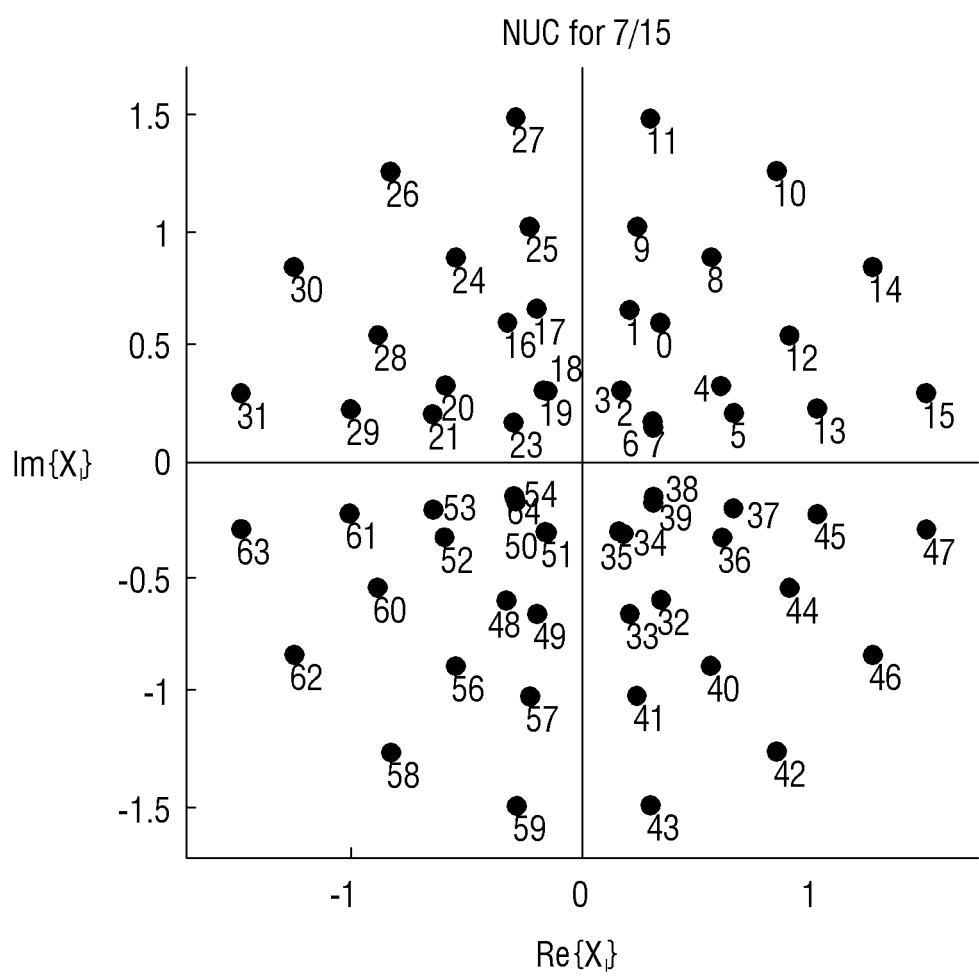
Figure 18:
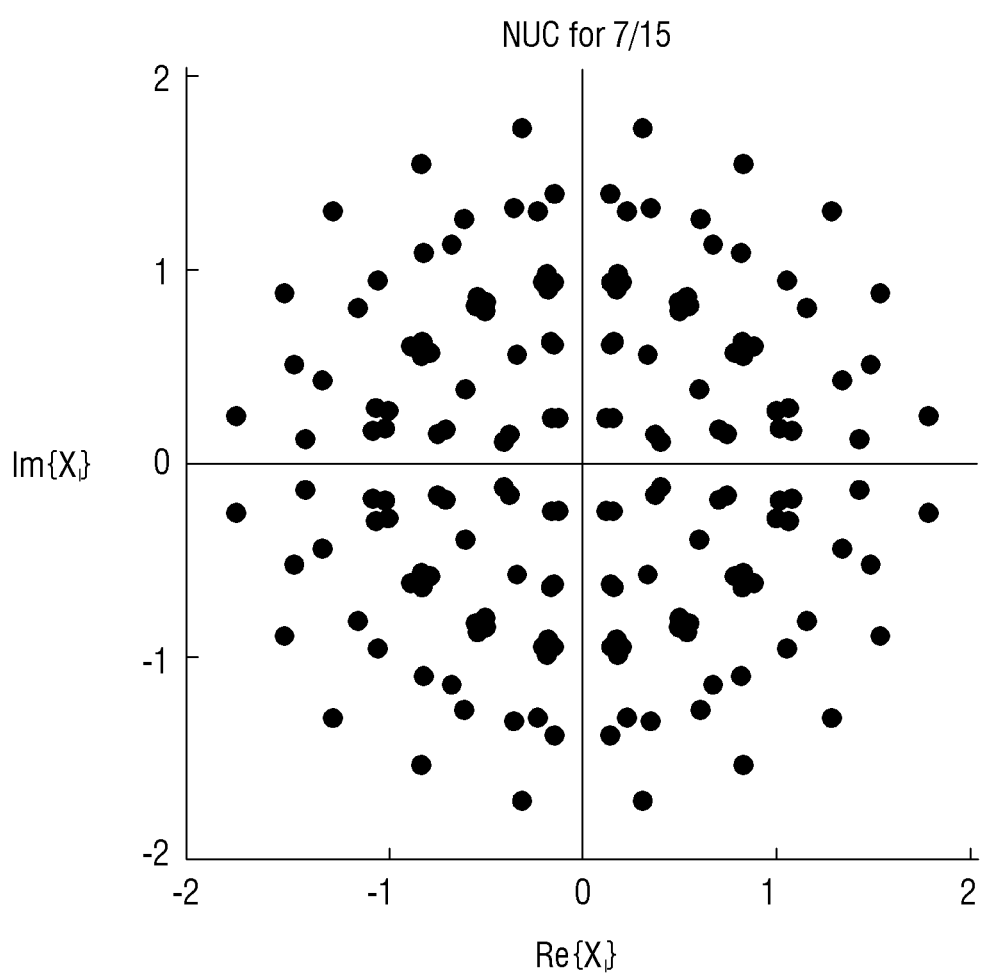
Figure 19:
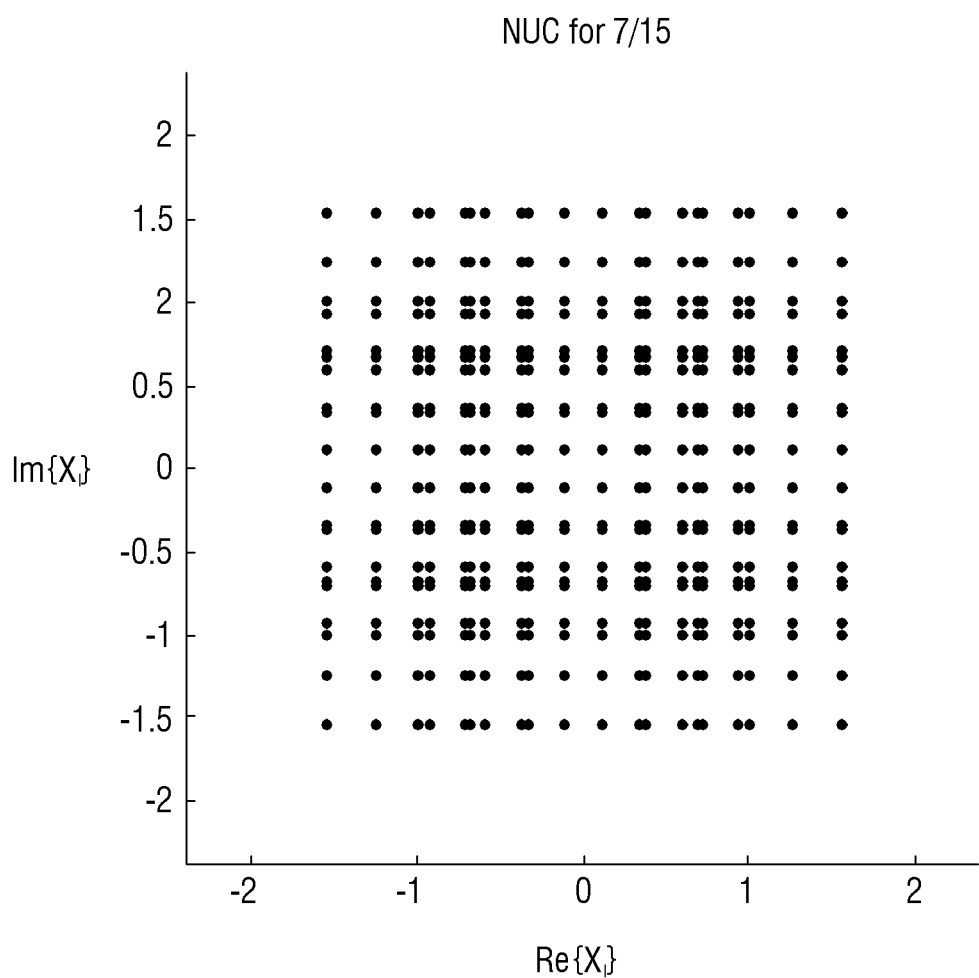

For example, referring to FIG. 15 illustrating an example of a case in which modulation is performed in the non-uniform 64-QAM method, a modulation symbol 10 may be configured as $(y_0, y_1, y_2, y_3, y_4, y_5)=(0, 0, 1, 0, 1, 0)$, and performance (e.g., capacity) of bits constituting the modulation symbol 10 may have a relationship of $C(y_0) > C(y_1) > C(y_2) > C(y_3) > C(y_4) > C(y_5)$.

In addition, it is obvious that the constellation in the uniform constellation method and the non-uniform constellation method may be rotated and/or scaled (herein, the same or different scaling factor may be applied to a real number axis and an imaginary number axis), and other variations can be applied. In addition, the illustrated constellation indicates relevant locations of the constellation points and another constellation can be derived by rotation, scaling and/or other appropriate conversion.

As described above, the modulator 130 may map modulation symbols onto constellation points by using uniform constellation methods and non-uniform constellation methods. In this case, bits constituting a modulation symbol may have different performance as described above.

LDPC codeword bits may have different codeword characteristics according to a configuration of a parity check matrix. That is, the LDPC codeword bits may have different codeword characteristics according to the number of 1 existing in the columns of the parity check matrix, that is, a column degree.

Accordingly, the interleaver 120 may interleave to map the LDPC codeword bits onto modulation symbols by considering both the codeword characteristic of the LDPC codeword bits and the reliability of the bits constituting a modulation symbol.

In particular, since bits constituting a modulation symbol have different performance when a non-uniform QAM is used, the block interleaver 124 configures the number of columns to be identical to the number of bits constituting a modulation symbol such that one of a plurality of groups of an LDPC codeword can be mapped onto bits each of which exists on a same location of each modulation symbol.

That is, when LDPC codeword bits of high decoding performance are mapped onto high reliability bits from among bits of each modulation symbol, a receiver side may show high decoding performance, but there is a problem that the LDPC codeword bits of the high decoding performance are not received. In addition, when the LDPC codeword bits of high decoding performance are mapped onto low reliability bits from among the bits of the modulation symbol, initial reception performance is excellent, and thus, overall performance is also excellent. However, when many bits showing poor decoding performance are received, error propagation may occur.

Accordingly, when LDPC codeword bits are mapped onto modulation symbols, an LDPC codeword bit having a specific codeword characteristic is mapped onto a specific bit of a modulation symbol by considering both codeword characteristics of the LDPC codeword bits and reliability of the bits of the modulation symbol, and is transmitted to a receiver side. Accordingly, the receiver side can achieve both the high reception performance and the high decoding performance.

In this case, since the LDPC codeword is divided into groups each formed of M (=360) number of bits having the same codeword characteristic and the bits are mapped respectively onto a bit of a specific location of each modulation symbol in group units, bits having a specific codeword characteristic can be mapped onto the specific location of each modulation symbol more effectively. In addition, the number of bits constituting the group may be an aliquot part of M as described above. However, the number of codeword bits constituting the group is limited to M for convenience of explanation.

That is, the modulator 130 can map at least one bit included in a predetermined group from among the plurality of groups constituting the LDPC codeword onto a predetermined bit of each modulation symbol. Herein, each of the plurality of groups may be formed of M (=360) number of bits.

For example, in the case of 16-QAM, at least one bit included in a predetermined group from among the plurality of groups may be mapped onto a first bit of each modulation symbol, or may be mapped onto a first bit and a second bit.

The modulator 130 can map at least one bit included in a predetermined group from among the plurality of groups onto a predetermined bit of each modulation symbol for the following reasons.

As described above, the block interleaver 124 interleaves a plurality of groups of an LDPC codeword in group units, the demultiplexer (not shown) demultiplexes bits output from the block interleaver 124, and the modulator 130 maps demultiplexed bits (that is, cells) onto modulation symbols serially.

Accordingly, the group interleaver 122, which is placed before the block interleaver 124, interleaves the LDPC codeword in group units such that groups including bits to be mapped onto bits of specific locations of a modulation symbol can be written in the same column of the block interleaver 124, considering a demultiplexing operation of the demultiplexer (not shown).

Specifically, the group interleaver 122 may rearrange the order of a plurality of groups of an LDPC codeword in group units such that at least one group including bits to be mapped onto the same location of different modulation symbols are serially arranged adjacent to one another, thereby allowing the block interleaver 122 to write a predetermined group on a predetermined column. That is, the group interleaver 122 interleaves the plurality of groups of the LDPC codeword in group units based on the above-described Tables 23 to 27, so that at least one group including bits to be mapped onto the same location of each modulation symbol are arranged to be adjacent to one another, and the block interleaver 124 interleaves by writing the adjacent at least one group on the same column.

Accordingly, the modulator 130 may generate a modulation symbol by mapping a bit output from a predetermined column of the block interleaver 124 onto a predetermined bit of the modulation symbol. In this case, bits included in one group may be mapped onto one bit of each modulation symbol or may be mapped onto two bits of each modulation symbol.

To explain detail, a case in which an LDPC codeword having a length of 16200 is modulated in the non-uniform 64-QAM method will be explained.

The group interleaver 122 divides the LDPC codeword into 16200/360(=45) groups, and interleaves the plurality of groups in group units.

In this case, the group interleaver 122 determines the number of groups to be written in each column of the block interleaver 124 based on the number of columns of the block interleaver 124, and interleaves the plurality of groups in group units based on the determined number of groups.

Herein, groups written in a same column of the block interleaver 124 may be mapped onto a single specific bit or two specific bits from among bits constituting each modulation symbol according to the number of columns of the block interleaver 124. Thus, the group interleaver 122 interleaves the plurality of groups in group units such that groups including bits required to be mapped onto a predetermined bit of each modulation symbol are adjacent to one another and serially arranged, considering bit characteristic of the modulation symbol. In this case, the group interleaver 122 may use the above-described Table 24.

Accordingly, the groups which are adjacent to one another in the LDPC codeword interleaved in group units may be written in the same column of the block interleaver 124, and the bits written in the same column may be mapped onto a single specific bit or two specific bits of each modulation symbol by the modulator 130.

For example, it is assumed that the block interleaver 124 includes as many columns as the number of bits constituting a modulation symbol, that is, six (6) columns. In this case, each column of the block interleaver 124 may be divided into a first part including 2520 rows and a second part including 180 rows, as shown in Table 28 or 32.

Accordingly, the group interleaver 122 performs group interleaving such that 2520/360(=7) groups to be written in the first part of each column of the block interleaver 124 from among the plurality of groups are serially arranged to be adjacent to one another. Accordingly, the block interleaver 124 writes the seven (7) groups on the first part of each column and divides the bits included in the other three (3) groups and writes these bits on the second part of each column.

Thereafter, the block interleaver 124 reads the bits written in each row of the first part of the plurality of columns in the row direction, and reads the bits written in each row of the second part of the plurality of columns in the row direction.

That is, the block interleaver 124 may output the bits written in each row of the plurality of columns, from the bit written in the first row of the first column to the bit written in the first row of the sixth column, sequentially like ($q_0$, $q_1$, $q_2$, $q_3$, $q_4$, $q_5$, $q_6$, $q_7$, $q_8$, $q_9$, $q_{10}$, $q_{11}$, . . . ).

In this case, when the demultiplexer (not shown) is not used or the demultiplexer (not shown) outputs serially bits input to the demultiplexer (not shown) without changing the order of the bits, the LDPC codeword bits output from the block interleaver 124, ($q_0$, $q_1$, $q_2$, $q_3$, $q_4$, $q_5$), ($q_6$, $q_7$, $q_8$, $q_9$, $q_{10}$, $q_{11}$), . . . , etc. are modulated by the modulator 130. That is, the LDPC codeword bits output from the block interleaver 124, ($q_0$, $q_1$, $q_2$, $q_3$, $q_4$, $q_5$), ($q_6$, $q_7$, $q_8$, $q_9$, $q_{10}$, $q_{11}$), . . . , etc. configure cells ($y_{0,0}$, $y_{1,0}$, . . . , $y_{5,0}$), ($y_{0,1}$, $y_{1,1}$, . . . , $y_{5,1}$), . . . , etc. and the modulator 130 generates a modulation symbol by mapping the cells onto constellation points.

Accordingly, the modulator 130 may map bits output from a same column of the block interleaver 124 onto a single specific bit of bits constituting each modulation symbol. For example, the modulator 130 may map bits included in a group written in the first column of the block interleaver 124, that is, ($q_0$, $q_6$, . . . ), onto the first bit of each modulation symbol, and also, bits written in the first column may be bits which are determined to be mapped onto the first bit of each modulation symbol according to a codeword characteristic of the LDPC codeword bits and the reliability of the bits constituting the modulation symbol.

As described above, the group interleaver 122 may interleave a plurality of groups of an LDPC codeword in group units such that the groups including bits to be mapped onto a single bit of a specific location of each modulation symbol are written in a specific column of the block interleaver 124.

On the other hand, it is assumed that the block interleaver 124 includes as many columns as half of the number of bits constituting a modulation symbol, that is, three (3) columns. In this case, each column of the block interleaver 124 is not divided into parts as shown in Table 31 and 5400 bits are written in each column.

Accordingly, the group interleaver 122 performs group interleaving such that 5400/360(=15) groups to be written in each column of the block interleaver 124 from among the plurality of groups are serially arranged to be adjacent to one another. Accordingly, the block interleaver 124 writes the 15 groups on each column.

Thereafter, the block interleaver 124 may read bits written in each row of the plurality of columns in the row direction.

That is, the block interleaver 124 may output the bits written in each row of the plurality of columns, from the bit written in the first row of the first column to the bit written in the first row of the third column, sequentially like ($q_0$, $q_1$, $q_2$, $q_3$, $q_4$, $q_5$, $q_6$, $q_7$, $q_8$, $q_9$, $q_{10}$, $q_{11}$, . . . ).

In this case, the demultiplexer (not shown) demultiplexes the LDPC codeword bits output from the block interleaver 124 based on Table 34, and output cells likes ($y_{0,0}$, $y_{1,0}$, . . . , $y_{5,0}$)=($q_0$, $q_2$, $q_4$, $q_1$, $q_3$, $q_5$), ($y_{0,1}$, $y_{1,1}$, . . . , $y_{5,1}$)=($q_6$, $q_8$, $q_{10}$, $q_7$, $q_9$, $q_{11}$) . . . , etc. and the modulator 130 generates a modulation symbol by mapping the cells onto constellation points.

Accordingly, the modulator 130 may map bits output from the same column of the block interleaver 124 onto two specific bits of each modulation symbol. For example, the modulator 130 may map ($q_0$, $q_6$, . . . ) from among the bits ($q_0$, $q_3$, $q_6$, $q_9$, . . . ) included in the group written in the first column in the block interleaver 124 onto the first bit of each modulation symbol, and may map ($q_3$, $q_9$, . . . ) on the fifth bit of each modulation symbol. The bits written in the first column are bits which are determined to be mapped onto the first bit and the fifth bit of each modulation symbol according to the codeword characteristic of the LDPC codeword bits and the reliability of the bits constituting the modulation symbol. Herein, the first bit of the modulation symbol is a bit for determining a sign of the real number component Re($z_q$) of a constellation point onto which the modulation symbol is mapped, and the fifth bit of the modulation symbol is a bit for determining a relatively small size of the constellation point onto which the modulation symbol is mapped.

As described above, the group interleaver 122 may interleave the plurality of groups of the LDPC codeword in group units such that groups including bits to be mapped onto two bits of specific locations of a modulation symbol are written in a specific column of the block interleaver 124.

Hereinafter, it is assumed that the encoder 110 performs LDPC encoding at a code rate of 10/15, 11/15, 12/15, and 13/15 and generates an LDPC codeword ($N_{ldpc}$=16200) formed of 16200 bits, and the modulator 130 uses the non-uniform 16-QAM modulation method corresponding to the code rate based on table 43.

Hereinafter, exemplary embodiments will be explained in detail.

According to an exemplary embodiment, it is assumed that the encoder 110 performs LDPC encoding at a code rate of 10/15, 11/15, 12/15 and 13/15 and generates an LDPC codeword formed of 16200 bits ($N_{ldpc}$=16200), and the modulator 130 uses the non-uniform 16-QAM modulation method corresponding to the code rate based on Table 43.

In this case, the group interleaver 122 may perform group interleaving by using Equation 11 and Table 23. The block interleaver 124 in which the number of columns is four (4), the number of rows of the first part is 3960(=360×11), and the number of rows of the second part is 180 according to Table 28 or 32 may be used. Accordingly, 11 groups ($X_{35}$, $X_{31}$, $X_{39}$, $X_{19}$, $X_{29}$, $X_{20}$, $X_{36}$, $X_0$, $X_9$, $X_{13}$, $X_5$) constituting an LDPC codeword are input to the first part of the first column of the block interleaver 124, 11 groups ($X_{37}$, $X_{17}$, $X_{43}$, $X_{21}$, $X_{41}$, $X_{25}$, $X_1$, $X_{33}$, $X_{24}$, $X_{12}$, $X_{30}$) are input to the first part of the second column of the block interleaver 124, 11 groups ($X_{16}$, $X_{32}$, $X_{10}$, $X_{28}$, $X_4$, $X_{26}$, $X_8$, $X_{40}$, $X_{42}$, $X_3$, $X_6$) are input to the first part of the third column of the block interleaver 124, and 11 groups ($X_2$, $X_{38}$, $X_{14}$, $X_{34}$, $X_{22}$, $X_{18}$, $X_{27}$, $X_{23}$, $X_7$, $X_{11}$, $X_{15}$) are input to the first part of the fourth column of the block interleaver 124.

In addition, a group $X_{44}$ is input to the second part of the block interleaver 124. Specifically, bits constituting the group $X_{44}$ are input to the rows of the first column of the second part serially, input to the rows of the second column serially, input to the rows of the third column serially, and finally input to the rows of the fourth column serially. In this case, the group $X_{44}$ is formed of 360 bits and 90 bits are input to the second part of each column.

In addition, the block interleaver 124 may output the bits input to the first row to the last row of each column serially, and the bits output from the block interleaver 124 may be input to the modulator 130 serially. In this case, the demultiplexer (not shown) may be omitted or the demultiplexer (not shown) may output the input bits serially without changing the order of the bits.

Accordingly, one bit included in each of groups $X_{35}$, $X_{37}$, $X_{16}$ and $X_2$ constitute a single modulation symbol.

According to an exemplary embodiment, one bit included in each of the groups $X_{35}$, $X_{37}$, $X_{16}$ and $X_2$ constitute a single modulation symbol based on group interleaving and block interleaving. In addition to the above-described method, other methods for constituting a single modulation symbol with one bit included in each of the groups $X_{35}$, $X_{37}$, $X_{16}$ and $X_2$ may be included in the inventive concept.

Figure 24:
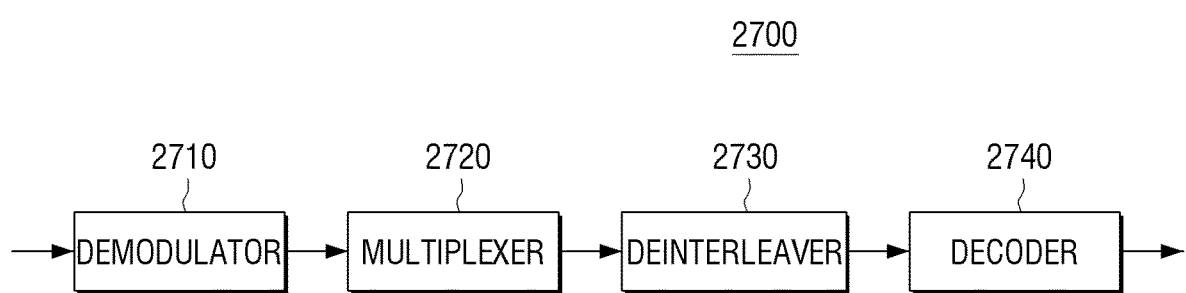
FIG. 24 is a block diagram to illustrate a configuration of a receiving apparatus according to an exemplary embodiment.

The transmitting apparatus 100 may modulate a signal mapped onto a constellation and may transmit the signal to a receiving apparatus (for example, a receiving apparatus 2700 of FIG. 24). For example, the transmitting apparatus 100 may map a signal mapped onto a constellation onto an Orthogonal Frequency Division Multiplexing (OFDM) frame by using the OFDM method, and may transmit the signal to the receiving apparatus 2700 via an allocated channel.

To achieve this, the transmitting apparatus 100 may further include a frame mapper (not shown) to map the signal mapped onto the constellation onto the OFDM frame, and a transmitter (not shown) to transmit the signal of the OFDM frame format to the receiving apparatus 2700.

Case in which a Block-Row Interleaver is Used

According to another exemplary embodiment, the interleaver 120 may interleave an LDPC codeword in other methods, different from the methods described in the exemplary embodiment 1 above, and may map bits included in a predetermined group from among a plurality of groups constituting the interleaved LDPC codeword onto a predetermined bit of a modulation symbol. This will be explained in detail with reference to FIG. 20.

Figure 20:
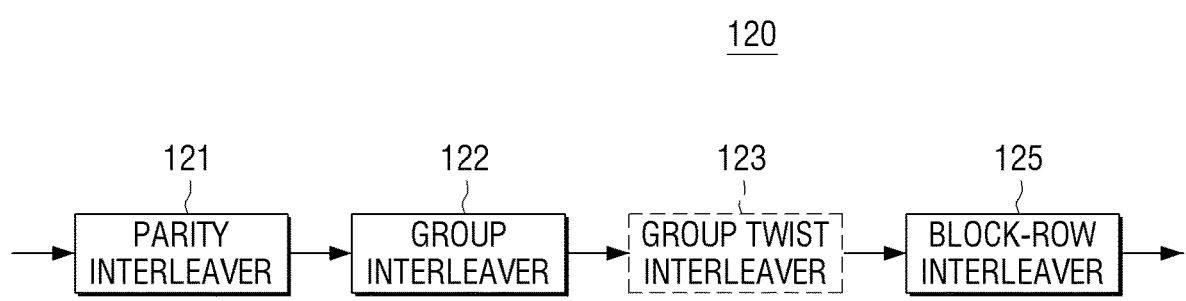
FIG. 20 is a block diagram to illustrate a configuration of an interleaver according to another exemplary embodiment.

Referring to FIG. 20, the interleaver 120 includes a parity interleaver 121, a group interleaver (or a group-wise interleaver 122), a group twist interleaver 123 and a block-row interleaver 125. Herein, the parity interleaver 121 and the group twist interleaver 123 perform the same functions as in the exemplary embodiment 1 described above. and thus, a detailed description of these elements is omitted.

The group interleaver 122 may divide a parity-interleaved LDPC codeword into a plurality of groups, and may rearrange the order of the plurality of groups.

In this case, the operation of dividing the parity-interleaved LDPC codeword into the plurality of groups is the same as in the exemplary embodiment 1, and thus, a detailed description thereof is omitted.

The group interleaver 122 interleaves an LDPC codeword in group units. That is, the group interleaver 122 may rearrange the order of the plurality of groups in the LDPC codeword in group units by changing locations of the plurality of groups constituting the LDPC codeword.

In this case, the group interleaver 122 may rearrange an order of a plurality of groups in group units so that groups including bits mapped onto the same modulation symbol from among a plurality of groups are placed sequentially.

In this case, the group interleaver 122 may rearrange the order of the plurality of groups in group units so that the groups including bits mapped onto the same modulation symbol from among a plurality of groups are placed sequentially, by considering the number of columns and rows constituting the block-row interleaver 124, the number of groups constituting the LDPC codeword, and the number of bits included in each group.

For doing this, the group interleaver 122 may interleave the LDPC codeword in group units by using Equation 12

$$Y_j = X_{\pi(j)} \ (0 \leq j < N_{group}) \quad (12),$$

where $X_j$ is the $j^{th}$ group before group interleaving, and $Y_j$ is the $j^{th}$ group after group interleaving. In addition, $\pi(j)$ is a parameter indicating an interleaving order and is determined by at least one of a length of an LDPC codeword, a code rate and a modulation method.

Accordingly, $X_{\pi(j)}$ is a $\pi(j)^{th}$ group before group interleaving, and Equation 13 means that the pre-interleaving $\pi(j)^{th}$ group is interleaved into the $j^{th}$ group.

According to an exemplary embodiment, an example of $\pi(j)$ may be defined as in Tables 50 to 54 presented below.

In this case, $\pi(j)$ is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in group units based on $\pi(j)$ satisfying the corresponding length of the LDPC codeword and code rate.

For example, when the encoder 110 performs LDPC encoding at a code rate of 10/15 to generate an LDPC codeword of a length of 16200, the group interleaver 122 may perform interleaving by using $\pi(j)$ which is defined according to the length of the LDPC codeword of 16200 and the code rate of 10/15 in tables 50 to 54 presented below.

For example, when the length of the LDPC codeword is 16200, the code rate is 10/15, and the modulation method is 16-QAM, the group interleaver 122 may perform interleaving by using $\pi(j)$ defined as in table 50.

An example of $\pi(j)$ is as follows:

For example, when the length $N_{ldpc}$ of the LDPC codeword is 16200, the code rate is 10/15, 11/15, 12/15 and 13/15, and the modulation method is 16-QAM, $\pi(j)$ may be defined as in Table 50 presented below:

TABLE 50

| Code Rate | Order of bits group to be block interleaved $\pi(j)$ (0 ≤ j < 45) | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 10/15, 11/15, 12/15, 13/15 | 11 | 38 | 27 | 33 | 30 | 37 | 15 | 0 | 36 | 9 | 20 | 19 | 25 | 43 | 41 | 35 | 14 | 4 | 3 | 10 | 5 | 34 | 21 |
| | 42 | 40 | 26 | 16 | 18 | 32 | 31 | 39 | 12 | 24 | 8 | 23 | 13 | 7 | 2 | 29 | 22 | 6 | 28 | 1 | 17 | 44 | |

In the case of Table 50, Equation 12 may be expressed as $X_0 = Y_{\pi(0)} = Y_{11}$, $X_1 = Y_{\pi(1)} = Y_{38}$, $X_2 = Y_{\pi(2)} = Y_{27}$, ..., $X_{43} = Y_{\pi(43)} = Y_{17}$, and $X_{44} = Y_{\pi(44)} = Y_{44}$. Accordingly, the group interleaver 122 may rearrange the order of the plurality of groups in group units by changing the $0^{th}$ group to the $11^{th}$ group, the $1^{st}$ group to the $38^{th}$ group, the $2^{nd}$ group to the $27^{th}$ group, ..., the $43^{rd}$ group to the $17^{th}$ group, and the $44^{th}$ group to the $44^{th}$ group.

In another example, when the length $N_{ldpc}$ of the LDPC codeword is 16200, the code rate is 6/15, 7/15, 8/15 and 9/15, and the modulation method is 64-QAM, $\pi(j)$ may be defined as in Table 51 presented below:

TABLE 51

| Code Rate | Order of bits group to be block interleaved $\pi(j)$ $(0 \le j < 45)$ | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 6/15, 7/15 | 26 | 22 | 41 | 5 | 6 | 7 | 8 | 35 | 2 | 34 | 33 | 29 | 16 | 37 | 21 | 32 | 36 | 27 | 31 | 17 | 11 | 38 | 13 |
| 8/15, 9/15 | 12 | 30 | 4 | 15 | 18 | 10 | 28 | 9 | 39 | 0 | 19 | 20 | 24 | 23 | 14 | 3 | 1 | 25 | 40 | 42 | 43 | 44 | |

In the case of Table 51, Equation 12 may be expressed as $X_0=Y_{\pi(0)}=Y_{26}$, $X_1=Y_{\pi(1)}=Y_{22}$, $X_2=Y_{\pi(2)}=Y_{41}$, ..., $X_{43}=Y_{\pi(43)}=Y_{43}$, and $X_{44}=Y_{\pi(44)}=Y_{44}$. Accordingly, the group interleaver 122 may rearrange the order of the plurality of groups in group units by changing the $0^{th}$ group to the $26^{th}$ group, the $1^{st}$ group to the $22^{nd}$ group, the $2^{nd}$ group to the $41^{th}$ group, ..., the $43^{rd}$ group to the $43^{rd}$ group, and the $44^{th}$ group to the $44^{th}$ group.

In another example, when the length $N_{ldpc}$ of the LDPC codeword is 16200, the code rate is 10/15, 11/15, 12/15 and 13/15, and the modulation method is 256-QAM, $\pi(j)$ may be defined as in Table 52 presented below:

TABLE 52

| Code Rate | Order of bits group to be block interleaved $\pi(j)$ $(0 \le j < 45)$ | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 10/15, 11/15 | 32 | 26 | 14 | 23 | 22 | 29 | 8 | 2 | 24 | 12 | 27 | 19 | 10 | 11 | 7 | 16 | 37 | 5 | 35 | 30 | 15 | 25 | 1 |
| 12/15, 13/15 | 38 | 36 | 21 | 33 | 18 | 0 | 13 | 6 | 31 | 34 | 3 | 4 | 17 | 39 | 9 | 28 | 20 | 40 | 41 | 42 | 43 | 44 | |

In the case of Table 52, Equation 12 may be expressed as $X_0=Y_{\pi(0)}=Y_{32}$, $X_1=Y_{\pi(1)}=Y_{26}$, $X_2=Y_{\pi(2)}=Y_{14}$, ..., $X_{43}=Y_{\pi(43)}=Y_{43}$, and $X_{44}=Y_{\pi(44)}=Y_{44}$. Accordingly, the group interleaver 122 may rearrange the order of the plurality of groups in group units by changing the $0^{th}$ group to the $32^{nd}$ group, the $1^{st}$ group to the $26^{th}$ group, the $2^{nd}$ group to the $14^{th}$ group, ..., the $43^{rd}$ group to the $43^{rd}$ group, and the $44^{th}$ group to the $44^{th}$ group.

In another example, when the length $N_{ldpc}$ of the LDPC codeword is 16200, the code rate is 6/15, 7/15, 8/15 and 9/15, and the modulation method is 1024-QAM, $\pi(j)$ may be defined as in Table 53 presented below:

TABLE 53

| Code Rate | Order of bits group to be block interleaved $\pi(j)$ $(0 \le j < 45)$ | | | | | | | | | | | | | | | | | | | | | | |
|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| 6/15, 7/15 | 22 | 20 | 7 | 18 | 21 | 6 | 16 | 37 | 23 | 33 | 25 | 14 | 5 | 10 | 27 | 15 | 0 | 32 | 13 | 8 | 35 | 28 | 3 |
| 8/15, 9/15 | 38 | 1 | 30 | 17 | 4 | 29 | 31 | 12 | 9 | 2 | 11 | 19 | 34 | 26 | 24 | 36 | 39 | 40 | 41 | 42 | 43 | 44 | |

In the case of Table 52, Equation 12 may be expressed as $X_0=Y_{\pi(0)}=Y_{22}$, $X_1=Y_{\pi(1)}=Y_{20}$, $X_2=Y_{\pi(2)}=Y_7$, ..., $X_{43}=$ $Y_{\pi(43)}=Y_{43}$, and $X_{44}=Y_{\pi(44)}=Y_{44}$. Accordingly, the group interleaver 122 may rearrange the order of the plurality of groups in group units by changing the $0^{th}$ group to the $22^{nd}$ group, the $1^{st}$ group to the $20^{th}$ group, the $2^{nd}$ group to the $7^{th}$ group, ..., the $43^{rd}$ group to the $43^{rd}$ group, and the $44^{th}$ group to the $44^{th}$ group.

In another example, when the length $N_{ldpc}$ of the LDPC codeword is 64800, the code rate is 6/15, 7/15, 8/15 and 9/15, and the modulation method is 256-QAM, $\pi(j)$ may be defined as in Table 54 presented below:

TABLE 54

| Code Rate | Order of bits group to be block interleaved $\pi(j)$ $(0 \le j < 180)$ | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |

TABLE 54-continued

|  | 138 | 139 | 140 | 141 | 142 | 143 | 144 | 145 | 146 | 147 | 148 | 149 |
|---|---|---|---|---|---|---|---|---|---|---|---|---|
|  | 161 | 162 | 163 | 164 | 165 | 166 | 167 | 168 | 169 | 170 | 171 | 172 |
| 6/15, | 72 | 48 | 55 | 99 | 8 | 105 | 116 | 132 | 163 | 110 | 13 | 114 |
| 7/15, | 81 | 62 | 161 | 145 | 140 | 100 | 102 | 45 | 7 | 38 | 76 | 15 |
| 8/15, | 127 | 118 | 0 | 89 | 84 | 51 | 122 | 85 | 159 | 68 | 169 | 157 |
| 9/15 | 20 | 166 | 88 | 167 | 57 | 5 | 94 | 40 | 129 | 155 | 35 | 26 |
|  | 156 | 3 | 143 | 165 | 170 | 24 | 136 | 121 | 93 | 144 | 29 | 58 |
|  | 164 | 95 | 39 | 171 | 46 | 96 | 141 | 19 | 27 | 131 | 47 | 83 |
|  | 9 | 151 | 28 | 43 | 138 | 133 | 130 | 124 | 142 | 147 | 69 | 137 |
|  | 86 | 134 | 111 | 172 | 73 | 23 | 112 | 107 | 113 | 125 | 30 | 6 |

| Code Rate | Order of bits group to be block interleaved $\pi(j)$ ($0 \le j < 180$) | | | | | | | | | | |
|---|---|---|---|---|---|---|---|---|---|---|---|
|  | 12 | 13 | 14 | 15 | 16 | 17 | 18 | 19 | 20 | 21 | 22 |
|  | 35 | 36 | 37 | 38 | 39 | 40 | 41 | 42 | 43 | 44 | 45 |
|  | 58 | 59 | 60 | 61 | 62 | 63 | 64 | 65 | 66 | 67 | 68 |
|  | 81 | 82 | 83 | 84 | 85 | 86 | 87 | 88 | 89 | 90 | 91 |
|  | 104 | 105 | 106 | 107 | 108 | 109 | 110 | 111 | 112 | 113 | 114 |
|  | 127 | 128 | 129 | 130 | 131 | 132 | 133 | 134 | 135 | 136 | 137 |
|  | 150 | 151 | 152 | 153 | 154 | 155 | 156 | 157 | 158 | 159 | 160 |
|  | 173 | 174 | 175 | 176 | 177 | 178 | 179 |  |  |  |  |
| 6/15, | 103 | 63 | 36 | 16 | 117 | 67 | 61 | 152 | 119 | 59 | 101 |
| 7/15, | 17 | 153 | 54 | 149 | 12 | 50 | 115 | 42 | 33 | 162 | 75 |
| 8/15, | 34 | 80 | 126 | 64 | 25 | 98 | 139 | 128 | 11 | 37 | 21 |
| 9/15 | 14 | 52 | 74 | 92 | 71 | 41 | 135 | 79 | 106 | 173 | 97 |
|  | 174 | 108 | 123 | 109 | 32 | 168 | 18 | 90 | 160 | 4 | 120 |
|  | 82 | 31 | 77 | 70 | 44 | 148 | 146 | 60 | 87 | 78 | 150 |
|  | 91 | 53 | 1 | 49 | 154 | 10 | 2 | 158 | 22 | 66 | 175 |
|  | 65 | 56 | 104 | 176 | 177 | 178 | 179 |  |  |  |  |

In the case of Table 54, Equation 12 may be expressed as $X_0=Y_{\pi(0)}=Y_{72}$, $X_1=Y_{\pi(1)}=Y_{48}$, $X_2=Y_{\pi(2)}=Y_{55}$, . . . , $X_{178}=Y_{\pi(178)}=Y_{178}$, and $X_{179}=Y_{\pi(179)}=Y_{179}$. Accordingly, the group interleaver 122 may rearrange the order of the plurality of groups in group units by changing the $0^{th}$ group to the $72^{nd}$ group, the $1^{st}$ group to the $48^{th}$ group, the $2^{nd}$ group to the $55^{th}$ group, . . . , the $178^{th}$ group to the $178^{th}$ group, and the $179^{th}$ group to the $179^{th}$ group.

As described above, the group interleaver 122 may rearrange the order of the plurality of groups in group units by using Equation 12 and Tables 50 to 54.

On the other hand, since the order of the groups constituting the LDPC codeword is rearranged in group units by the group interleaver 122, and then, the groups are block-interleaved by the block interleaver 124, which will be described below, "Order of bits groups to be block interleaved" is set forth in Tables 50 to 54 in relation to $\pi(j)$.

When the group interleaving is performed based on tables 50 to 54 as described above, the order of the groups constituting the group-interleaved LDPC codeword is different from that of the groups constituting the LDPC code group-interleaved based on tables 23 to 27.

This is because the block-row interleaver 125 is used in the present exemplary embodiment instead of the block interleaver 124 in FIG. 4. That is, since the interleaving method used in the block interleaver 124 and the interleaving method used in the block-row interleaver 125 are different from each other, the group interleaver 122 of the present exemplary embodiment rearranges the order of the plurality of groups constituting the LDPC codeword based on tables 50 to 54.

Specifically, the group interleaver 122 may rearrange the order of the plurality of groups in such that that an arrangement unit, in which at least one group including bits to be mapped onto the same modulation symbol is serially arranged in group units, is repeated.

That is, the group interleaver 122 may serially arrange one of a plurality of first groups including bits to be mapped onto a first specific location of each modulation symbol, one of a plurality of second groups including bits to be mapped onto a second specific location of each modulation symbol, . . . , one of a plurality of $n^{th}$ groups including bits to be mapped onto an $n^{th}$ specific location of each modulation symbol, and may arrange the other groups repeatedly in the same method.

The block-row interleaver 125 interleaves the plurality of groups the order of which has been rearranged. In this case, the block-row interleaver 125 may interleave the plurality of groups the order of which has been rearranged by using at least one row including a plurality of columns. This will be explained in detail below with reference to FIGS. 21 to 23.

Figure 21:
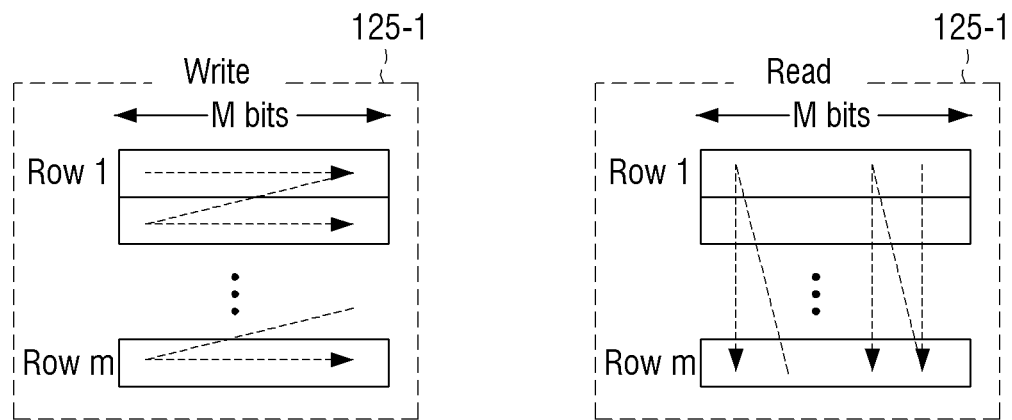
FIGS. 21 to 23 are views to illustrate a configuration of a block-row interleaver and an interleaving method according to exemplary embodiments.
Figure 22:
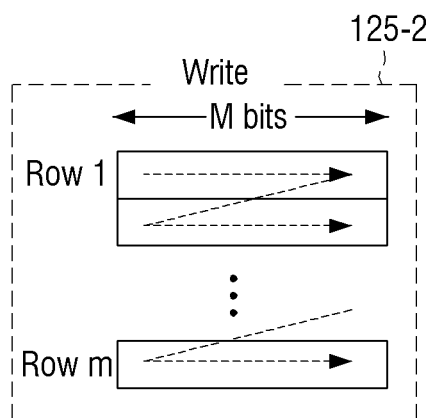
Figure 22:
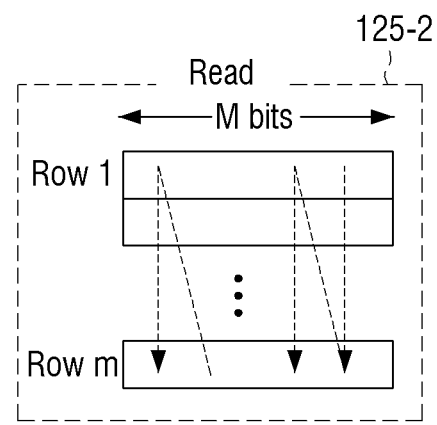
Figure 22:
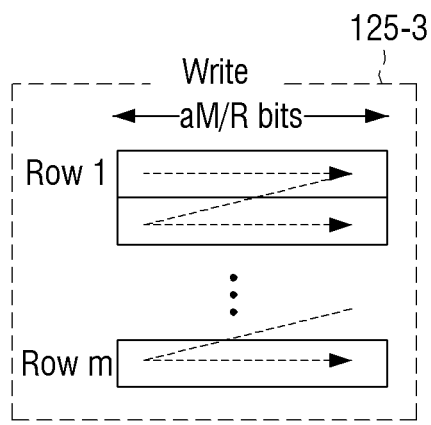
Figure 22:
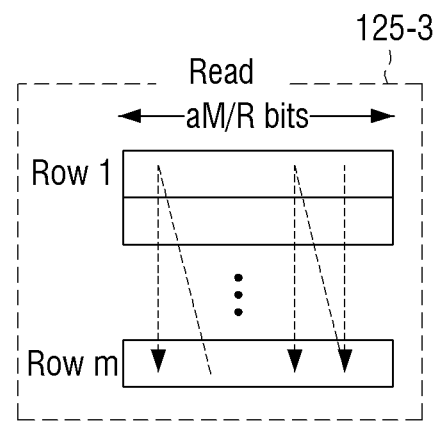
Figure 23:
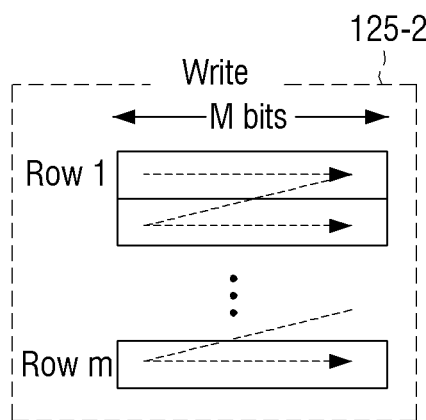
Figure 23:
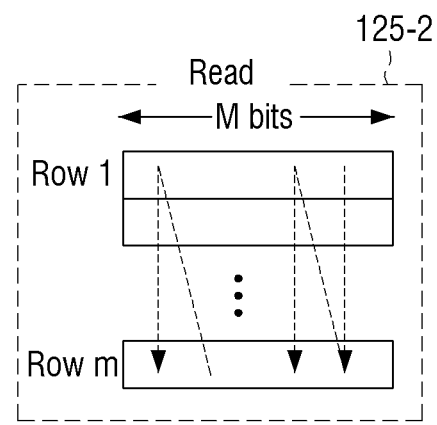
Figure 23:
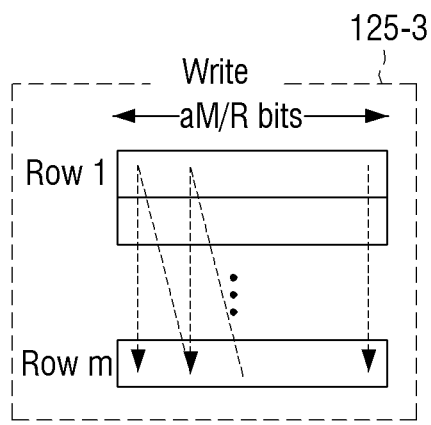
Figure 23:
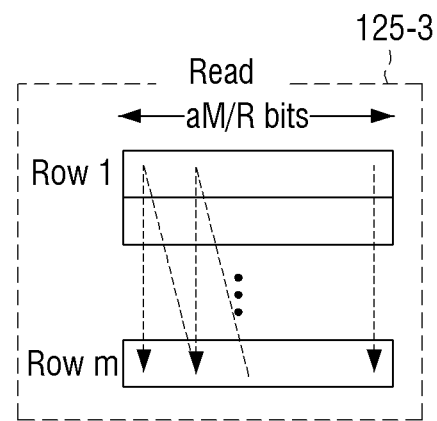

FIGS. 21 to 23 are views to illustrate a configuration of a block-row interleaver and an interleaving method according to an exemplary embodiment.

First, when $N_{group}/m$ is an integer, the block-row interleaver 125 includes an interleaver 125-1 including m number of rows each including M number of columns as shown in FIG. 21, and the block-row interleaver 125 may interleave by using $N_{group}/m$ number of interleavers 125-1 having the configuration of FIG. 21.

Herein, $N_{group}$ is the total number of groups constituting an LDPC codeword. In addition, M is the number of bits included in a single group and may be 360, for example. m may be identical to the number of bits constituting a modulation symbol or may be ½ of the number of bits constituting a modulation symbol. For example, when a non-uniform QAM is used, performance of the bits constituting a modulation symbol is different, and thus, by setting m to be identical to the number of bits constituting a modulation symbol, a single group can be mapped onto a single bit of the modulation symbol.

Specifically, the block-row interleaver 125 may interleave by writing each of a plurality of groups constituting an LDPC codeword in each row in the row direction in group units, and reading each column of the plurality of rows in which the plurality of groups are written in group units in the column direction.

For example, as shown in FIG. 21, the block-row interleaver 125 writes m number of continuous groups from among the plurality of groups in each of the m number of rows of the interleaver 125-1 in the row direction, and reads each column of m number of rows in which bits are written in the column direction. In this case, as many interleavers 125-1 as the number of groups divided by the number of rows, that is, $N_{group}/m$, may be used.

As described above, when the number of groups constituting an LDPC codeword is an integer multiple of the number of rows, the block-row interleaver 125 may interleave by writing as many groups as the number of rows from among a plurality of groups constituting the LDPC codeword serially.

On the other hand, when the number of groups constituting an LDPC codeword is not an integer multiple of the number of rows, the block-row interleaver 125 interleaves by using N number of interleavers (N is an integer greater than or equal to 2) including different number of columns.

For example, as shown in FIGS. 22 and 23, the block-row interleaver 125 may interleave by using a first interleaver 125-2 including m number of rows each including M number of columns, and a second interleaver 125-3 including m number of rows each including $\alpha \times M/m$ number of columns. Herein, a is $N_{group} - \lfloor N_{group}/m \rfloor \times m$, and $\lfloor N_{group}/m \rfloor$ is the largest integer below $N_{group}/m$.

In this case, the first interleaver 125-2 may be used as many as $\lfloor N_{group}/m \rfloor$ and one second interleaver 125-3 may be used.

Specifically, the block-row interleaver 125 may interleave a plurality of groups constituting an LDPC codeword by writing each of $\lfloor N_{group} m \rfloor \times m$ number of groups from among the plurality of groups constituting the LDPC codeword in each row in the row direction in group units, and reading each column of the plurality of rows in which $\lfloor N_{group}/m \rfloor \times m$ number of groups are written in group units in the column direction.

For example, as shown in FIGS. 22 and 23, the block-row interleaver 125 may write the same m number of continuous groups as the number of rows from among $\lfloor N_{group}/m \rfloor \times m$ number of groups in each row of the first interleaver 125-2 in the row direction, and may read each column of the plurality of rows of the first interleaver 125-2 in which m number of groups are written in the column direction. In this case, the first interleaver 125-2 having the configuration FIGS. 22 and 23 may be used as many as $\lfloor N_{group}/m \rfloor$.

In addition, in the case of a system using a plurality of antennas, m may be a product of the number of bits constituting a modulation method and the number of antennas Thereafter, the block-row interleaver 125 may divide bits included in the other groups except the groups written in the first interleaver 125-2, and may write these bits in each row of the second interleaver 125-3 in the row direction. In this case, the same number of bits are written in each row of the second interleaver 125-3. That is, a single bit group may be input to the plurality of rows of the second interleaver 125-3.

For example, as shown in FIG. 22, the block-row interleaver 125 may write $\alpha \times M/m$ number of bits from among the bits included in the other groups except the groups written in the first interleaver 125-2 in each of m number of rows of the second interleaver 125-3 in the row direction, and may read each column of m number of rows of the second interleaver 125-3 in which the bits are written in the column direction. In this case, one second interleaver 125-3 having the configuration of FIG. 22 may be used.

However, according to another exemplary embodiment, as shown in FIG. 23, the block-row interleaver 125 may write the bits in the first interleaver 125-2 in the same method as explained in FIG. 22, but may write the bits in the second interleaver 125-3 in a method different from that of FIG. 22.

That is, the block-row interleaver 125 may write the bits in the second interleaver 125-3 in the column direction.

For example, as shown in FIG. 23, the block-row interleaver 125 may write the bits included in the other groups except the groups written in the first interleaver 125-2 in each column of m number of rows each including $\alpha \times M/m$ number of columns of the second interleaver 125-3 in the column direction, and may read each column of m number of rows of the second interleaver 125-3 in which the bits are written in the column direction. In this case, one second interleaver 125-3 having the configuration of FIG. 23 may be used.

In the method shown in FIG. 23, the block-row interleaver 125 interleaves by reading in the column direction after writing the bits in the second interleaver in the column direction. Accordingly, the bits included in the groups interleaved by the second interleaver are read in the order they were written and output to the modulator 130. Accordingly, the bits included in the groups belonging to the second interleaver are not rearranged by the block-row interleaver 125 and may be mapped onto the modulation symbols serially. As such, the block-row interleaver 125 may interleave at least a part of a plurality of groups, and may not interleave the other groups. Specifically, the block-row interleaver 125 may perform interleaving by sequentially writing LDPC codewords constituting at least a part of a plurality of groups in a plurality of rows and reading the LDPC codewords in a column direction, but may not perform interleaving with respect to the other groups. That is, since the block-row interleaver 125 writes and reads bits included in the other groups in the same direction, the bits included in the other groups may be outputted without changing order thereof.

In addition, in the aforementioned exemplary embodiment, the bits included in the other groups are written and read in a column direction, but this is merely an example. That is, the block-row interleaver 125 may write and read the bits included in the other groups in a row direction, and in this case, the bits included in the other groups may be outputted without changing order thereof As described above, the block-row interleaver 125 may interleave the plurality of groups of the LDPC codeword by using the methods described above with reference to FIGS. 21 to 23.

According to the above-described method, the output of the block-row interleaver 125 may be the same as the output of the block interleaver 124. Specifically, when the block-row interleaver 125 interleaves as shown in FIG. 21, the block-row interleaver 125 may output the same value as that of the block interleaver 124 which interleaves as shown in FIG. 8. In addition, when the block-row interleaver 125 interleaves as shown in FIG. 22, the block-row interleaver 125 may output the same value as that of the block interleaver 124 which interleaves as shown in FIG. 9. In addition, when the block-row interleaver 125 interleaves as shown in FIG. 23, the block-row interleaver 125 may output the same value as that of the block interleaver 124 which interleaves as shown in FIG. 10.

Specifically, when the group interleaver 122 is used based on Equation 11 and the block interleaver 124 is used, and the output groups of the group interleaver 122 are $Y_j$ ($0 \leq j < N_{group}$) and when the group interleaver 122 is used based on Equation 12 and the block-row interleaver 125 is used, and the output groups of the group interleaver 122 are $Z_i$ ($0 \leq j < N_{group}$), a relationship between the output groups $Z_i$ and $Y_i$ after group interleaving may be expressed as in Equations 13 and 14, and as a result, the same value may be output from the block interleaver 124:

$$Z_{i+m \times j} = Y_{\alpha \times i + j} \ (0 \leq i < m, 0 \leq j < \alpha) \tag{13}$$

$$Z_i = Y_i (\alpha \times m \leq i < N_{group}) \tag{14},$$

where $\alpha$ is $\lfloor N_{group}/m \rfloor$ and is the number of groups written in a single column of the first part when the block interleaver 124 is used, and $\lfloor N_{group}/m \rfloor$ is the largest integer below $N_{group}/m$. Here, m is identical to the number of bits constituting a modulation symbol or half of the bits constituting a modulation symbol. In addition, m is the number of columns of the block interleaver 124 and m is the number of rows of the block-row interleaver 125.

Accordingly, the modulator 130 may map the bits output from the block-row interleaver 125 onto a modulation symbol in the same method as when the block interleaver 124 is used.

The bit interleaving method suggested in the exemplary embodiments is performed by the parity interleaver 121, the group interleaver 122, the group twist interleaver 123, and the block interleaver 124 as shown in FIG. 4 (the parity interleaver 121 or group twist interleaver 123 may be omitted according to circumstances). However, this is merely an example and the bit interleaving method is not limited to three modules or four modules described above.

For example, when the block interleaver is used and the group interleaving method expressed as in Equation 11 is used, regarding the bit groups $X_j$ ($0 \leq j < N_{group}$) defined as in Equation 9 and Equation 10, bits belonging to m number of bit groups, for example, $\{X_{\pi(i)}, X_{\pi(\alpha+i)}, \ldots, X_{\pi((m-1) \times \alpha + i)}\}$ ($0 \leq i < \alpha$), may constitute a single modulation symbol.

Herein, $\alpha$ is the number of bit groups constituting the first part of the block interleaver, and $\alpha = \lfloor N_{group}/m \rfloor$. In addition, m is the number of columns of the block interleaver and may be equal to the number of bits constituting the modulation symbol or half of the number of bits constituting the modulation symbol.

Therefore, for example, regarding parity-interleaved bits $u_i$, $\{u_{\pi(i)+j}, U_{\pi(\alpha+i)+j}, \ldots, U_{\pi((m-1) \times \alpha + i)+j}\}$ ($0 < i \leq m$, $0 < j \leq M$) may constitute a single modulation symbol. As described above, there are various methods for constituting a single modulation symbol.

In addition, the bit interleaving method suggested in the exemplary embodiments is performed by the parity interleaver 121, the group interleaver 122, the group twist interleaver 123, and the block-row interleaver 125 as shown in FIG. 20 (the group twist interleaver 123 may be omitted according to circumstances). However, this is merely an example and the bit interleaving method is not limited to three modules or four modules described above.

For example, when the block-row interleaver is used and the group interleaving method expressed as in Equation 12 is used, regarding the bit groups $X_j$ ($0 \leq j < N_{group}$) defined as in Equation 9 and Equation 10, bits belonging to m number of bit groups, for example, $\{X_{\pi(m \times i)}, X_{\pi(m \times i+1)}, \ldots, X_{\pi(m \times i+(m-1))}\}$ ($0 \leq i < \alpha$), may constitute a single modulation symbol.

Herein, $\alpha$ is the number of bit groups constituting the first part of the block interleaver, and $\alpha = \lfloor N_{group}/m \rfloor$. In addition, m is the number of columns of the block interleaver and may be equal to the number of bits constituting the modulation symbol or half of the number of bits constituting the modulation symbol.

Therefore, for example, regarding parity-interleaved bits $u_i$, $\{u_{\pi(m \times i)+j}, U_{\pi(m \times i+1)+j}, \ldots, U_{\pi(m \times i+(m-1))+j}\}$ ($0 < i \leq m$, $0 < j \leq M$) may constitute a single modulation symbol. As described above, there are various methods for constituting a single modulation symbol.

The transmitting apparatus 100 may perform a different interleaving method according to a set comprising at least one of a code rate, a length of an LDPC codeword and a modulation method.

For example, the transmitting apparatus 100 performs interleaving using the block interleaver 124 in a first set comprising a first predetermined code rate, a first predetermined length of an LDPC codeword and a first predetermined modulation method and, performs interleaving using the block-row interleaver 125 in a second set comprising a second predetermined code rate, a second predetermined length of an LDPC codeword and a second predetermined modulation method different with the first set.

FIG. 24 is a block diagram to illustrate a configuration of a receiving apparatus according to an exemplary embodiment. Referring to FIG. 24, the receiving apparatus 2700 includes a demodulator 2710, a multiplexer 2720, a deinterleaver 2730 and a decoder 2740.

The demodulator 2710 receives and demodulates a signal transmitted from the transmitting apparatus 100. Specifically, the demodulator 2710 generates a value corresponding to an LDPC codeword by demodulating the received signal, and outputs the value to the multiplexer 2720. In this case, the demodulator 2710 may use a demodulation method corresponding to a modulation method used in the transmitting apparatus 100. For doing this, the transmitting apparatus 100 may transmit information on the modulation method to the receiving apparatus 2700. In addition, the transmitting apparatus 100 may perform modulation by using a modulation method predefined between the transmitting apparatus 100 and the receiving apparatus 2700.

The value corresponding to the LDPC codeword may be expressed as a channel value for the received signal. There are various methods for determining the channel value, and for example, a method for determining a Log Likelihood Ratio (LLR) value may be the method for determining the channel value.

The LLR value is a log value for a ratio of the probability that a bit transmitted from the transmitting apparatus 100 is 0 and the probability that the bit is 1. In addition, the LLR value may be a bit value which is determined by a hard decision, or may be a representative value which is determined according to a section to which the probability that the bit transmitted from the transmitting apparatus 100 is 0 or 1 belongs.

The multiplexer 2720 multiplexes the output value of the demodulator 2710 and outputs the value to the deinterleaver 2730.

Specifically, the multiplexer 2720 is an element corresponding to a demultiplexer (not shown) provided in the transmitting apparatus 100, and performs an operation corresponding to the demultiplexer (not shown). Accordingly, when the demultiplexer (not shown) is omitted from the transmitting apparatus 100, the multiplexer 2720 may be omitted from the receiving apparatus 2700.

That is, the multiplexer 2720 converts the output value of the demodulator 2710 into cell-to-bit and outputs an LLR value on a bit basis.

In this case, when the demultiplexer (not shown) does not change the order of the LDPC codeword bits as shown in FIG. 13, the multiplexer 2720 may output the LLR values serially on the bit basis without changing the order of the LLR values corresponding to the bits of the cell. Alternatively, the multiplexer 2720 may rearrange the order of the LLR values corresponding to the bits of the cell to perform an inverse operation to the demultiplexing operation of the demultiplexer (not shown) based on Table 34. Meanwhile, information on performance of the demultiplexing operation may be provided from the transmitting apparatus 100, or may be predefined between the transmitting apparatus 100 and the receiving apparatus 2700.

The deinterleaver 2730 deinterleaves the output value of the multiplexer 2720 and outputs the values to the decoder 2740.

Specifically, the deinterleaver 2730 is an element corresponding to the interleaver 120 of the transmitting apparatus 100 and performs an operation corresponding to the interleaver 120. That is, the deinterleaver 2730 deinterleaves the LLR value by performing the interleaving operation of the interleaver 120 inversely.

Figure 25:
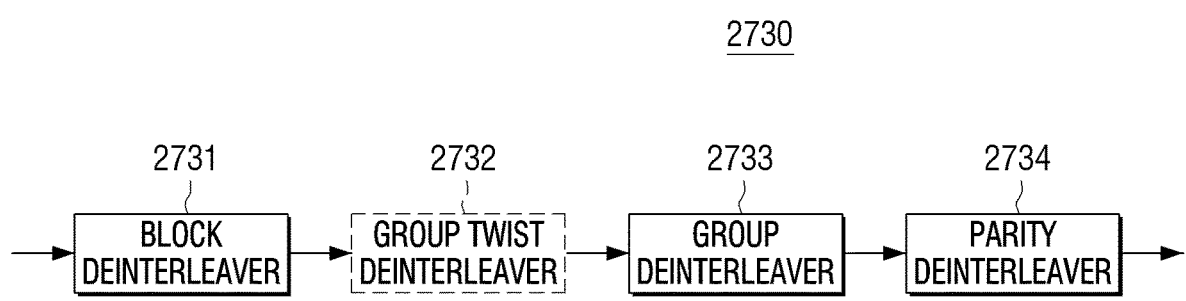
FIGS. 25 and 27 are block diagrams to illustrate a configuration of a deinterleaver according to exemplary embodiments.
Figure 27:
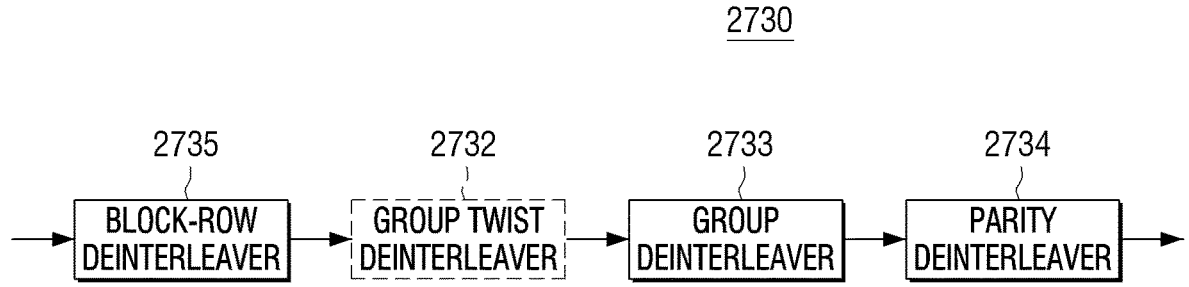

For doing this, the deinterleaver 2730 may include elements as shown in FIGS. 25 and 27.

First, as shown in FIG. 25, the deinterleaver 2730 includes a block deinterleaver 2731, a group twist deinterleaver 2732, a group deinterleaver 2733, and a parity deinterleaver 2734, according to an exemplary embodiment.

The block deinterleaver 2731 deinterleaves the output of the multiplexer 2720 and outputs a value to the group twist deinterleaver 2732.

Specifically, the block deinterleaver 2731 is an element corresponding to the block interleaver 124 provided in the transmitting apparatus 100 and performs the interleaving operation of the block interleaver 124 inversely.

That is, the block deinterleaver 2731 deinterleaves by using at least one row formed of a plurality of columns, that is, by writing the LLR value output from the multiplexer 2720 in each row in the row direction and reading each column of the plurality of rows in which the LLR value is written in the column direction.

In this case, when the block interleaver 124 interleaves by dividing a column into two parts, the block deinterleaver 2731 may deinterleave by dividing a row into two parts.

In addition, when the block interleaver 124 performs writing and reading with respect to a group which does not belong to the first part in the row direction, the block deinterleaver 2731 may deinterleave by writing and reading a value corresponding to the group which does not belong to the first part in the row direction.

Figure 26:
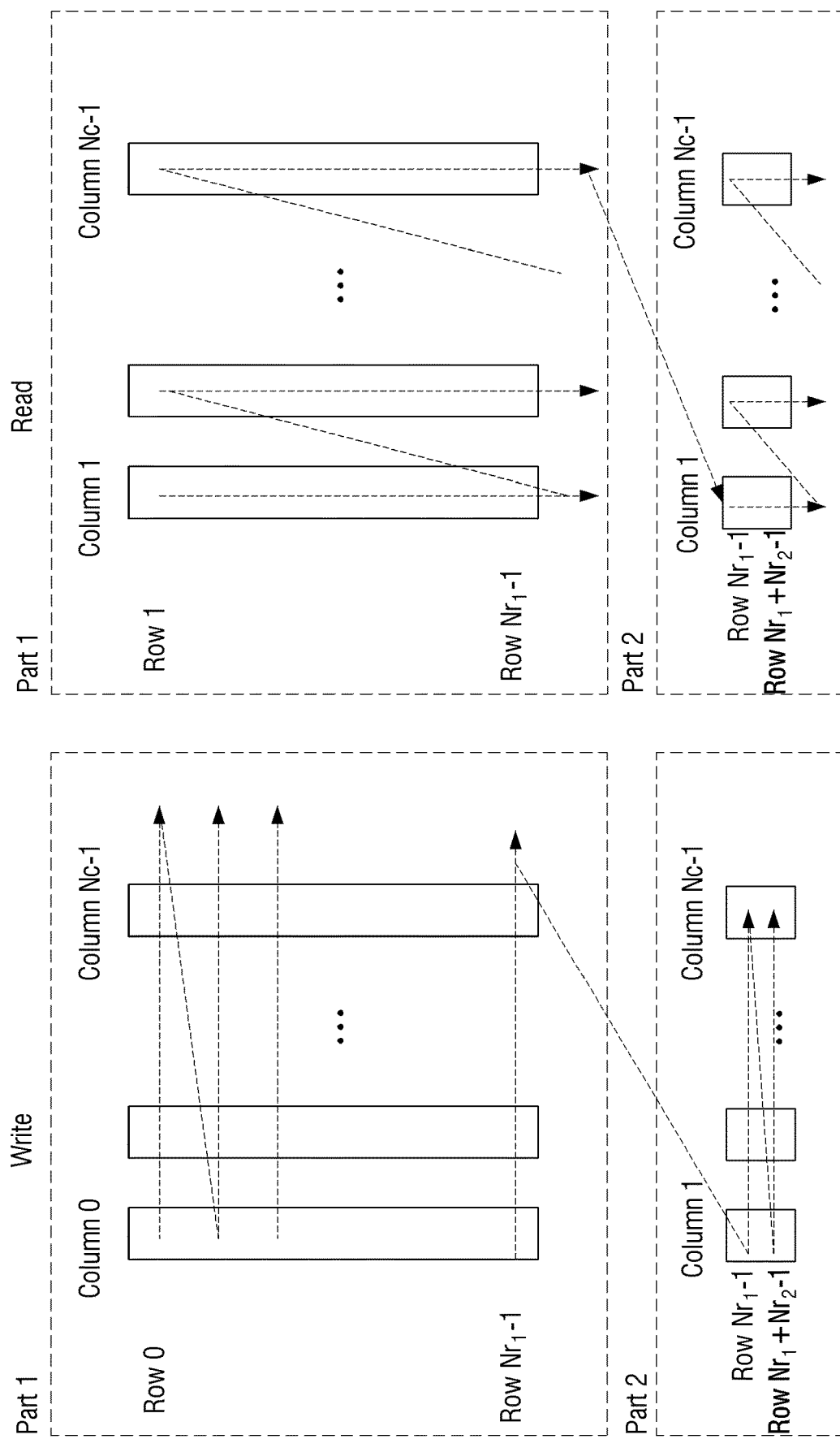
FIG. 26 is a view to illustrate a block deinterleaver according to an exemplary embodiment.

Hereinafter, the block deinterleaver 2731 will be explained with reference to FIG. 26. However, this is merely an example and the block deinterleaver 2731 may be implemented in other methods.

An input LLR $v_i$ ($0 \leq i < N_{ldpc}$) is written in a $r_i$ row and a $c_i$ column of the block deinterleaver 2431. Herein, $c_i = (i \bmod N_c)$ and $$r_i = \left\lfloor \frac{i}{N_c} \right\rfloor.$$

On the other hand, an output LLR $q_i$ ($0 \leq i < N_c \times N_{r1}$) is read from a $c_i$ column and a $r_i$ row of the first part of the block deinterleaver 2431. Herein, $$c_i = \left\lfloor \frac{(i - N_c \times N_{r1})}{N_{r2}} \right\rfloor,$$

$r_i = (i \bmod N_{r1})$

In addition, an output LLR $q_i$ ($N_c \lambda N_{r1} \leq i < N_{ldpc}$) is read from a $c_i$ column and a $r_i$ row of the second part. Herein, $$c_i = \left\lfloor \frac{i}{N_{r1}} \right\rfloor,$$

$r_i = N_{r1} + \{(i - N_c \times N_{r1}) \bmod N_{r2}\}$.

The group twist deinterleaver 2732 deinterleaves the output value of the block deinterleaver 2731 and outputs the value to the group deinterleaver 2733.

Specifically, the group twist deinterleaver 2732 is an element corresponding to the group twist interleaver 123 provided in the transmitting apparatus 100, and may perform the interleaving operation of the group twist interleaver 123 inversely.

That is, the group twist deinterleaver 2732 may rearrange the LLR values of the same group by changing the order of the LLR values existing in the same group. When the group twist operation is not performed in the transmitting apparatus 100, the group twist deinterleaver 2732 may be omitted.

The group deinterleaver 2733 (or the group-wise deinterleaver) deinterleaves an output value of the group twist deinterleaver 2732 and outputs a value to the parity deinterleaver 2734.

Specifically, the group deinterleaver 2733 is an element corresponding to the group interleaver 122 provided in the transmitting apparatus 100 and may perform the interleaving operation of the group interleaver 122 inversely.

That is, the group deinterleaver 2733 may rearrange the order of the plurality of groups in group units. In this case, the group deinterleaver 2733 may rearrange the order of the plurality of groups in group units by applying the interleaving method of Tables 23 to 27 inversely according to a length of the LDPC codeword, a modulation method and a code rate.

As described above, in the parity check matrix having the format shown in FIGS. 2 and 3, the order of column groups is changeable and the column group corresponds to a bit group. Accordingly, when the order of column groups of the parity check matrix is changed, the order of bit groups is changed accordingly and the group deinterleaver 2733 may rearrange the order of the plurality of groups in group units with reference to this.

The parity deinterleaver 2734 performs parity deinterleaving with respect to an output value of the group deinterleaver 2733 and outputs a value to the decoder 2740.

Specifically, the parity deinterleaver 2734 is an element corresponding to the parity interleaver 121 provided in the transmitting apparatus 100 and may perform the interleaving operation of the parity interleaver 121 inversely. That is, the parity deinterleaver 2734 may deinterleave the LLR values corresponding to the parity bits from among the LLR values output from the group deinterleaver 2733. In this case, the parity deinterleaver 2734 may deinterleave the LLR values corresponding to the parity bits in an inverse method of the parity interleaving method of Equation 8. However, the parity deinterleaver 2734 may be omitted according to a decoding method and implementation of the decoder 2740.

Although the deinterleaver 2730 of FIG. 24 includes three (3) or four (4) elements as shown in FIG. 25, operations of the elements may be performed by a single element. For example, when bits each of which belongs to each of bit groups $X_a$, $X_b$, $X_c$, and $X_d$ constitute a single modulation symbol, the deinterleaver 2730 may deinterleave these bits to locations corresponding to their bit groups based on the received single modulation symbol.

For example, when a code rate is 12/15 and a modulation method is 16-QAM, the group deinterleaver 2733 may perform deinterleaving based on table 21.

In this case, bits each of which belongs to each of bit groups $X_{35}$, $X_{37}$, $X_{16}$, and $X_2$ constitute a single modulation symbol. Since one bit in each of the bit groups $X_{35}$, $X_{37}$, $X_{16}$, and $X_2$ constitutes a single modulation symbol, the deinterleaver 2730 may map bits onto decoding initial values corresponding to the bit groups $X_{35}$, $X_{37}$, $X_{16}$, and $X_2$ based on the received single modulation symbol.

The deinterleaver 2730 may include a block-row deinterleaver 2735, a group twist deinterleaver 2732, a group deinterleaver 2733 and a parity deinterleaver 2734, as shown in FIG. 27. In this case, the group twist deinterleaver 2732 and the parity deinterleaver 2734 perform the same functions as in FIG. 25, and thus, a redundant explanation is omitted.

The block-row deinterleaver 2735 deinterleaves an output value of the multiplexer 2720 and outputs a value to the group twist deinterleaver 2732.

Specifically, the block-row deinterleaver 2735 is an element corresponding to the block-row interleaver 125 provided in the transmitting apparatus 100 and may perform the interleaving operation of the block-row interleaver 125 inversely.

That is, the block-row deinterleaver 2735 may deinterleave by using at least one column formed of a plurality of rows, that is, by writing the LLR values output from the multiplexer 2720 in each column in the column direction and reading each row of the plurality of columns in which the LLR value is written in the column direction.

However, when the block-row interleaver 125 performs writing and reading with respect to a group which does not belong to the first part in the column direction, the block-row deinterleaver 2735 may deinterleave by writing and reading a value corresponding to the group which does not belong to the first part in the column direction.

The group deinterleaver 2733 deinterleaves the output value of the group twist deinterleaver 2732 and outputs the value to the parity deinterleaver 2734.

Specifically, the group deinterleaver 2733 is an element corresponding to the group interleaver 122 provided in the transmitting apparatus 100 and may perform the interleaving operation of the group interleaver 122 inversely.

That is, the group deinterleaver 2733 may rearrange the order of the plurality of groups in group units. In this case, the group deinterleaver 2733 may rearrange the order of the plurality of groups in group units by applying the interleaving method of Tables 50 to 54 inversely according to a length of the LDPC codeword, a modulation method and a code rate.

Although the deinterleaver 2730 of FIG. 24 includes three (3) or four (4) elements as shown in FIG. 27, operations of the elements may be performed by a single element. For example, when bits each of which belongs to each of bit groups $X_a$, $X_b$, $X_c$, and $X_d$ constitute a single modulation symbol, the deinterleaver 2730 may deinterleave these bits to locations corresponding to their bit groups based on the received single modulation symbol.

For doing this, the transmitting apparatus 100 may transmit various pieces of information used for performing interleaving by the interleaver 120 to the receiving apparatus 2700. In addition, the transmitting apparatus 100 may perform interleaving by using a method predefined between the transmitting apparatus 100 and the receiving apparatus 2700.

The decoder 2740 may perform LDPC decoding by using the output value of the deinterleaver 2730. To achieve this, the decoder 2740 may include a separate LDPC decoder (not shown) to perform the LDPC decoding.

Specifically, the decoder 2740 is an element corresponding to the encoder 110 of the transmitting apparatus 200 and may correct an error by performing the LDPC decoding by using the LLR value output from the deinterleaver 2730.

For example, the decoder 2740 may perform the LDPC decoding in an iterative decoding method based on a sum-product algorithm. The sum-product algorithm is one example of a message passing algorithm, and the message passing algorithm refers to an algorithm which exchanges messages (e.g., LLR value) through an edge on a bipartite graph, calculates an output message from messages input to variable nodes or check nodes, and updates.

The decoder 2740 may use a parity check matrix when performing the LDPC decoding. In this case, an information word submatrix in the parity check matrix is defined as in Tables 4 to 11 according to a code rate and a length of the LDPC codeword, and a parity submatrix may have a dual diagonal configuration.

In addition, information on the parity check matrix and information on the code rate, etc. which are used in the LDPC decoding may be pre-stored in the receiving apparatus 2700 or may be provided by the transmitting apparatus 100.

Figure 28:
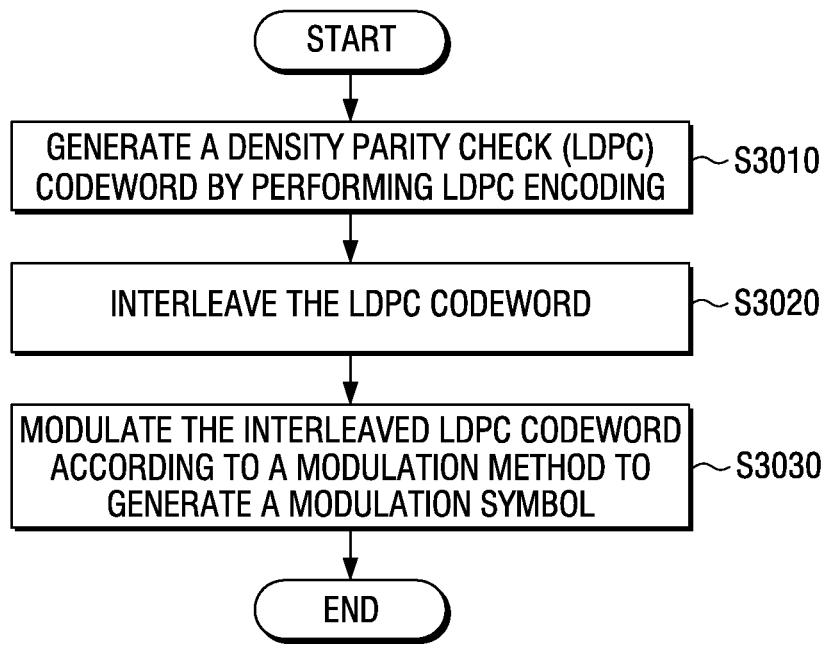
FIG. 28 is a flowchart to illustrate a signal processing method according to an exemplary embodiment.

FIG. 28 is a flowchart to illustrate a signal processing method according to an exemplary embodiment.

First of all, an LDPC codeword is generated by performing LDPC encoding (S3010).

Subsequently, the LDPC codeword is interleaved (S3020), and a modulation symbol is generated by modulating the interleaved LDPC codeword according to a modulation method (S3030).

Herein, in S3020, the interleaving includes interleaving the LDPC codeword by dividing each of a plurality of columns including a plurality of rows, respectively, into the first part and the second part according to the number of a plurality of column and the number of bit groups.

Herein, the number of a plurality of columns may have the same value as a modulation order according to a modulation method, and each of the plurality of columns may be formed of rows as many as the number of bits constituting the LDPC codeword divided by the number of the plurality of columns.

The first part may be formed of rows as many as the number of bits included in at least some bit groups which are writable in bit group units in each of the plurality of columns from among a plurality of bit groups constituting the LDPC codeword according to the number of the plurality of columns, the number of bit groups, and the number of bits constituting each bit group, in each of the plurality of columns, and the second part may be formed of rows excluding the number of rows as many as the number of bits included in at least some bit groups which are writable in bit group units in each of the plurality of columns in rows constituting each of the plurality of columns, in each of the plurality of columns.

In this case, the number of rows in the second part has the same value as a quotient of the number of bits included in all bit groups excluding bit groups corresponding to the first part divided by the number of columns.

The bits included in at least some bit groups which are writable in bit group units are written serially in each of a plurality of columns constituting the first part serially, the bits included in the remaining bit groups excluding at least some bit groups from among a plurality of bit groups are divided based on the number of the plurality of columns, and written in a plurality of columns constituting the second part serially.

Interleaving may be performed by dividing the bits included in the remaining bit groups by the number of the plurality of columns, writes each of the divided bits in each of a plurality of columns constituting the second part in a column direction, and reads a plurality of columns constituting the first part and the second part in a row direction.

Meanwhile, the modulation order may be 2, 4, 6, 8, 10, and 12, when the modulation method is QPSK, 16-QAM, 64-QAM, 256-QAM, 1024-QAM, 4096-QAM, respectively.

A non-transitory computer readable medium, which stores a program for performing the above signal processing methods according to various exemplary embodiments in sequence, may be provided.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB), a memory card, and a read only memory (ROM), and may be provided.

Components, elements or units represented by a block as illustrated in FIGS. 1, 4, 12, 13, 23 and 27-29 may be embodied as the various numbers of hardware, software and/or firmware structures that execute respective functions described above, according to exemplary embodiments. For example, these components, elements or units may use a direct circuit structure, such as a memory, processing, logic, a look-up table, etc. that may execute the respective functions through controls of one or more microprocessors or other control apparatuses. These components, elements or units may be specifically embodied by a module, a program, or a part of code, which contains one or more executable instructions for performing specified logic functions. Also, at least one of the above components, elements or units may further include a processor such as a central processing unit (CPU) that performs the respective functions, a microprocessor, or the like.

Although a bus is not illustrated in the block diagrams of the transmitting apparatus and the receiving apparatus, communication may be performed between each element of each apparatus via the bus. In addition, each apparatus may further include a processor such as a Central Processing Unit (CPU) or a microprocessor to perform the above-described various operations.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the inventive concept, and many alternatives, modifications, and variations will be apparent to those skilled in the art.

What is claimed is:

1. A broadcast signal receiving apparatus comprising:
   a receiver configured to receive a broadcast signal from a broadcast signal transmitting apparatus;
   a demodulator configured to demodulate the broadcast signal to generate values for 256-quadrature amplitude modulation (QAM);
   a deinterleaver configured to deinterleave the values using a plurality of columns, each column of the plurality of columns comprising a first part anf a second part, split the deinterleaved values into a plurality of groups, and deeinterleave the plurality of groups;
   a decoder configured to decode values of the deinterleaved plurality of groups based on a low density parity check (LDPC) code,
   wherein a number of the plurality of columns is equal to a modulation order of the 256-QAM,
   wherein a number of values of each group is 360,
   wherein if a code length of the LDPC code is 64800 bits, a number of rows in the first part of the each column is 7920, and a number of rows in the second part of the each column is 180, and
   wherein if the code length of the LDPC code is 16200 bits, a number of rows in the each column is 1800 and the number of rows in the second part of the each column is 225.

2. A broadcast signal receiving method comprising:
   receiving a broadcast signal from a broadcast signal transmitting apparatus;
   demodulating the broadcast signal to generate values for 256-quadrature amplitude modulation (QAM);
   deinterleaving the values using a plurality of columns, each columns of the plurality of columns comprising a first part and a second part;
   splitting the deinterleaved values into a plurality groups;
   deinterleaving the plurality of groups; and
   decoding values of the deinterleaved plurality of groups based on a low density parity check (LDPC) code,
   wherein a number of the plurality of columns is equal to a modulation order of the 256-QAM,
   wherein a number of values of each group is 360,
   wherein if a code length of the LDPC code is 64800 bits, a number of rows in the first part of the each column is 7920, and a number of rows in the second part of the each column is 180, and
   wherein if the code length of the LDPC code is 16200 bits, a number of rows in the each column is 1800 and the number of rows in the second part of the each column is 225.

* * * * *